(12) United States Patent  
Ma et al.

(10) Patent No.: US 12,284,770 B2
(45) Date of Patent: Apr. 22, 2025

(54) LOW SHEET RESISTANCE COATING

(71) Applicant: Vitro Flat Glass LLC, Cheswick, PA (US)

(72) Inventors: Zhixun Ma, Richmond, CA (US); Maryanne Griffin, Apollo, PA (US); Ashtosh Ganjoo, Allison Park, PA (US); Paul A. Medwick, Wexford, PA (US); Sudarshan Narayanan, Oxford (GB); Adam Polcyn, Pittsburgh, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 0 days.

(21) Appl. No.: 17/173,924

(22) Filed: Feb. 11, 2021

(65) Prior Publication Data

US 2021/0274657 A1    Sep. 2, 2021

Related U.S. Application Data

(60) Provisional application No. 62/976,645, filed on Feb. 14, 2020.

(51) Int. Cl.
*H05K 3/46* (2006.01)
*H05K 1/02* (2006.01)

(52) U.S. Cl.
CPC ......... *H05K 3/4644* (2013.01); *H05K 1/0213* (2013.01); *H05K 1/0274* (2013.01)

(58) Field of Classification Search
None
See application file for complete search history.

(56) References Cited

U.S. PATENT DOCUMENTS 3,762,988 A   10/1973   Clock et al.
4,287,107 A    9/1981   Hermann et al.
(Continued)

FOREIGN PATENT DOCUMENTS

CH    339575 A    6/1959
CN   1944545 A    4/2007
(Continued)

OTHER PUBLICATIONS

Gu et al., "Ultrasmooth and Thermally Stable Silver-Based Thin Films with Subnanometer Roughness by Aluminum Doping", ACS Nano, 2014, pp. 10343-10351, vol. 8:10.
(Continued)

*Primary Examiner* — Seth Dumbris
(74) *Attorney, Agent, or Firm* — The Webb Law Firm

(57) ABSTRACT

A coated article includes: a substrate; a first dielectric layer over at least a portion of the substrate; a first metallic layer over at least a portion of the first dielectric layer; a first primer layer over at least a portion of the first metallic layer; and a second dielectric layer over at least a portion of the first primer layer; where the first primer layer is selected from the group consisting of zinc, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, mixtures thereof, combinations thereof, and alloys thereof.

15 Claims, 17 Drawing Sheets

(56) References Cited

U.S. PATENT DOCUMENTS

| | | |
|---|---|---|
| 4,379,040 A | 4/1983 | Gillery |
| 4,466,562 A | 8/1984 | DeTorre |
| 4,606,800 A | 8/1986 | Hart et al. |
| 4,610,771 A | 9/1986 | Gillery |
| 4,671,155 A | 6/1987 | Goldinger |
| 4,716,086 A | 12/1987 | Gillery et al. |
| 4,746,347 A | 5/1988 | Sensi |
| 4,792,536 A | 12/1988 | Pecoraro et al. |
| 4,806,220 A | 2/1989 | Finley |
| 4,834,857 A | 5/1989 | Gillery |
| 4,861,669 A | 8/1989 | Gillery |
| 4,898,789 A | 2/1990 | Finley |
| 4,898,790 A | 2/1990 | Finley |
| 4,900,633 A | 2/1990 | Gillery |
| 4,902,580 A | 2/1990 | Gillery |
| 4,902,581 A | 2/1990 | Criss |
| 4,920,006 A | 4/1990 | Gillery |
| 4,938,857 A | 7/1990 | Gillery |
| 4,948,677 A | 8/1990 | Gillery |
| 5,028,759 A | 7/1991 | Finley |
| 5,030,593 A | 7/1991 | Heithoff |
| 5,030,594 A | 7/1991 | Heithoff |
| 5,059,295 A | 10/1991 | Finley |
| 5,112,693 A | 5/1992 | Gillery |
| 5,240,886 A | 8/1993 | Gulotta et al. |
| 5,328,768 A | 7/1994 | Goodwin |
| 5,385,872 A | 1/1995 | Gulotta et al. |
| 5,393,593 A | 2/1995 | Gulotta et al. |
| 5,492,750 A | 2/1996 | Shumaker, Jr. et al. |
| 5,619,059 A | 4/1997 | Li et al. |
| 5,653,903 A | 8/1997 | Pinchok, Jr. et al. |
| 5,792,559 A | 8/1998 | Heithoff et al. |
| 5,796,055 A | 8/1998 | Benson, Jr. et al. |
| 5,821,001 A | 10/1998 | Arbab et al. |
| 5,923,471 A | 7/1999 | Wood, II et al. |
| 6,164,777 A | 12/2000 | Li et al. |
| 6,495,251 B1 | 12/2002 | Arbab et al. |
| 6,838,181 B1 | 1/2005 | Degand |
| 6,869,644 B2 | 3/2005 | Buhay et al. |
| 6,916,542 B2 | 7/2005 | Buhay et al. |
| 6,962,759 B2 | 11/2005 | Buhay et al. |
| 7,311,961 B2 | 12/2007 | Finley et al. |
| 7,335,421 B2 | 2/2008 | Thiel et al. |
| 7,537,677 B2 | 5/2009 | Lu et al. |
| 7,588,829 B2 | 9/2009 | Finley et al. |
| 7,972,713 B2 | 7/2011 | Fleury et al. |
| 8,003,235 B2 | 8/2011 | Gagliardi et al. |
| 8,025,957 B2 | 9/2011 | Thiel |
| 8,203,073 B2 | 6/2012 | Lu et al. |
| 8,221,833 B2 | 7/2012 | Veerasamy et al. |
| 8,420,162 B2 | 4/2013 | Blacker et al. |
| 8,440,037 B2 | 5/2013 | Dietrich et al. |
| 8,440,310 B2 | 5/2013 | Ferreira et al. |
| 8,497,014 B2 | 7/2013 | Unquera et al. |
| 8,686,319 B2 | 4/2014 | Thiel |
| 8,722,210 B2 | 5/2014 | Jun et al. |
| 8,974,864 B2 | 3/2015 | Finley et al. |
| 9,003,697 B2 | 4/2015 | Giesen et al. |
| 9,012,044 B2 | 4/2015 | Bright |
| 9,028,930 B2 | 5/2015 | Reymond et al. |
| 9,034,459 B2 | 5/2015 | Condo et al. |
| 9,062,366 B2 | 6/2015 | An et al. |
| 9,067,822 B2 | 6/2015 | Maschwitz et al. |
| 9,126,861 B2 | 9/2015 | Hashizume et al. |
| 9,140,832 B2 | 9/2015 | Medwick et al. |
| 9,199,874 B2 | 12/2015 | Peter et al. |
| 9,296,649 B2 | 3/2016 | Okawa et al. |
| 9,449,899 B2 | 9/2016 | Briere et al. |
| 9,556,068 B2 | 1/2017 | Buhay et al. |
| 9,599,752 B2 | 3/2017 | Laurent et al. |
| 9,606,272 B2 | 3/2017 | Sandre-Chardonnal |
| 9,630,875 B2 | 4/2017 | McSporran et al. |
| 9,709,717 B2 | 7/2017 | Hevesi et al. |
| 9,738,561 B2 | 8/2017 | Butz et al. |
| 9,758,426 B2 | 9/2017 | Kabagambe et al. |
| 9,776,915 B2 | 10/2017 | Wuillaume et al. |
| 9,822,033 B2 | 11/2017 | Imran et al. |
| 9,919,960 B2 | 3/2018 | Mahieu |
| 9,950,951 B2 | 4/2018 | Sternchuss et al. |
| 9,971,194 B2 | 5/2018 | Brecht et al. |
| 10,040,719 B2 | 8/2018 | Eby et al. |
| 10,078,409 B2 | 9/2018 | Veerasamy et al. |
| 10,099,958 B2 | 10/2018 | Brossard et al. |
| 10,294,149 B2 | 5/2019 | Wagner et al. |
| 10,358,384 B2 | 7/2019 | Polcyn et al. |
| 10,453,580 B1 | 10/2019 | Wilson et al. |
| 10,472,881 B2 | 11/2019 | Kuhn et al. |
| 10,479,724 B2 | 11/2019 | Ganjoo et al. |
| 10,502,878 B2 | 12/2019 | Ding et al. |
| 10,539,726 B2 | 1/2020 | Wagner et al. |
| 10,562,813 B2 | 2/2020 | Roquiny et al. |
| 10,597,324 B2 | 3/2020 | Miki Yoshida et al. |
| 10,618,252 B2 | 4/2020 | Wagner et al. |
| 10,654,747 B2 | 5/2020 | Polcyn et al. |
| 10,654,749 B2 | 5/2020 | Polcyn et al. |
| 11,078,718 B2 | 8/2021 | Fisher et al. |
| 11,402,557 B2 | 8/2022 | Wagner et al. |
| 12,060,751 B2 | 8/2024 | Paul et al. |
| 2002/0119337 A1 | 8/2002 | Maze et al. |
| 2002/0172775 A1 | 11/2002 | Buhay et al. |
| 2003/0031842 A1 | 2/2003 | Marietti et al. |
| 2003/0180547 A1 | 9/2003 | Buhay et al. |
| 2003/0228476 A1 | 12/2003 | Buhay et al. |
| 2003/0228484 A1 | 12/2003 | Finley et al. |
| 2004/0023038 A1 | 2/2004 | Buhay et al. |
| 2004/0023080 A1 | 2/2004 | Buhay et al. |
| 2004/0106017 A1 | 6/2004 | Buhay et al. |
| 2005/0095449 A1* | 5/2005 | Yanagisawa ......... H05K 9/0096 428/689 |
| 2005/0123772 A1 | 6/2005 | Coustet et al. |
| 2005/0258030 A1 | 11/2005 | Finley et al. |
| 2007/0020465 A1 | 1/2007 | Thiel et al. |
| 2007/0224432 A1 | 9/2007 | Morimoto et al. |
| 2008/0174872 A1 | 7/2008 | Morimoto et al. |
| 2008/0187692 A1 | 8/2008 | Roquiny et al. |
| 2008/0311389 A1 | 12/2008 | Roquiny et al. |
| 2009/0015909 A1 | 1/2009 | Fleury et al. |
| 2009/0047466 A1 | 2/2009 | German et al. |
| 2009/0176086 A1 | 7/2009 | Martin et al. |
| 2011/0236663 A1 | 9/2011 | Fleury et al. |
| 2011/0236715 A1 | 9/2011 | Polcyn et al. |
| 2011/0262726 A1 | 10/2011 | Knoll et al. |
| 2011/0268941 A1 | 11/2011 | Fischer et al. |
| 2012/0087005 A1 | 4/2012 | Reymond et al. |
| 2012/0177900 A1 | 7/2012 | Laurent et al. |
| 2013/0057951 A1 | 3/2013 | Hevesi et al. |
| 2013/0059137 A1 | 3/2013 | Hevesi et al. |
| 2014/0072784 A1 | 3/2014 | Dietrich et al. |
| 2014/0193616 A1 | 7/2014 | Polcyn et al. |
| 2014/0272353 A1 | 9/2014 | Ding et al. |
| 2014/0272453 A1 | 9/2014 | Polcyn et al. |
| 2015/0004383 A1 | 1/2015 | Sandre-Chardonnal |
| 2015/0125635 A1 | 5/2015 | O'Connor et al. |
| 2016/0023942 A1* | 1/2016 | Mahieu ............... C03C 17/3649 428/433 |
| 2016/0031750 A1 | 2/2016 | Ridealgh et al. |
| 2016/0077320 A1 | 3/2016 | Okada et al. |
| 2016/0122236 A1 | 5/2016 | Mahieu et al. |
| 2016/0223729 A1 | 8/2016 | Medwick et al. |
| 2016/0244361 A1 | 8/2016 | Rondeau et al. |
| 2017/0144927 A1 | 5/2017 | Caillet et al. |
| 2017/0144928 A1 | 5/2017 | Caillet et al. |
| 2017/0183255 A1 | 6/2017 | Walther et al. |
| 2017/0198518 A1 | 7/2017 | Caillet et al. |
| 2017/0240462 A1* | 8/2017 | Wagner ............... C03C 17/3681 |
| 2017/0341977 A1 | 11/2017 | Polcyn et al. |
| 2018/0029930 A1 | 2/2018 | Lorenzzi et al. |
| 2018/0194677 A1 | 7/2018 | Lorenzzi et al. |
| 2018/0208503 A1 | 7/2018 | Hagen et al. |
| 2018/0244567 A1 | 8/2018 | Singh et al. |
| 2018/0291499 A1 | 10/2018 | Koch |
| 2018/0297322 A1* | 10/2018 | Wagner ............... C04B 37/008 |
| 2018/0323401 A1 | 11/2018 | Sato et al. |
| 2019/0039947 A1 | 2/2019 | Fisher et al. |

(56) References Cited

U.S. PATENT DOCUMENTS

| | | |
|---|---|---|
| 2019/0055157 A1 | 2/2019 | Hagen et al. |
| 2019/0064516 A1 | 2/2019 | Wagner et al. |
| 2019/0242178 A1 | 8/2019 | Fisher et al. |
| 2019/0330101 A1 | 10/2019 | Cid Aguilar et al. |
| 2019/0352224 A1 | 11/2019 | You et al. |
| 2020/0009836 A1 | 1/2020 | Braley |
| 2020/0055285 A1 | 2/2020 | Compoint et al. |
| 2020/0085170 A1 | 3/2020 | Yang et al. |
| 2020/0096687 A1 | 3/2020 | Ma et al. |
| 2020/0101700 A1 | 4/2020 | Lee et al. |
| 2020/0165163 A1 | 5/2020 | Mizutani et al. |
| 2020/0310014 A1 | 10/2020 | Bard et al. |
| 2020/0359467 A1 | 11/2020 | Farreyrol et al. |
| 2021/0017811 A1 | 1/2021 | Han |
| 2021/0053869 A1 | 2/2021 | Dehner et al. |
| 2021/0122670 A1 | 4/2021 | Misra et al. |
| 2022/0119305 A1 | 4/2022 | Fisher et al. |

FOREIGN PATENT DOCUMENTS

| | | | | |
|---|---|---|---|---|
| DE | 102014002965 A1 * | 2/2015 | ......... | C03C 17/3618 |
| JP | H10182192 A * | 7/1998 | | |
| JP | 2016540723 A | 12/2016 | | |
| WO | 0037384 A1 | 6/2000 | | |
| WO | 2015101744 A1 | 7/2015 | | |
| WO | 2018048038 A1 | 3/2018 | | |
| WO | 2018117801 A1 | 6/2018 | | |
| WO | 2018160616 A2 | 9/2018 | | |
| WO | 2019004199 A1 | 1/2019 | | |
| WO | 2019053741 A1 | 3/2019 | | |
| WO | 2019074901 A1 | 4/2019 | | |
| WO | 2019120849 A1 | 6/2019 | | |
| WO | 2019120850 A1 | 6/2019 | | |
| WO | 2019143597 A1 | 7/2019 | | |
| WO | 2019145256 A1 | 8/2019 | | |
| WO | 2019151431 A1 | 8/2019 | | |
| WO | 2019190419 A2 | 10/2019 | | |
| WO | 2019190420 A2 | 10/2019 | | |
| WO | 2019207241 A1 | 10/2019 | | |
| WO | 2019216661 A1 | 11/2019 | | |
| WO | 2020058061 A1 | 3/2020 | | |

OTHER PUBLICATIONS

"Technical Information: What you need to know to Build With Light®", Guardian Glass LLC, 2019, pp. 1-36.

Han et al., "Improved conductivity and mechanism of carrier transport in zinc oxide with embedded silver layer", Journal of Applied Physics, 2008, pp. 1-8, vol. 103.

Kawamura et al., "Thermally stable very thin Ag films for electrodes", J. Vac. Sci. Technol. A., 2009, pp. 975-978, vol. 27:4.

Liu et al., "A new method for fabricating ultrathin metal films as scratch-resistant flexible transparent electrodes", Journal of Materiomics, 2015, pp. 52-59, vol. 1:1.

Ries, "Silver thin films: Improving the efficiency of low-E coatings by employing different seed layers", 2015, pp. 1-199.

Sharma et al., "High-performance radiation stable ZnO/Ag/ZnO multilayer transparent conductive electrode", Solar Energy Materials and Solar Cells, 2017, pp. 122-131, vol. 169.

Zhang et al., "Effects of Nb Surface and Ti Interface Layers on Thermal Stability and Electrical Resistivity of Ag Thin Films", Japanese Journal of Applied Physics, 2012, pp. 1-6, vol. 51.

Zhang et al., "Optimization of Surface Layers for Suppression of Agglomeration in Ag Films", Japanese Journal of Applied Physics, 2013, pp. 1-13, vol. 52:7.

* cited by examiner

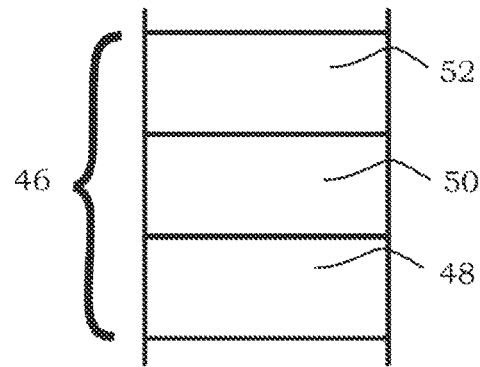 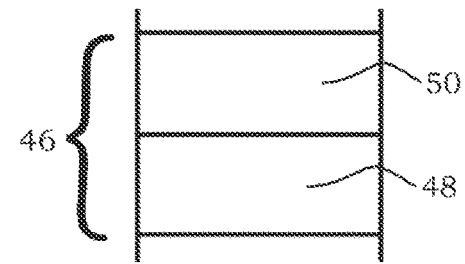
FIG. 7a                                  FIG. 7b
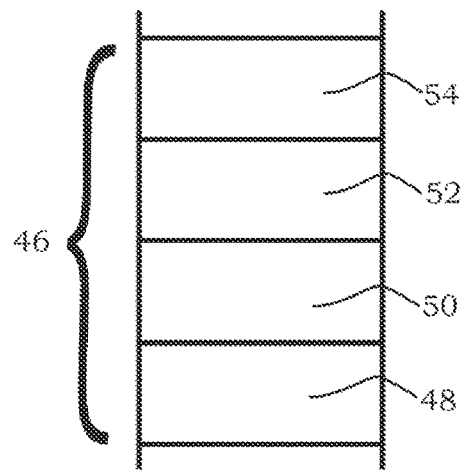 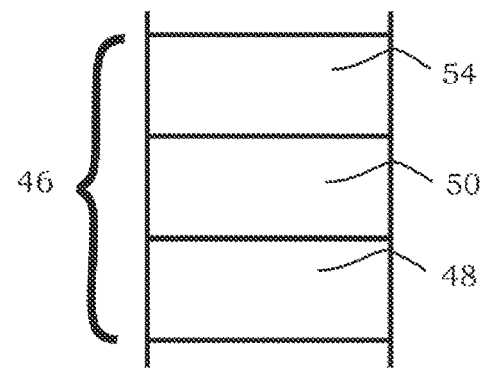
FIG. 7c                                  FIG. 7d

LOW SHEET RESISTANCE COATING

CROSS REFERENCE TO RELATED APPLICATIONS

This application claims the benefit of U.S. Provisional Patent Application No. 62/976,645, filed Feb. 14, 2020, which is hereby incorporated by reference in its entirety.

BACKGROUND OF THE INVENTION

Field of the Invention

The Invention relates generally to vehicle transparencies, such as vehicle windshields, and in one particular embodiment, to a heatable vehicle windshield.

Technical Considerations

Passing electric current through a conductor on a laminated vehicle windshield, will cause the temperature of the windshield to rise. This is particularly useful in colder climates for defogging and melting ice and/or snow over the windshield. In wire-heated windshields, fine electrically-conductive wires are placed between the windshield plies. The wires are then connected to a power source, such as a conventional 14 volt vehicle alternator. The wires have sufficiently low resistance to provide a windshield with a power density of 5 to 7 watts per decimeter squared ($W/dm^2$).

A problem with wire-heated windshields is that the wires can be seen by the vehicle's occupants, which is aesthetically undesirable and can interfere with visibility through the windshield. If the diameter of the wires is decreased to try to reduce the visibility of the wires, the number of wires must be increased to maintain the desired power density, which adversely decreases the total solar energy transmitted (TSET) by the windshield. If the height of the windshield increases, the wires must be longer to maintain the desired power density. Longer wires are also undesirable with respect to aesthetics and/or transmittance.

Some heated windshields use transparent conductive coatings rather than wires. These coatings, however, have their own drawback. For example, conventional heated windshield coatings typically have a sheet resistance of 2 ohms per square ($\Omega/\square$) or greater. A conventional 14v (80 ampere, 1,120 watt) alternator does not provide enough voltage to power a conventional heated windshield coating to a temperature sufficient for de-icing. Therefore, for vehicles with these coatings, the vehicles must be altered to increase the available voltage. For example, the alternator can be replaced with a 42v alternator, or a DC to DC converter can be added to step-up the voltage from a 14v alternator. These solutions, however, increase the cost and complexity of the vehicle electrical system.

Therefore, it would be desired to provide a transparency that reduces or eliminates at least some of the problems associated with conventional heatable transparencies.

SUMMARY OF INVENTION

The invention is directed to lower the sheet resistance of a coated transparency by adding metallic silver layers in a coating stack. Specifically, the silver layers can range from a single stack up to a quadruple stack of silver layers. However, if the silver thickness is too high, the transmittance is reduced to below 70%, which is unacceptable. Additionally, the glass will appear red if the silver thickness is too thick, which is also undesirable. Therefore, the invention is directed to a coating stack that has an adequately thick total silver to provide a sheet resistance that allows for de-icing with a 14v alternator, and having a light transmittance above 70%, preferably above 70.5%, more preferably above 71%.

The invention relates to a coated article comprising a substrate. The coated article is coated with at least one dielectric layer positioned over the substrate, at least one metallic layer and at least one primer layer. The at least one metallic layer has a combined thickness of at least 30 nm and no more than 65 nm; at least 35 nm and no more than 52 nm; at least 35 nm and no more than 48 nm; or at least 40 nm and no more than 52 nm.

In one embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A total combined thickness of the metallic layers is at least 30 nm, and no more than 65 nm.

In another embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer.

In another embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. A third metallic layer is positioned over at least a portion of the third dielectric layer. A third primer layer is positioned over at least a portion of the third metallic layer. A fourth dielectric layer is positioned over at least a portion of the third primer layer.

In another embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. A third metallic layer is positioned over at least a portion of the third dielectric layer. A third primer layer is positioned over at least a portion of the third metallic layer. A fourth dielectric layer is positioned over at least a portion of the third primer layer. A fourth metallic layer is positioned over at least a portion of the fourth dielectric layer. A fourth primer layer is positioned over at least a portion of the fourth metallic layer. A fifth dielectric layer is positioned over at least a portion of the fourth primer layer.

The invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. The article has a sheet resistance of not more than 0.7 ohms per square.

The invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. The article has a sheet resistance of not more than 0.7 ohms per square.

In another embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. A third metallic layer is positioned over at least a portion of the third dielectric layer. A third primer layer is positioned over at least a portion of the third metallic layer. A fourth dielectric layer is positioned over at least a portion of the third primer layer. The article has a sheet resistance of not more than 0.7 ohms per square.

In another embodiment, the invention relates to a coated article. The coated article comprises a substrate. A first dielectric layer is positioned over at least a portion of the substrate. A first metallic layer is positioned over at least a portion of the first dielectric layer. A first primer layer is positioned over at least a portion of the first metallic layer. A second dielectric layer is positioned over at least a portion of the first primer layer. A second metallic layer is positioned over at least a portion of the second dielectric layer. A second primer layer is positioned over at least a portion of the second metallic layer. A third dielectric layer is positioned over at least a portion of the second primer layer. A third metallic layer is positioned over at least a portion of the third dielectric layer. A third primer layer is positioned over at least a portion of the third metallic layer. A fourth dielectric layer is positioned over at least a portion of the third primer layer. A fourth metallic layer is positioned over at least a portion of the fourth dielectric layer. A fourth primer layer is positioned over at least a portion of the fourth metallic layer. A fifth primer layer is positioned over at least a portion of the fourth primer layer. The article has a sheet resistance of not more than 0.7 ohms per square.

In another embodiment, the invention relates to a coated article. The coated article comprises a first substrate having a first surface and a second surface. A second substrate is positioned over at least a portion of the first substrate, comprising a third surface and a fourth surface. A coating is disposed over either the second surface or the third surface. The coating has a first dielectric layer positioned over at least a portion of the second surface or the third surface. A first metallic layer is positioned over at least a portion of the first dielectric layer. A first primer layer is positioned over at least a portion of the first metallic layer. A second dielectric layer is positioned over at least a portion of the first primer layer. The coated substrate has a visible light transmittance of at least 70%. A total combined thickness of the metallic layers is at least 30 nm, and no more than 65 nm.

A seed film may be deposited in between the metallic layer and the dielectric layer. The seed film may be between one or more of the various combinations of metallic layers and dielectric layers. A seed film may be between the first metallic layer and the first dielectric layer. A seed film may be between the second metallic layer and second dielectric layer. A seed film may be between the third metallic layer and third dielectric layer. A seed film may be between the fourth metallic layer and the fourth dielectric layer. A seed film may be adjacent to and in direct contact with any of the metallic layers. In a certain embodiment, a seed film is present between all metallic layers and dielectric layers (i.e. between first metallic layer and first dielectric layer, second metallic layer and second dielectric layer, third metallic layer and third dielectric layer, and fourth metallic layer and fourth dielectric layer) and is adjacent to and in direct contact with the metallic layer.

The seed film helps to promote two dimensional growth and increase the density of the metallic layer, in most cases silver, with its high surface energy. The high surface energy (high Gibbs free energy, high surface tension) stops silver agglomeration of the metallic layer from occurring during growth and heating processes. Materials most suitable to reduce silver agglomeration of the metallic layer are metals with high cohesive energy and oxides with high Gibbs free energy of oxide formation. These specific materials prevent migration of silver in the metallic layer during heating processes.

BRIEF DESCRIPTION OF THE DRAWINGS

The invention will be described with reference to the following drawing figures wherein like reference numbers identify like parts throughout.

FIGS. 7a-d are cross-sectional views (not to scale) of non-limiting third dielectric layer embodiments according to the invention.

DESCRIPTION OF THE PREFERRED EMBODIMENT

Figure 1A:
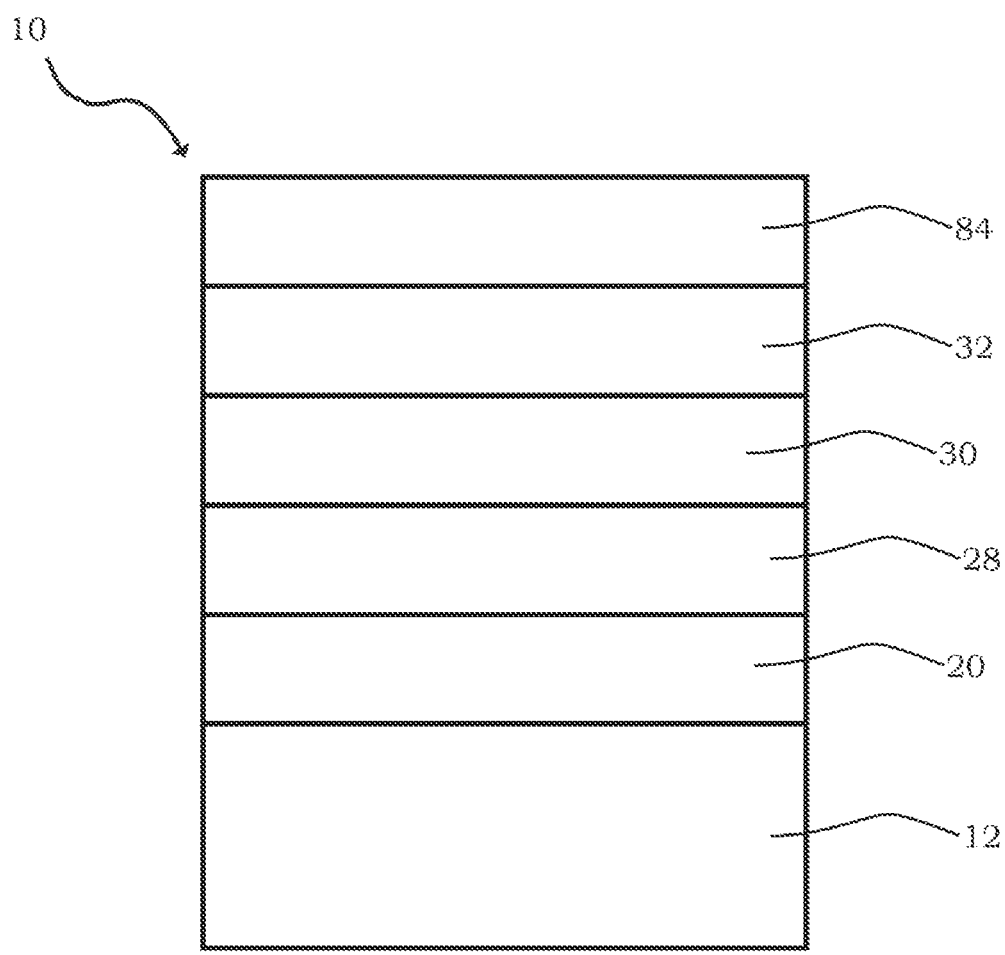
FIG. 1a is a cross-sectional view (not to scale) of a non-limiting coating according to the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 800 nm. The terms "infrared region" or "infrared radiation" refer to electromagnetic radiation having a wavelength in the range of greater than 800 nm to 100,000 nm. The terms "ultraviolet region" or "ultraviolet radiation" mean electromagnetic energy having a wavelength in the range of 300 nm to less than 380 nm. Additionally, all documents, such as, but not limited to, issued patents and patent applications, referred to herein are to be considered to be "incorporated by reference" in their entirety. As used herein, the term "film" refers to a coating region of a desired or selected coating composition. A "layer" can comprise one or more "films", and a "coating" or "coating stack" can comprise one or more "layers". The terms "metal" and "metal oxide" include silicon and silica, respectively, as well as traditionally recognized metals and metal oxides, even though silicon conventionally may not be considered a metal. Thickness values, unless indicated to the contrary, are geometric thickness values.

The discussion of the invention may describe certain features as being "particularly" or "preferably" within certain limitations (e.g., "preferably", "more preferably", or "most preferably", within certain limitations). It is to be understood that the invention is not limited to these particular or preferred limitations but encompasses the entire scope of the disclosure.

The coating 10 is a coating deposited over at least a portion of a major surface of one of the glass plies 12, 112, such as on the No. 2 surface 16 of the first glass ply 12 (FIG. 11) or the No. 3 surface 114 of the second glass ply 110. The coating 10 can include up to four metallic layers positioned between dielectric layers applied sequentially over at least a portion of one of the glass plies 12, 112. The coating 10 can be a heat and/or radiation reflecting coating and can have one or more coating layers or films of the same or different composition and/or functionality. As used herein, the term "film" refers to a coating region of a desired or selected coating composition. A "layer" can comprise one or more "films" and a "coating" or "coating stack" can comprise one or more "layers". The coating 10 can be a multi-layer coating that includes up to four metallic layers.

Non-limiting examples of suitable coatings typically include one or more antireflective coating films comprising dielectric or anti-reflective materials, such as metal oxides or oxides of metal alloys, which are transparent to visible light. The coating 10 can also include up to four metallic layers comprising a reflective metal, e.g., noble metals such as gold, copper or silver, or combinations or alloys thereof, and can further comprise a primer layer or barrier film, such as titanium or a titanium aluminum alloy, as is known in the art, located over and/or optionally under the metal reflective layer. The coating 10 can have up to four metallic layers; or can have at least one metallic layer. For example, the coating 10 consists of four metallic layers; or can consist of three metallic layers; or can consist of two metallic layers; or can consist of one metallic layer. In one non-limiting embodiment, one or more of the metallic layers can comprise silver and/or aluminum-doped silver.

In certain embodiments, a coating may comprise up to four primer layers. Non-limiting examples of suitable materials for the primer layer include zinc, aluminum, vanadium, tungsten, tantalum, niobium, zirconium, manganese, chromium, tin, nickel, germanium, magnesium, molybdenum, silver, silicon carbide, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, mixtures thereof, combinations thereof, and alloys thereof. The primer layer material may take the form of a metal, oxide, sub-oxide, nitride, sub-nitride, oxynitride, and/or sub-oxynitride of any of the materials that may be used as the primer layer, as listed above. At least a portion of the primer layer may be an oxide or a nitride. In certain embodiments, a portion of the primer layer is a nitride.

For certain material compositions, the lower limit of one of the materials may be "greater than 0". When the lower limit is "greater than 0" this means that the wt % of that material is not equal to zero, but may be any wt % greater than 0 up to the wt % of the upper limit. For some material compositions, the composition may change before and after the layer is heated. This is due to the material reaction with species in the atmosphere which changes the wt % distributed between the present species. Therefore, certain material compositions may have a before heating ("BH") and an after heating ("AH") weight percentage measurement to account for this change. Some materials may only have before heating or may only have after heating measurements due to that measurement being of more importance.

In certain embodiments, the primer layer may be $Al_xZn_{1-x}$, wherein x is within the range of greater than 0-30 wt %, preferably greater than 0-20 wt %, more preferably greater than 0-15 wt %, and most preferably 1-12 wt %. In another embodiment, the primer layer may be $Ga_xZn_{1-x}$, wherein x is within the range of greater than 0-20 wt %, preferably greater than 0-15 wt %, more preferably greater than 0-10 wt %, and most preferably 1-5 wt %. In another embodiment, the primer layer may be $In_xZn_{1-x}$, wherein x is within the range of greater than 0-40 wt %, preferably greater than 0-18 wt %, more preferably greater than 0-15 wt %, and most preferably 1-10 wt %. In another embodiment, the primer layer may be $V_xZn_{1-x}$, wherein x is within the range of greater than 0-20 wt %, preferably greater than 0-15 wt %, more preferably greater than 0-10 wt %, and most preferably 1-5 wt %. In another embodiment, the primer layer may be $Ag_xZn_{1-x}$, wherein x is within the range of greater than 0-50 wt %, preferably greater than 0-40 wt %, more preferably greater than 0-30 wt %, and most preferably 5-30 wt %.

In another embodiment, the primer layer may be $Al_xTi_{1-x}$, wherein the x is within the range of 2-75 wt % before heating (hereinafter "BH") and 1-100 wt % after heating (hereinafter "AH"), preferably 2-60 wt % BH and 1-98 wt % AH, more preferably 2-50 wt % BH and 2-95 wt % AH, and most preferably 2-40 wt % BH and 2-15 wt % AH or 20-95 wt % AH. In another embodiment, the primer layer may be $Al_xNb_{1-x}$, wherein the x is within the range of 2-40 wt % BH and 2-95 wt % AH, preferably 2-30 wt % BH and 2-80 wt % AH, more preferably 2-19 wt % BH and 3-60 wt % AH, and most preferably 2-13 wt % BH and 4-45 wt % AH. In another embodiment, the primer layer may be $Al_xNb_{1-x}$ nitride, wherein x is within the range of 1-100 wt % BH and 1-100 wt % AH, preferably 1-98 wt % BH and 2-75 wt % AH, more preferably 1-95 wt % BH and 3-50 wt % AH, and most preferably 2-93 wt % BH and 4-40 wt % AH, wherein there is an 80% nitrogen gas flow rate for nitride deposition. In another embodiment, the primer layer may be $W_xTi_{1-x}$, wherein x is within the range of 55-100 wt % BH (with 7% $O_2$ during deposition) and 30-95 wt % AH (with 3% $O_2$ during deposition), preferably 65-100 wt % BH (with 7% $O_2$ during deposition) and 40-95 wt % AH (with 3% $O_2$ during deposition), more preferably 75-100 wt % BH (with 7% $O_2$ during deposition) and 50-95 wt % AH (with 3% $O_2$ during deposition), and most preferably 80-100 wt % BH (with 7% $O_2$ during deposition) and 55-95 wt % AH (with 3% $O_2$ during deposition). In another embodiment, the primer layer may be $Ti_xTa_{1-x}$, wherein the x is within the range of 2-80 wt % BH and 2-40 wt % AH, preferably 2-60 wt % BH and 2-40 wt % AH, more preferably 2-35 wt % BH and 2-25 wt % AH, and most preferably 1-20 wt % BH and 1-20 wt % AH. In another embodiment, the primer layer may be $Ti_xNb_{1-x}$, wherein the x is within the range of 2-95 wt % AH, preferably 2-93 wt % AH, more preferably 3-92 wt % AH, and most preferably 5-90 wt % AH. In another embodiment, the primer layer may be $Ti_xNb_{1-x}$ nitride, wherein x is within the range of 1-65 wt %, preferably 1-50 wt %, more preferably 1-40 wt %, and most preferably 1-30 wt %, wherein there is an 80% nitrogen gas flow rate for nitride deposition. In another embodiment, the primer layer may be $Nb_xZr_{1-x}$, wherein x is within the range of 1-80 wt % BH and 60-100 wt % AH, preferably 1-70 wt % BH and 70-100 wt % AH, more preferably 1-60 wt % BH and 80-100 wt % AH, and most preferably 1-50 wt % BH and 85-100 wt % AH. In another embodiment, the primer layer may be $Ta_xW_{1-x}$, wherein x is within the range of 2-95 wt % BH, preferably 2-80 wt % BH, more preferably 3-60 wt % BH, and most preferably 5-50 wt % BH. In another embodiment, the primer layer may be $W_xNb_{1-x}$, wherein x is within the range of 5-100 wt % BH and 2-50 wt % AH, preferably 6-90 wt % BH and 2-45 wt % AH, more preferably 8-80 wt % BH and 2-40 wt % AH, and most preferably 10-70 wt % BH and 2-30 wt % AH. In another embodiment, the primer layer may be $W_xNb_{1-x}$ nitride, wherein x is within the range of 2-90 wt % BH and 2-70 wt % AH, preferably 5-80 wt % BH and 10-70 wt % AH, more preferably 7-75 wt % BH and 20-70 wt % AH, and most preferably 10-70 wt % BH and 30-70 wt % AH, wherein there is an 80% nitrogen gas flow rate for nitride deposition. In another embodiment, the primer layer may be $Zn_xTi_{1-x}$, wherein x is within the range of 10-100 wt % BH and 20-100 wt % AH, preferably 10-80 wt % BH and 40-97 wt % AH, more preferably 10-70 wt % BH and 50-94 wt % AH, and most preferably 10-60 wt % BH and 60-90 wt % AH.

The coating 10 can be deposited by any conventional method, such as but not limited to conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as but not limited to sol-gel deposition. In one non-limiting embodiment, the coating 10 can be deposited by MSVD. Examples of MSVD coating devices and methods will be well understood by one of ordinary skill in the art and are described, for example, in U.S. Pat. Nos. 4,379,040; 4,861,669; 4,898,789; 4,898,790; 4,900,633; 4,920,006; 4,938,857; 5,328,768; and 5,492,750.

Figure 1B:
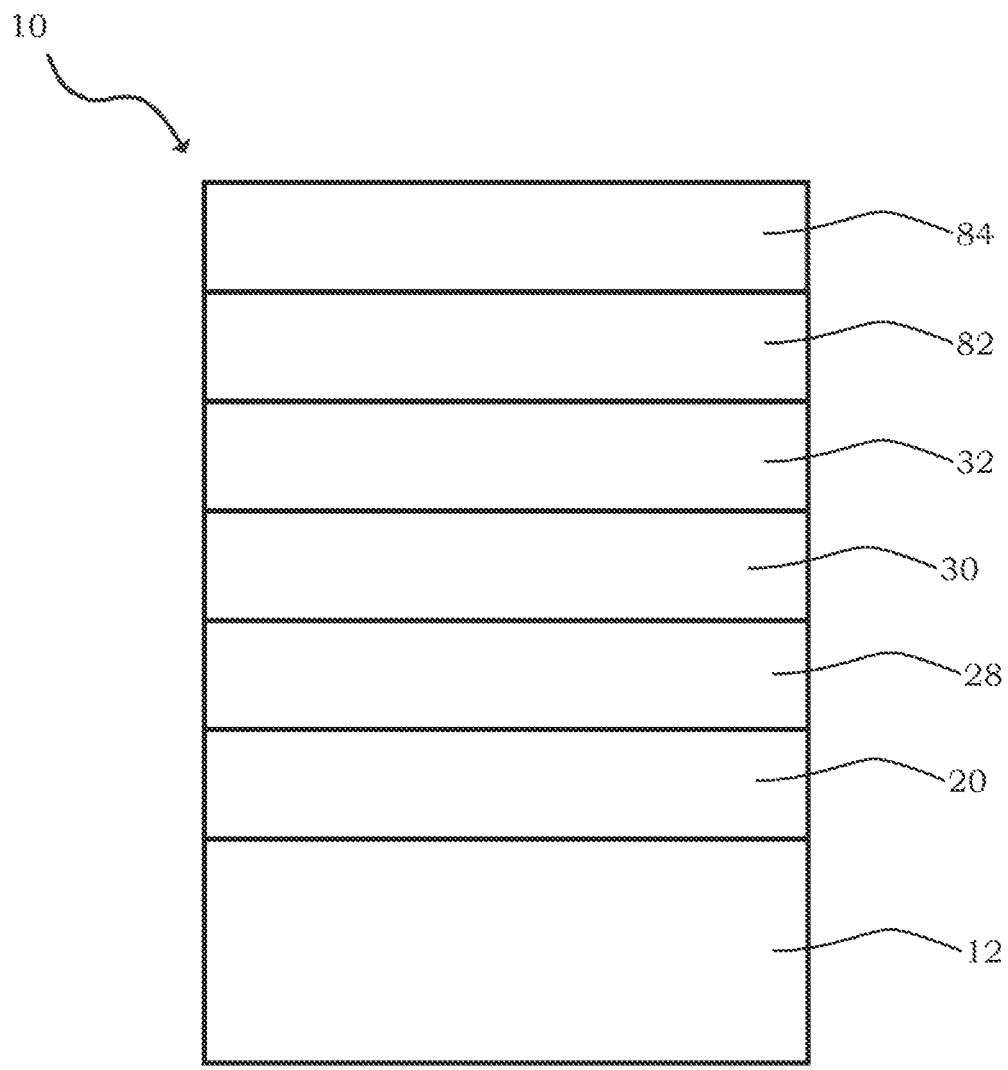
FIG. 1b is a cross-sectional view (not to scale) of a non-limiting coating according to the invention.

A non-limiting coating suitable for the invention is shown in FIGS. 1a and 1b. This coating includes one metallic layer and one primer layer positioned in between two dielectric layers. It includes a base layer or first dielectric layer 20 positioned over or in direct contact with at least a portion of a major surface of a substrate (e.g., the No. 2 surface 16 of the first ply 12, or the No. 3 surface 114 of the second ply 110). A first metallic layer 28 is positioned over or in direct contact with at least a portion of the first dielectric layer 20. A first primer layer 30 may be positioned over or in direct contact with at least a portion of the first metallic layer 28. A second dielectric layer 32 is positioned over or in direct contact with the first primer layer 30. A protective layer 84 may be positioned over or in direct contact with the second dielectric layer 32. A stress layer 82 may be positioned between the second dielectric layer 32 and the protective layer 84.

Figure 2A:
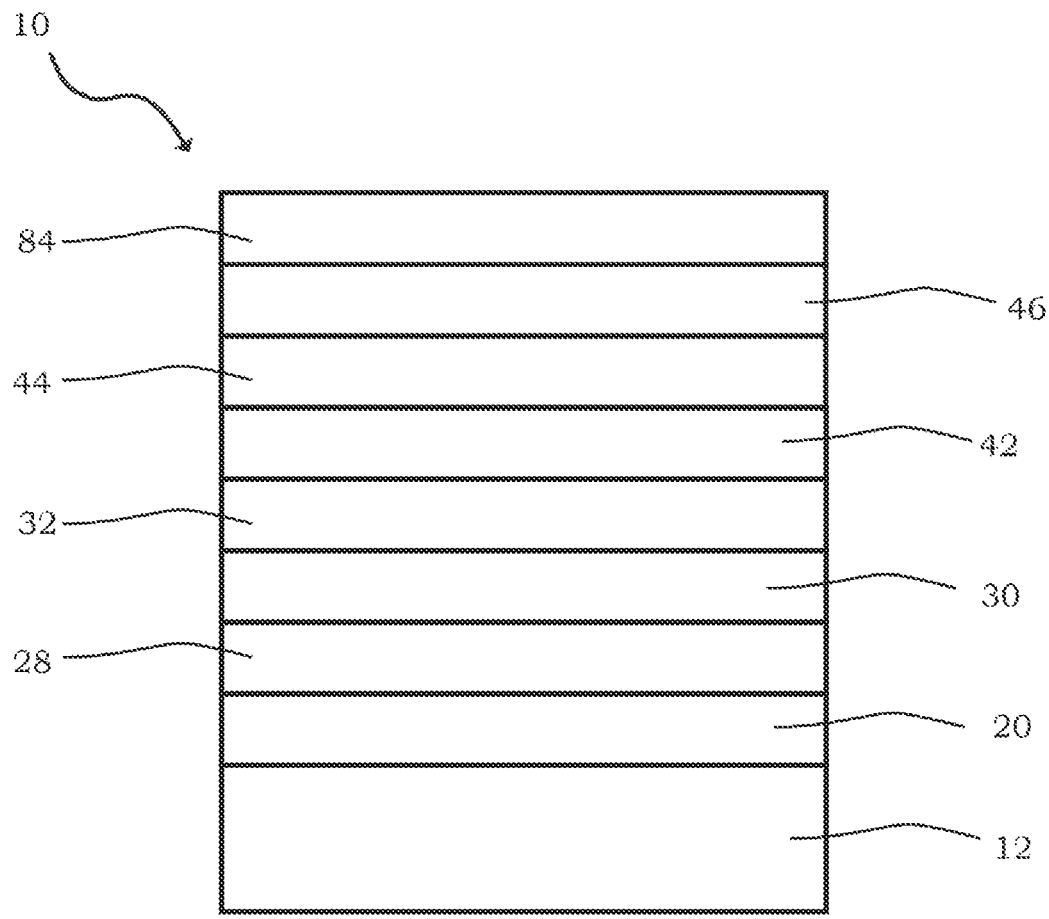
FIG. 2a is a cross-sectional view (not to scale) of a non-limiting coating according to the invention.
Figure 2B:
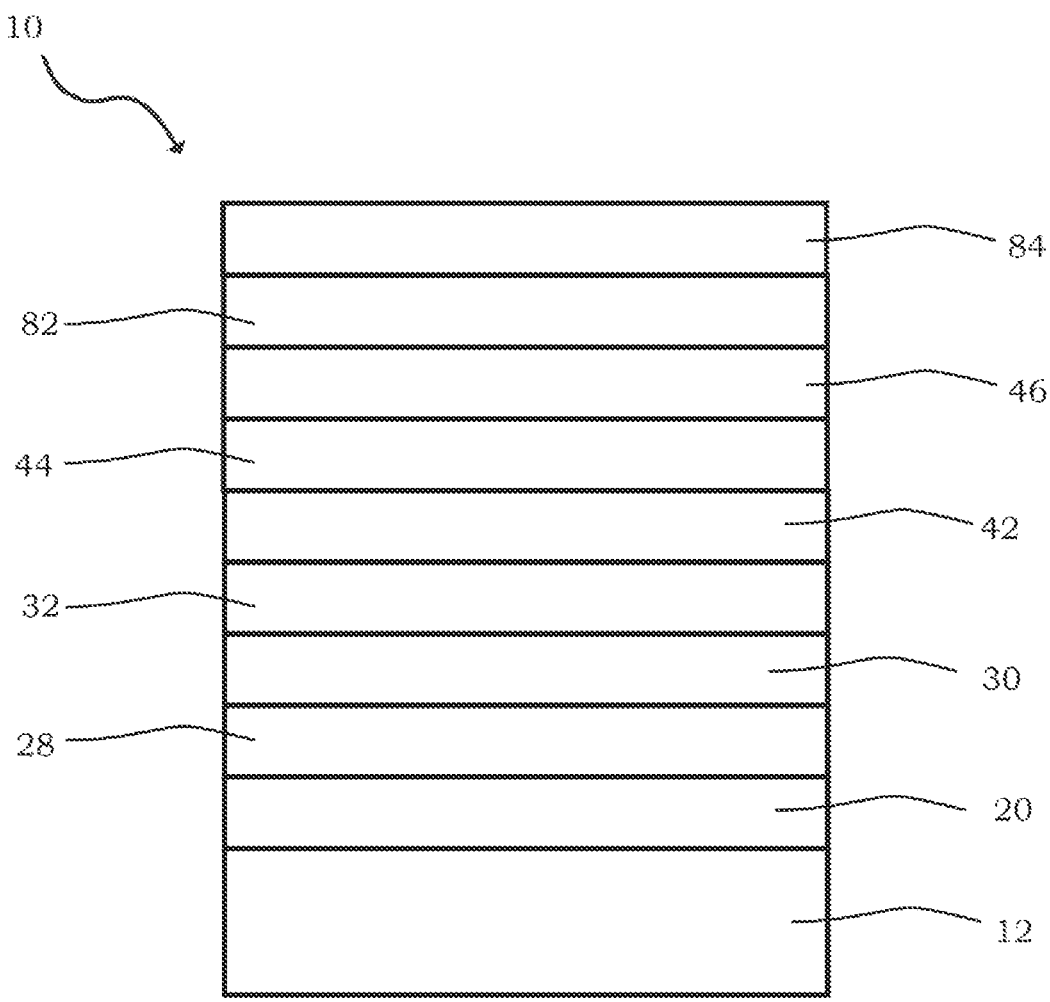
FIG. 2b is a cross-sectional view (not to scale) of a non-limiting coating according to the invention.

Another non-limiting coating suitable for the invention is shown in FIGS. 2a and 2b. This coating includes two metallic layers and two primer layers positioned in between dielectric layers. It includes a base layer or first dielectric layer 20 positioned over or in direct contact with at least a portion of a major surface of a substrate (e.g., the No. 2 surface 16 of the first ply 12, or the No. 3 surface 114 of the second ply 110). A first metallic layer 28 is positioned over or in direct contact with at least a portion of the first dielectric layer 20. A first primer layer 30 may be positioned over or in direct contact with at least a portion of the first metallic layer 28. A second dielectric layer 32 is positioned over or in direct contact with the first primer layer 30. A second metallic layer 42 is positioned over or in direct contact with at least a portion of the second dielectric layer 32. A second primer layer 44 may be positioned over or in direct contact with the second metallic layer 42. A third dielectric layer 46 is positioned over or in direct contact with the second primer layer 44. A protective layer 84 may be positioned over or in direct contact with the third dielectric layer 46. A stress layer 82 may be positioned between the third dielectric layer 46 and the protective layer 84.

Figure 3A:
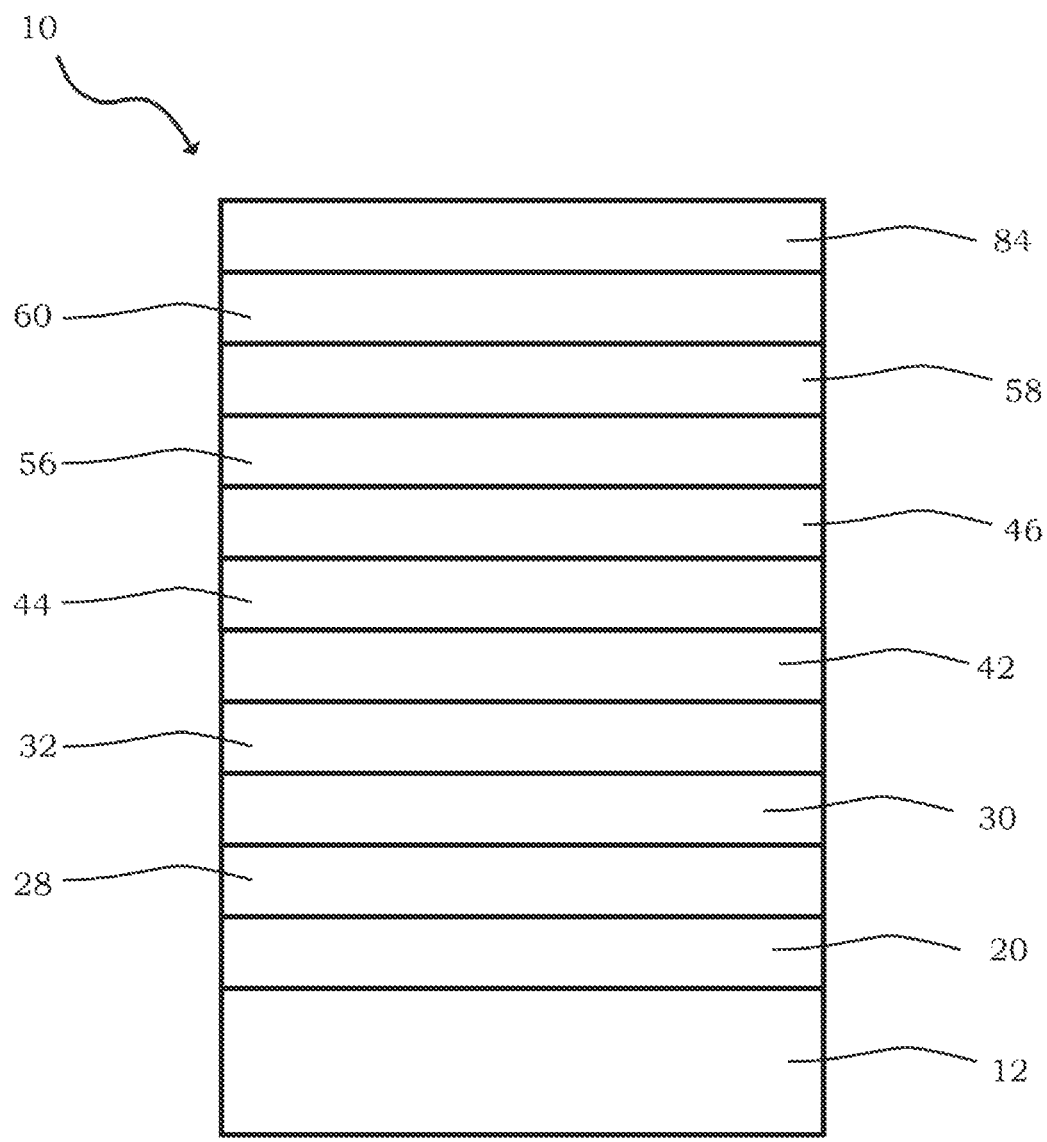
FIG. 3a is a cross-sectional view (not to scale) of a non-limiting coating according to the invention.
Figure 3B:
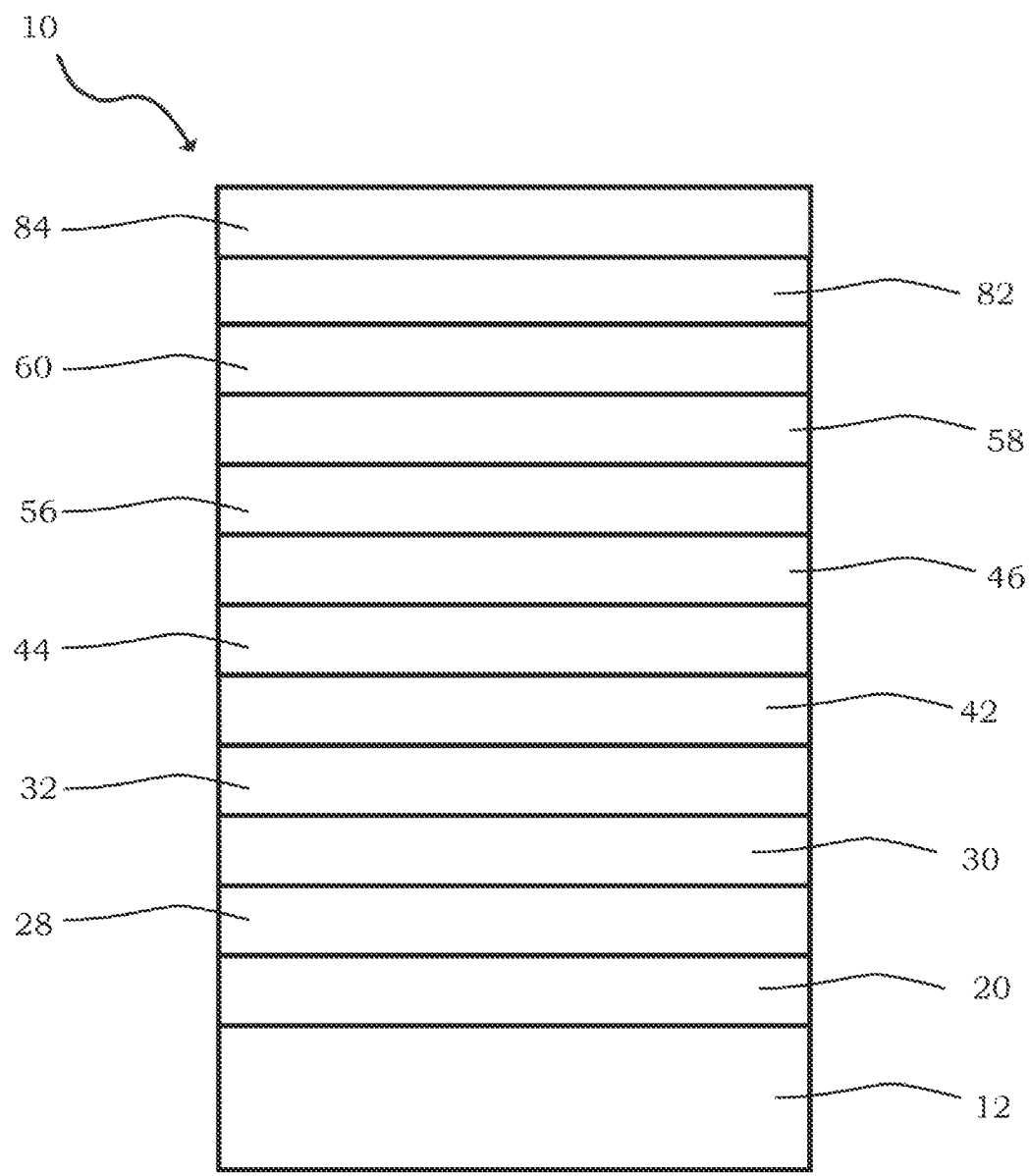
FIG. 3b is a cross-sectional view (not to scale) of a non-limiting coating according to the invention.

A non-limiting coating suitable for the invention is shown in FIG. 3a and FIG. 3b. This exemplary coating includes three metallic layers and three primer layers positioned in between dielectric layers. It includes a base layer or first dielectric layer 20 positioned over or in direct contact with at least a portion of a major surface of a substrate (e.g., the No. 2 surface 16 of the first ply 12, or the No. 3 surface 114 of the second ply 110). A first metallic layer 28 is positioned over or in direct contact with at least a portion of the first dielectric layer 20. A first primer layer 30 may be positioned over or in direct contact with at least a portion of the first metallic layer 28. A second dielectric layer 32 is positioned over or in direct contact with at least a portion of the first primer layer 30. A second metallic layer 42 is positioned over or in direct contact with at least a portion of the second dielectric layer 32. A second primer layer 44 may be positioned over or in direct contact with at least a portion of the second metallic layer 42. A third dielectric layer 46 is positioned over or in direct contact with at least a portion of the second primer layer 44. A third metallic layer 56 is positioned over or in direct contact with at least a portion of the third dielectric layer 46. A third primer layer 58 may be positioned over or in direct contact with at least a portion of the third metallic layer 56. A fourth dielectric layer 60 is positioned over or in direct contact with at least a portion of the third primer layer 58. A protective layer 84 may be positioned over or in direct contact with at least a portion of the fourth dielectric layer 60. A stress layer 82 may be positioned between the second dielectric layer 32 and the protective layer 84.

Figure 5A:
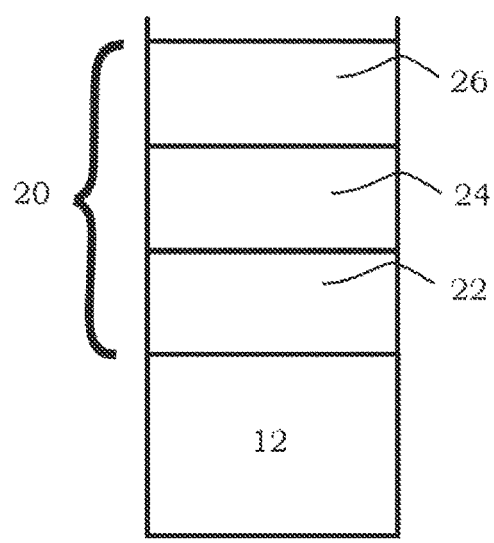
FIGS. 5a-b are cross-sectional views (not to scale) of non-limiting first dielectric layer embodiments according to the invention.
Figure 5B:
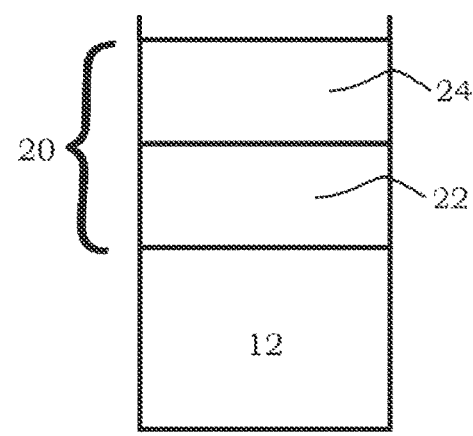
Figure 6A:
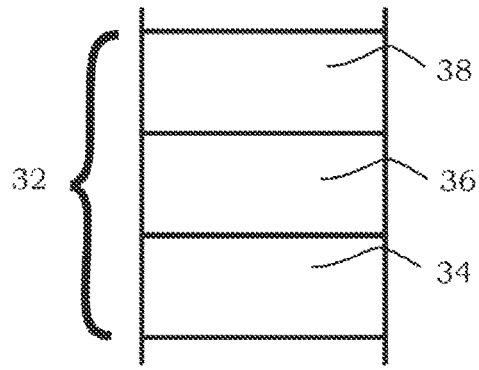
FIGS. 6a-d are cross-sectional views (not to scale) of non-limiting second dielectric layer embodiments according to the invention.
Figure 6B:
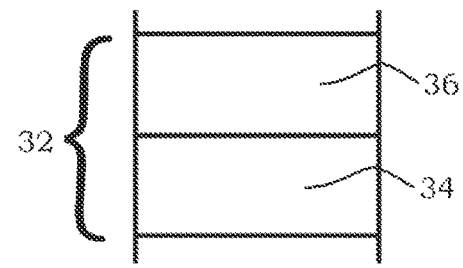
Figure 6C:
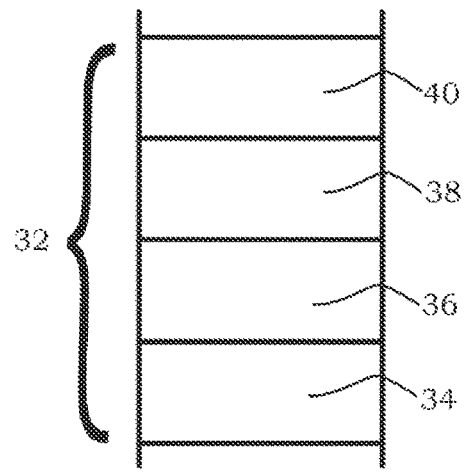
Figure 6D:
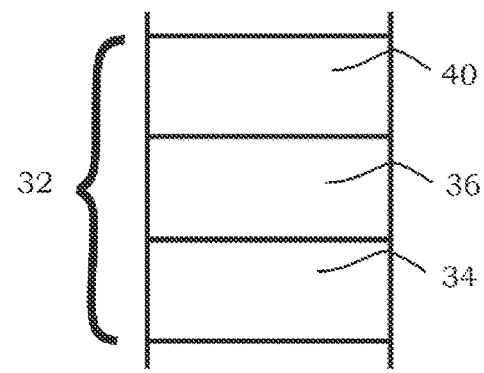

The first dielectric layer 20 can comprise one or more films of antireflective materials and/or dielectric materials, such as, but not limited to, metal oxides, oxides of metal alloys, nitrides, oxynitrides, or mixtures thereof. The first dielectric layer 20 can be transparent to visible light. Examples of suitable metal oxides for the first dielectric layer 20 include oxides of titanium, hafnium, zirconium, niobium, zinc, bismuth, lead, indium, tin, aluminum, silicon, and mixtures thereof. These metal oxides can have small amounts of other materials, such as manganese in bismuth oxide, tin in indium oxide, etc. Alternatively, oxides of metal alloys or metal mixtures, such as oxides containing zinc and tin (e.g., zinc stannate); oxides of indium-tin alloys; silicon nitrides; silicon aluminum nitrides; or aluminum nitrides can be used. Further, doped metal oxides, such as antimony or indium doped tin oxides or nickel or boron doped silicon oxides, can be used. As shown in FIGS. 5a and 5b, the first dielectric layer 20 may comprise a first film 22 and a second film 24. In one non-limiting embodiment, a first film 22 can be a zinc tin oxide. The zinc tin oxide can be obtained from magnetron sputtering vacuum deposition from a cathode of zinc and tin that can comprise zinc and tin in proportions of 10 wt. % to 90 wt. % zinc and 90 wt. % to 10 wt. % tin. One suitable metal alloy oxide that can be present in the first film 22 comprises zinc stannate. By "zinc stannate" is meant a composition of $Zn_xSn_{1-x}O_{2-x}$ (Formula 1) where "x" varies in the range of greater than 0 to less than 1. For instance, "x" can be greater than 0 and can be any fraction or decimal between greater than 0 to less than 1. For example where x=2/3, Formula 1 is $Zn_{2/3}Sn_{1/3}O_{4/3}$, which is more commonly described as $Zn_2SnO_4$. A zinc stannate containing film has one or more of the forms of Formula 1 in a predominant amount in the film.

A second film 24 can be a zinc-containing film, such as zinc oxide. The zinc oxide film can be deposited from a zinc cathode that includes other materials to improve the sputtering characteristics of the cathode. For example, the zinc cathode can include a small amount (e.g., less than 10 wt. %, such as greater than 0 to 5 wt. %) of tin to improve sputtering. In which case, the resultant zinc oxide film would include a small percentage of tin oxide, e.g., 0 to less than 10 wt. % tin oxide, e.g., 0 to 5 wt. % tin oxide. An oxide layer sputtered from a zinc/tin cathode having ninety-five percent zinc and five percent tin is written as $Zn_{0.95}Sn_{0.5}O_{1.05}$ herein and is referred to as a zinc oxide film. The small amount of tin in the cathode (e.g., less than 10 wt. %) is believed to form a small amount of tin oxide in the predominantly zinc oxide-containing second film 24. In one non-limiting embodiment, the first film 22 comprises zinc stannate and the second film 24 comprises zinc oxide ($Zn_{0.95}Sn_{0.5}O_{1.05}$).

In an exemplary non-limiting embodiment, the second film 24 is a film consisting of at least one of the following: aluminum zinc oxide, gallium zinc oxide, indium zinc oxide, indium tin oxide, or vanadium zinc oxide. The aluminum zinc oxide, gallium zinc oxide, indium zinc oxide, indium tin oxide, or vanadium zinc oxide film is deposited from a zinc cathode that includes other material to improve the sputtering characteristics of the cathode. For example, the aluminum zinc oxide, gallium zinc oxide, indium zinc oxide, indium tin oxide, or vanadium zinc oxide film can include an additional small amount (e.g., less than 10 wt. %, such as greater than 0 to 5 wt. %) of tin to improve sputtering. The small amount of tin in the cathode (e.g., less than 10 wt. %) is believed to form a small amount of tin oxide in the second film 24. In one non-limiting embodiment, the first film 22 comprises zinc stannate and the second film 24 comprises aluminum zinc oxide, gallium zinc oxide, indium zinc oxide, indium tin oxide, or vanadium zinc oxide. In one non-limiting embodiment, the first dielectric layer or the second dielectric layer comprises a silicon nitride film. In some embodiments, such as FIG. 5b, the first dielectric layer 20 only has a first film 22 and a second film 24.

The first dielectric layer 20 can have a total thickness of less than or equal to 1,000 Å, such as less than or equal to 800 Å, such as between 200 Å to 800 Å, 300 Å to 600 Å, such as 400 Å to 550 Å, such as 410 Å to 500 Å, or such as 420 Å to 470 Å, such as 422 Å and 463 Å.

As shown in FIG. 5a, a first seed film 26 may be positioned over or in direct contact with at least a portion of the second film of the first dielectric layer 20. The first seed film 26 may be adjacent to or in direct contact with the first metallic layer 28 and between the first dielectric layer 20 and the first metallic layer 28. The first seed film 26 is a film comprised of at least one of the following: aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof. In one embodiment, the first seed film 26 comprises aluminum zinc, vanadium zinc, zinc, silver zinc, metals thereof, alloys thereof, oxides thereof, or sub-oxides thereof. In another embodiment, the first seed film 26 comprises gallium zinc, indium zinc, indium tin, metals thereof, alloys thereof, oxides thereof, nitrides thereof, sub-nitrides thereof, or sub-oxides thereof.

In another embodiment, the first seed film 26 comprises $V_xZn_{1-x}$ oxide, wherein x is within the range of 1-25 wt %, preferably 1-15 wt %, more preferably 1-10 wt %, and most preferably 1-8 wt %. In another embodiment, the first seed film 26 comprises $Al_xZn_{1-x}$ oxide, wherein x is within the range of 1-25 wt %, preferably 1-15 wt %, more preferably 1-12 wt %, and most preferably 1-10 wt %. In another embodiment, the first seed film 26 comprises $Ga_xZn_{1-x}$ oxide, wherein x is within the range of 1-20 wt %, preferably 1-15 wt %, more preferably 1-10 wt %, and most preferably 1-5 wt %. In another embodiment, the first seed film 26 comprises $In_xZn_{1-x}$ oxide, wherein x is within the range of 1-40 wt %, preferably 1-18 wt %, more preferably 1-15 wt %, and most preferably 1-10 wt %. In another embodiment, the first seed film 26 comprises $Sn_xIn_{1-x}$ oxide, wherein x is within the range of 1-20 wt %, preferably 2-18 wt %, more preferably 4-15 wt %, and most preferably 5-12 wt %. In another embodiment, the first seed film 26 comprises Ag deposited in an oxygen/argon gas environment, wherein the flow rate of oxygen is 1-70%, preferably 1-50%, more preferably 10-40%, and most preferably 20-40%. In another embodiment, the first seed film 26 comprises $Al_xAg_{1-x}$, wherein x is within the range of 1-35 wt % (BH and AH), preferably 1-20 wt % (BH and AH), more preferably 1-18 wt % (BH and AH), and most preferably 1-15 wt % (BH and AH). In some embodiments, such as FIG. 5a, the first dielectric layer 20, comprises a first film 22, a second film 24, and a first seed film 26.

A first metallic layer 28 can be deposited over the first dielectric layer 20. The first metallic layer 28 can include a reflective metal, such as but not limited to metallic gold, copper, silver, aluminum, or mixtures, alloys, or combinations thereof. In one embodiment, the first metallic layer 28 comprises a metallic silver layer. In another embodiment, the first metallic layer 28 comprises a metallic aluminum doped silver layer. In another non-limiting embodiment, the first metallic layer 28 includes silver and/or copper. The first metallic layer 28 can have a thickness in the range of 50 Å to 200 Å, preferably 75 Å to 150 Å, more preferably 80 Å to 120 Å, most preferably 90 Å to 110 Å.

A first primer layer 30 may be deposited over the first metallic layer 28. The first primer layer 30 can be an oxygen-capturing material, such as titanium, that can be sacrificial during the deposition process to prevent degradation or oxidation of the first metallic layer 28 during the sputtering process or subsequent heating processes. The oxygen-capturing material can be chosen to oxidize before the material of the first metallic layer 28. Examples of materials suitable for the primer layer include zinc, aluminum, vanadium, tungsten, tantalum, niobium, zirconium, manganese, chromium, tin, nickel, gallium, indium, germanium, magnesium, molybdenum, silver, silicon carbide, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, mixtures thereof, and alloys thereof, where the primer is deposited as a metal and may be subsequently oxidized. At least a portion of the primer layer is a nitride or an oxide. The first primer layer may comprise an oxide, nitride, sub-oxide, sub-nitride, oxynitride, or sub-oxynitride of any of the materials that may be used as the first primer layer. If silver zinc, zinc, silver zinc oxide, aluminum zinc oxide, indium zinc oxide, gallium zinc oxide, or vanadium zinc oxide is used as the first primer layer 30, it would preferentially oxidize before oxidation of the underlying silver layer.

In one embodiment, the first primer layer 30 comprises zinc. In another embodiment, the first primer layer 30 comprises $Ag_xZn_{1-x}$ oxide. In another embodiment, the first primer layer 30 comprises $Ag_xZn_{1-x}$. In another embodiment, the first primer layer 30 comprises $Al_xZn_{1-x}$ oxide. In another embodiment, the first primer layer 30 comprises $In_xZn_{1-x}$ oxide. In another embodiment, the first primer layer 30 comprises $Ga_xZn_{1-x}$ oxide. In another embodiment, the first primer layer 30 comprises $V_xZn_{1-x}$ oxide. In another embodiment, the first primer layer 30 comprises $Al_xTi_{1-x}$ oxide. In another embodiment, the first primer layer 30 comprises $Al_xNb_{1-x}$ oxide. In another embodiment, the first primer layer 30 comprises $Al_xNb_{1-x}$ nitride. In another embodiment, the first primer layer 30 comprises $W_xNb_{1-x}$ nitride. In another embodiment, the first primer layer 30 comprises $W_xTi_{1-x}$ oxide. In another embodiment, the first primer layer 30 comprises $Ti_xTa_{1-x}$ oxide.

In another embodiment, the first primer layer 30 comprises $Ti_xNb_{1-x}$ oxide. In another embodiment, the first primer layer 30 comprises $Ti_xNb_{1-x}$ nitride. In another embodiment, the first primer layer 30 comprises $Nb_xZr_{1-x}$ oxide. In another embodiment, the first primer layer 30 comprises $Ta_xW_{1-x}$ oxide. In another embodiment, the first primer layer 30 comprises $W_xNb_{1-x}$ oxide. In another embodiment, the first primer layer 30 comprises $Zn_xTi_{1-x}$ oxide. The first primer layer 30 has a thickness in the range of 5 Å to 50 Å, e.g., from 10 Å to 35 Å, e.g., from 15 Å to 35 Å, e.g. from 10 Å to 20 Å, e.g. from 10 Å to 30 Å, e.g., from 20 Å to 30 Å, e.g. from 30 Å to 40 Å.

A second dielectric layer 32 can be deposited over the first primer layer 30. In the illustrated non-limiting embodiments of FIGS. 6a-d, the second dielectric layer 32 includes a first film 34 and a second film 36. The first film 34 may be comprised of an oxide, a nitride, an oxynitride, or a mixture of a metal or metals selected from the group consisting of titanium, hafnium, zirconium, niobium, zinc, bismuth, lead, indium, tin, silicon, aluminum, gallium, vanadium, and mixtures thereof. In one embodiment, the first film 34 comprises zinc oxide. In another embodiment, the first film 34 comprises aluminum zinc oxide. In another embodiment, the first film 34 comprises indium zinc oxide. In another embodiment, the first film 34 comprises gallium zinc oxide. In another embodiment, the first film 34 comprises indium tin oxide. In another embodiment, the first film 34 comprises vanadium zinc oxide.

A second film 36 can be deposited over the first film 34. The second film 36 may be comprised of an oxide, a nitride, an oxynitride or a mixture of a metal or metals selected from the group consisting of titanium, hafnium, zirconium, niobium, zinc, bismuth, lead, indium, tin, silicon, aluminum, gallium, vanadium, and mixtures thereof. In one embodiment, the second film 36 comprises zinc stannate. In some embodiments, like that of FIG. 6b, the first film 34 and the second film 36 are the only films of the second dielectric layer 32.

An optional third film 38 can be deposited over the second film 36 to form a multi-film second dielectric layer 32. The third film 38 may be comprised of an oxide, a nitride, an oxynitride, or a mixture of a metal or metals selected from the group consisting of titanium, hafnium, zirconium, niobium, zinc, bismuth, lead, indium, tin, silicon, aluminum, gallium, and vanadium. In one embodiment, the third film 38 comprises zinc oxide. In another embodiment, the third film 38 comprises indium zinc oxide. In another embodiment, the third film 38 comprises aluminum zinc oxide. In another embodiment, the third film 38 comprises gallium zinc oxide. In another embodiment, the third film 38 comprises indium tin oxide. In another embodiment, the third film 38 comprises vanadium zinc oxide. In one non-limiting embodiment, the first dielectric layer 20 or the second dielectric layer 32 comprises a silicon nitride film. In some embodiments, such as the ones shown in FIGS. 6a and 6c, the second dielectric layer 32 comprises a first film 34, a second film 36, and a third film 38. In some embodiments, such as FIG. 6a, the second dielectric layer 32 only has a first film 34, a second film 36, and a third film 38.

In certain embodiments, the second dielectric layer 32 is the topmost dielectric layer. The second dielectric layer 32 can have a thickness in the range of less than or equal to 1,500 Å, such as less than or equal to 1,200 Å, such as between 400 Å to 1,200 Å, 500 Å to 1,100 Å, such as 600 Å to 1,000 Å, such as 700 Å to 900 Å, or such as 775 Å to 850 Å.

A second seed film 40 may be adjacent to or in direct contact with the second metallic layer 42 and between the second dielectric layer 32 and the second metallic layer 42. The second seed film 40 is a film comprising at least one of the following: aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof. In one embodiment the second seed film 40 comprises aluminum zinc, vanadium zinc, zinc, silver zinc, metals thereof, alloys thereof, oxides thereof, or sub-oxides thereof. In another embodiment, the second seed film 40 is gallium zinc, indium zinc, indium tin, silver, aluminum-doped silver, metals thereof, alloys thereof, oxides thereof, or sub-oxides thereof.

In one embodiment, the second seed film 40 comprises $V_xZn_{1-x}$ oxide, wherein x is within the range of 1-25 wt %, preferably 1-15 wt %, more preferably 1-10 wt %, and most preferably 1-8 wt %. In another embodiment, the second seed film 40 comprises $Al_xZn_{1-x}$ oxide, wherein x is within the range of 1-25 wt %, preferably 1-15 wt %, more preferably 1-12 wt %, and most preferably 1-10 wt %. In another embodiment, the second seed film 40 comprises $Ga_xZn_{1-x}$ oxide, wherein x is within the range of 1-20 wt %, preferably 1-15 wt %, more preferably 1-10 wt %, and most preferably 1-5 wt %. In another embodiment, the second seed film 40 comprises $In_xZn_{1-x}$ oxide, wherein x is within the range of 1-40 wt %, preferably 1-18 wt %, more preferably 1-15 wt %, and most preferably 1-10 wt %. In another embodiment, the second seed film 40 comprises $Sn_xIn_{1-x}$ oxide, wherein x is within the range of 1-20 wt %, preferably 2-18 wt %, more preferably 4-15 wt %, and most preferably 5-12 wt %. In another embodiment, the second seed film 40 comprises Ag deposited in an oxygen/argon gas environment, wherein the flow rate of oxygen is 1-70%, preferably 1-50%, more preferably 10-40%, and most preferably 20-40%. In another embodiment, the second seed film 40 comprises $Al_xAg_{1-x}$, wherein x is within the range of 1-35 wt % (BH and AH), preferably 1-20 wt % (BH and AH), more preferably 1-18 wt % (BH and AH), and most preferably 1-15 wt % (BH and AH). In some embodiments, such as FIGS. 6c and 6d, the second dielectric layer 32 comprises a first film 34, a second film 36, and a second seed film 40. In some embodiments, such as FIG. 6d, the second dielectric layer 32 only has a first film 34, a second film 36, and a second seed film 40. In some embodiments, such as FIG. 6c, the second dielectric layer 32 comprises a first film 34, a second film 36, a third film 38, and a second seed film 40.

A second metallic layer 42 can be deposited over the second dielectric layer 32. The second metallic layer 42 can include any one or more of the reflective materials described above with respect to the first metallic layer 28. In one non-limiting embodiment, the second metallic layer 42 comprises silver. In another non-limiting embodiment, the second metallic layer 42 comprises aluminum doped silver. In another non-limiting embodiment, the second metallic layer 42 includes silver and/or copper. The second metallic layer 42 can have a thickness in the range of 75 Å to 175 Å, preferably 100 Å to 150 Å, more preferably 110 Å to 130 Å, most preferably 119 Å to 129 Å. In another non-limiting embodiment, this second metallic layer 42 can be thicker than the first and/or third metallic layers.

A second primer layer 44 can be deposited over the second metallic layer 42. The second primer layer 44 can be any of the materials described above with respect to the first primer layer 30. Examples of materials suitable for the primer layer include zinc, aluminum, vanadium, tungsten, tantalum, niobium, zirconium, manganese, chromium, tin, nickel, gallium, indium, germanium, magnesium, molybdenum, silver, silicon carbide, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, mixtures thereof, and alloys thereof, where the primer is deposited as a metal and may be subsequently oxidized. At least a portion of the primer layer is a nitride or an oxide. The second primer layer may comprise an oxide, nitride, sub-oxide, sub-nitride, oxynitride, or sub-oxynitride of any of the materials that may be used as the second primer layer. If silver zinc, zinc, silver zinc oxide, aluminum zinc oxide, indium zinc oxide, gallium zinc oxide, or vanadium zinc oxide is used as the first primer layer 30, it would preferentially oxidize before oxidation of the underlying silver layer.

In one embodiment, the second primer layer 44 comprises zinc. In another embodiment, the second primer layer 44 comprises $Ag_xZn_{1-x}$ oxide. In another embodiment, the second primer layer 44 comprises $Ag_xZn_{1-x}$. In another embodiment, the second primer layer 44 is $Al_xZn_{1-x}$ oxide. In another embodiment, the second primer layer 44 comprises $In_xZn_{1-x}$ oxide. In another embodiment, the second primer layer 44 comprises $Ga_xZn_{1-x}$ oxide. In another embodiment, the second primer layer 44 comprises $V_xZn_{1-x}$ oxide. In another embodiment, the second primer layer 44 comprises $Al_xTi_{1-x}$ oxide. In another embodiment, the second primer layer 44 comprises $Al_xNb_{1-x}$ oxide. In another embodiment, the second primer layer 44 comprises $Al_xNb_{1-x}$ nitride. In another embodiment, the second primer layer 44 comprises $W_xNb_{1-x}$ nitride. In another embodiment, the second primer layer 44 comprises $W_xTi_{1-x}$ oxide. In another embodiment, the second primer layer 44 comprises $Ti_xTa_{1-x}$ oxide. In another embodiment, the second primer layer 44 comprises $Ti_xNb_{1-x}$ oxide. In another embodiment, the second primer layer 44 comprises $Ti_xNb_{1-x}$ nitride. In another embodiment, the second primer layer 44 comprises $Nb_xZr_{1-x}$ oxide. In another embodiment, the second primer layer 44 comprises $Ta_xW_{1-x}$ oxide. In another embodiment, the second primer layer 44 comprises $W_xNb_{1-x}$ oxide. In another embodiment, the second primer layer 44 comprises $Zn_xTi_{1-x}$ oxide. The second primer layer 44 can have a thickness in the range of about 5 Å to 50 Å, e.g., from 10 Å to 35 Å, e.g., from 15 Å to 35 Å, e.g. from 10 Å to 20 Å, e.g. from 10 Å to 30 Å, e.g., from 20 Å to 30 Å, e.g. from 30 Å to 40 Å.

A third dielectric layer 46 can be deposited over the second metallic layer 42. The third dielectric layer 46 can also include one or more materials discussed above with respect to the first and second dielectric layers 20, 32. In one non-limiting embodiment, the third dielectric layer 46 can include a first film 48. The first film 48 may be comprised of an oxide, a nitride, an oxynitride, or a mixture of a metal or metals selected from the group consisting of titanium, hafnium, zirconium, niobium, zinc, bismuth, lead, indium, tin, silicon, aluminum, gallium, vanadium, and mixtures thereof. In one embodiment, the first film 48 comprises zinc oxide. In another embodiment, the first film 48 comprises aluminum zinc oxide. In another embodiment, the first film 48 comprises indium zinc oxide. In another embodiment, the first film 48 comprises gallium zinc oxide. In another embodiment, the first film 48 comprises indium tin oxide. In another embodiment, the first film 48 comprises vanadium zinc oxide.

The third dielectric layer 46 can comprise a second film 50 deposited over the first film 48. In one embodiment, the second film 50 may be comprised of an oxide, a nitride, an oxynitride, or a mixture of a metal or metals selected from the group consisting of titanium, hafnium, zirconium, niobium, zinc, bismuth, lead, indium, tin, silicon, aluminum, gallium, vanadium, and mixtures thereof. In one embodiment, the second film 50 comprises zinc stannate. In some embodiments, like that of FIG. 7b, the first film 48 and the second film 50 are the only films of the third dielectric layer 46.

The third dielectric layer 46 can comprise an optional third film 52. The third film 52 may be comprised of an oxide, a nitride, an oxynitride, or a mixture of a metal or metals selected from the group consisting of titanium, hafnium, zirconium, niobium, zinc, bismuth, lead, indium, tin, silicon, aluminum, gallium, vanadium, and mixtures thereof. In one embodiment, the third film 52 comprises zinc oxide. In another embodiment, the third film 52 comprises aluminum zinc oxide. In another embodiment, third film 52 comprises indium zinc oxide. In another embodiment, the third film 52 comprises gallium zinc oxide. In another embodiment, the third film 52 comprises indium tin oxide. In another embodiment, the third film 52 comprises vanadium zinc oxide. In some embodiments, such as the ones shown in FIGS. 7a and 7c, the third dielectric layer 46 comprises a first film 48, a second film 50, and a third film 52. In some embodiments, such as FIG. 7a, the third dielectric layer 46 only has a first film 48, a second film 50, and a third film 52.

In certain embodiments, the third dielectric layer 46 is the topmost dielectric layer. In one non-limiting aspect of the invention, the second dielectric layer 32 and third dielectric layer 46 have thicknesses that are within 15% of each other, such as within 10%, such as within 5% of each other. The third dielectric layer 46 can have a thickness in the range of less than or equal to 1,500 Å, such as less than or equal to 1,200 Å, such as between 300 Å to 1,200 Å, 400 Å to 1,100 Å, such as 500 Å to 1,000 Å, such as 600 Å to 900 Å, such as 700 Å to 825 Å, or such as 730 to 760 Å.

A third seed film 54 may be adjacent to and/or in direct contact with the third metallic layer 56 and between the third dielectric layer 46 and the third metallic layer 56. The third seed film 54 is a film comprised of at least one of the following: aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof. In one embodiment the third seed film 54 comprises aluminum zinc, vanadium zinc, zinc, silver zinc, metals thereof, alloys thereof, oxides thereof, or sub-oxides thereof. In another embodiment, the third seed film 54 is gallium zinc, indium zinc, indium tin, metals thereof, alloys thereof, oxides thereof, nitrides thereof, sub-nitrides thereof, or sub-oxides thereof.

In another embodiment, the third seed film 54 comprises $V_xZn_{1-x}$ oxide, wherein x is within the range of 1-25 wt %, preferably 1-15 wt %, more preferably 1-10 wt %, and most preferably 1-8 wt %. In another embodiment, the third seed film 54 comprises $Al_xZn_{1-x}$ oxide, wherein x is within the range of 1-25 wt %, preferably 1-15 wt %, more preferably 1-12 wt %, and most preferably 1-10 wt %. In another embodiment, the third seed film 54 comprises $Ga_xZn_{1-x}$ oxide, wherein x is within the range of 1-20 wt %, preferably 1-15 wt %, more preferably 1-10 wt %, and most preferably 1-5 wt %. In another embodiment, the third seed film 54 comprises $In_xZn_{1-x}$ oxide, wherein x is within the range of 1-40 wt %, preferably 1-18 wt %, more preferably 1-15 wt %, and most preferably 1-10 wt %. In another embodiment, the third seed film 54 comprises $Sn_xIn_{1-x}$ oxide, wherein x is within the range of 1-20 wt %, preferably 2-18 wt %, more preferably 4-15 wt %, and most preferably 5-12 wt %. In another embodiment, the third seed film 54 comprises Ag deposited in an oxygen/argon gas environment, wherein the flow rate of oxygen is 1-70%, preferably 1-50%, more preferably 10-40%, and most preferably 20-40%. In another embodiment, the third seed film 54 comprises $Al_xAg_{1-x}$, wherein x is within the range of 1-35 wt % (BH and AH), preferably 1-20 wt % (BH and AH), more preferably 1-18 wt % (BH and AH), and most preferably 1-15 wt % (BH and AH). In some embodiments, such as FIGS. 7c and 7d, the third dielectric layer 46 comprises a first film 48, a second film 50, and a third seed film 54. In some embodiments, such as FIG. 7d, the third dielectric layer 46 only has a first film 48, a second film 50, and a third seed film 54. In some embodiments, such as FIG. 7c, the third dielectric layer 46 comprises a first film 48, a second film 50, a third film 52, and a third seed film 54.

The coating 10 can further include a third metallic layer 56 deposited over the third dielectric layer 46. The third metallic layer 56 can be any of the materials discussed above with respect to the first and second metallic layers 28, 42. In one non-limiting embodiment, the third metallic layer 56 comprises silver. In another non-limiting embodiment, the third metallic layer 56 comprises aluminum doped silver. In another non-limiting embodiment, the third metallic layer 56 comprises silver and/or copper. The third metallic layer 56 can have a thickness in the range of 75 Å to 175 Å, preferably 100 Å to 150 Å, more preferably 110 Å to 130 Å, most preferably 118 Å to 127 Å. In one non-limiting aspect of the invention, the first metallic layer 28 is thinner than the third metallic layer 56. In another non-limiting aspect of the invention, the second metallic layer 42 is thinner than the third metallic layer 56.

In one non-limiting embodiment, the coated article comprises only the first, second, and third metallic layers 28, 42, 56. There may be no additional metallic layers in the coated article. The metallic layers may include only silver, aluminum doped silver, or silver and copper; or more than 80 wt. % silver, aluminum doped silver, or silver and copper.

A third primer layer 58 can be deposited over the third metallic layer 56. The third primer layer 58 can be of any of the primer materials described above with respect to the first or second primer layers 30, 44. Examples of materials suitable for the primer layer include zinc, aluminum, vanadium, tungsten, tantalum, niobium, zirconium, manganese, chromium, tin, nickel, gallium, indium, germanium, magnesium, molybdenum, silver, silicon carbide, aluminum-doped silver aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, mixtures thereof, and alloys thereof, where the primer is deposited as a metal and may be subsequently oxidized. At least a portion of the primer layer is a nitride or an oxide. The third primer layer may comprise an oxide, nitride, sub-oxide, sub-nitride, oxynitride, or sub-oxynitride of any of the materials that may be used as the third primer layer. If silver zinc, zinc, silver zinc oxide, aluminum zinc oxide, indium zinc oxide, gallium zinc oxide, or vanadium zinc oxide is used as the third primer layer 58, it would preferentially oxidize before oxidation of the underlying silver layer.

In one embodiment, the third primer layer 58 comprises zinc. In another embodiment, the third primer layer 58 comprises $Ag_xZn_{1-x}$ oxide. In another embodiment, the third primer layer 58 comprises $Ag_xZn_{1-x}$. In another embodiment, the third primer layer 58 comprises $Al_xZn_{1-x}$ oxide. In another embodiment, the third primer layer 58 comprises $In_xZn_{1-x}$ oxide. In another embodiment, the third primer layer 58 comprises $Ga_xZn_{1-x}$ oxide. In another embodiment, the third primer layer 58 comprises $V_xZn_{1-x}$ oxide. In another embodiment, the third primer layer 58 comprises $Al_xTi_{1-x}$ oxide. In another embodiment, the third primer layer 58 comprises $Al_xNb_{1-x}$ oxide. In another embodiment, the third primer layer 58 comprises $Al_xNb_{1-x}$ nitride. In another embodiment, the third primer layer 58 comprises $W_xNb_{1-x}$ nitride. In another embodiment, the third primer layer 58 comprises $W_xTi_{1-x}$ oxide. In another embodiment, the third primer layer 58 comprises $Ti_xTa_{1-x}$ oxide. In another embodiment, the third primer layer 58 comprises $Ti_xNb_{1-x}$ oxide. In another embodiment, the third primer layer 58 comprises $Ti_xNb_{1-x}$ nitride. In another embodiment, the third primer layer 58 comprises $Nb_xZr_{1-x}$ oxide. In another embodiment, the third primer layer 58 comprises $Ta_xW_{1-x}$ oxide. In another embodiment, the third primer layer 58 comprises $W_xNb_{1-x}$ oxide. In another embodiment, the third primer layer 58 comprises $Zn_xTi_{1-x}$ oxide. The third primer layer 58 has a thickness in the range of 5 Å to 50 Å, e.g., from 10 Å to 35 Å, e.g., from 15 Å to 35 Å, e.g. from 10 Å to 20 Å, e.g. from 10 Å to 30 Å, e.g., from 20 Å to 30 Å, e.g. from 30 Å to 40 Å.

A fourth dielectric layer 60 can be deposited over the third primer layer 58. The fourth dielectric layer 60 can be comprised of one or more metal oxide or metal alloy oxide-containing layers, such as those discussed above with respect to the first, second, or third dielectric layers 20, 32, 46. Alternatively, the fourth dielectric layer can comprise silicon nitride or silicon oxynitride. In one non-limiting embodiment, the fourth dielectric layer 60 comprises a first film 62 deposited over the third primer layer 58, a second film 64, deposited over the first film 62, and an optional third film 66 over the second film 64. The first film 62 may be comprised of an oxide, a nitride, an oxynitride, or a mixture of a metal or metals selected from the group consisting of titanium, hafnium, zirconium, niobium, zinc, bismuth, lead, indium, tin, silicon, gallium, vanadium, and mixtures thereof. In one embodiment, the first film 62 comprises zinc oxide or zinc stannate. In another embodiment, the first film 62 comprises aluminum zinc oxide. In another embodiment, first film 62 comprises indium zinc oxide. In another embodiment, the first film 62 comprises gallium zinc oxide. In another embodiment, the first film 62 comprises indium tin oxide. In another embodiment, the first film 62 comprises vanadium zinc oxide.

Figure 8A:
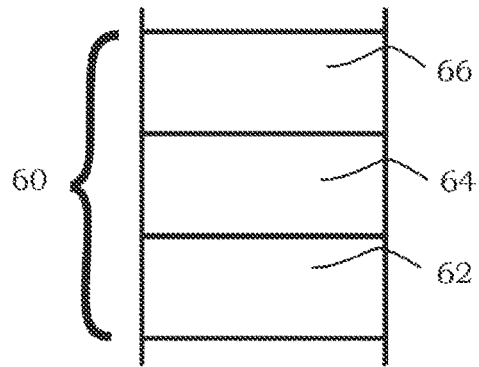
FIGS. 8a-d are cross-sectional views (not to scale) of non-limiting fourth dielectric layer embodiments according to the invention.
Figure 8B:
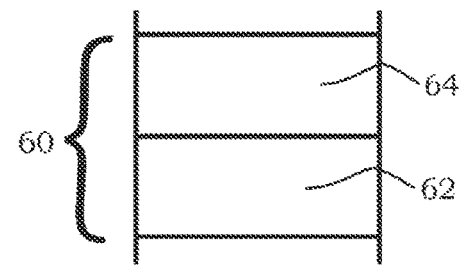

The fourth dielectric layer 60 can comprise a second film 64 deposited over the first film 62. In one embodiment, the second film 64 may be comprised of an oxide, a nitride, an oxynitride, or a mixture of a metal or metals selected from the group consisting of titanium, hafnium, zirconium, niobium, zinc, bismuth, lead, indium, tin, silicon, aluminum, gallium, vanadium, and mixtures thereof. In one embodiment, the second film 64 comprises zinc stannate, silicon nitride or silicon oxynitride. In some embodiments, like that of FIG. 8b, the first film 62 and the second film 64 are the only films of the fourth dielectric layer 60.

Figure 8C:
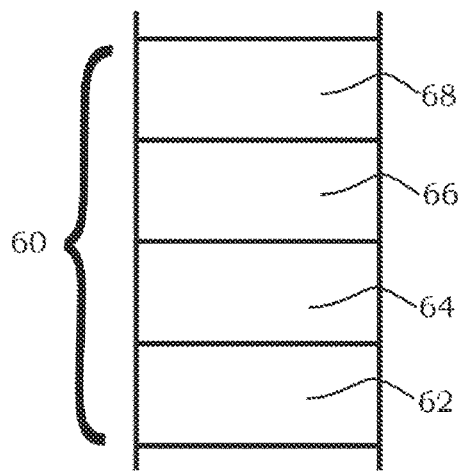

The fourth dielectric layer 60 can comprise an optional third film 66 deposited over the second film 64. The third film 66 may be comprised of an oxide, a nitride, an oxynitride, or a mixture of a metal or metals selected from the group consisting of titanium, hafnium, zirconium, niobium, zinc, bismuth, lead, indium, tin, silicon, aluminum, gallium, vanadium, and mixtures thereof. In one embodiment, the third film 66 comprises zinc oxide, silicon oxynitrides, or silicon nitride. In another embodiment, the third film 66 comprises zinc oxide. In another embodiment, the third film 66 comprises aluminum zinc oxide. In another embodiment, the third film 66 comprises indium zinc oxide. In another embodiment, the third film 66 comprises gallium zinc oxide. In another embodiment, the third film 66 comprises indium tin oxide. In another embodiment, the third film 66 comprises vanadium zinc oxide. In some embodiments, such as the ones shown in FIGS. 8a and 8c, the fourth dielectric layer 60 comprises a first film 62, a second film 64, and a third film 66. In some embodiments, such as FIG. 8a, the fourth dielectric layer 60 only has a first film 62, a second film 64, and a third film 66.

In one non-limiting embodiment, the first and third films 62, 66 of the fourth dielectric layer 60 can each have a thickness in the range of about 50 Å to 200 Å, e.g., 75 Å to 150 Å, e.g., 100 Å. The second film 64 can have a thickness in the range of 250 Å to 900 Å, e.g., 275 Å to 800 Å, e.g., 300 Å to 775 Å, e.g., 350 Å to 710 Å.

In embodiments where the fourth dielectric layer 60 is the top most or uppermost dielectric layer, the fourth dielectric layer 60 can have a thickness in the range of less than or equal to 1,000 Å, such as less than or equal to 600 Å, such as between 200 Å to 600 Å, 250 Å to 550 Å, such as 300 Å to 500 Å, such as 325 Å to 475 Å, or such as 360 Å to 390 Å. In embodiments where the fourth dielectric layer 60 is the top most dielectric layer, both the first dielectric layer 20 and fourth dielectric layer 60 can be thinner than the second dielectric layer 32 and third dielectric layer 46.

A fourth seed film 68 may be adjacent to or in direct contact with the fourth metallic layer 70 and between the fourth dielectric layer 60 and the fourth metallic layer 70. The fourth seed film 68 is a film comprised of at least one of the following: aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof. In one embodiment the fourth seed film 68 comprises aluminum zinc, vanadium zinc, zinc, silver zinc, metals thereof, alloys thereof, oxides thereof, or sub-oxides thereof. In another embodiment, the fourth seed film 68 comprises gallium zinc, indium zinc, indium tin, metals thereof, alloys thereof, oxides thereof, nitrides thereof, sub-nitrides thereof, or sub-oxides thereof.

Figure 8D:
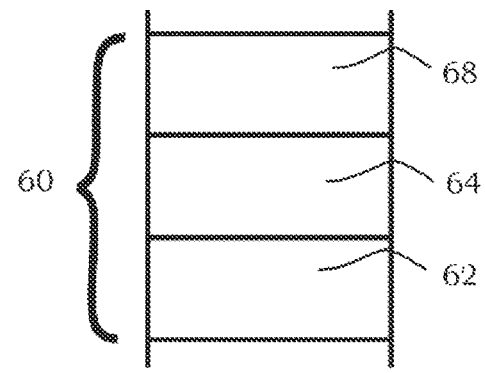

In another embodiment, the fourth seed film 68 comprises $V_xZn_{1-x}$ oxide, wherein x is within the range of 1-25 wt %, preferably 1-15 wt %, more preferably 1-10 wt %, and most preferably 1-8 wt %. In another embodiment, the fourth seed film 68 comprises $Al_xZn_{1-x}$ oxide, wherein x is within the range of 1-25 wt %, preferably 1-15 wt %, more preferably 1-12 wt %, and most preferably 1-10 wt %. In another embodiment, the fourth seed film 68 comprises $Ga_xZn_{1-x}$ oxide, wherein x is within the range of 1-20 wt %, preferably 1-15 wt %, more preferably 1-10 wt %, and most preferably 1-5 wt %. In another embodiment, the fourth seed film 68 comprises $In_xZn_{1-x}$ oxide, wherein x is within the range of 1-40 wt %, preferably 1-18 wt %, more preferably 1-15 wt %, and most preferably 1-10 wt %. In another embodiment, the fourth seed film 68 comprises $Sn_xIn_{1-x}$ oxide, wherein x is within the range of 1-20 wt %, preferably 2-18 wt %, more preferably 4-15 wt %, and most preferably 5-12 wt %. In another embodiment, the fourth seed film 68 comprises Ag deposited in an oxygen/argon gas environment, wherein the flow rate of oxygen is 1-70%, preferably 1-50%, more preferably 10-40%, and most preferably 20-40%. In another embodiment, the fourth seed film 68 comprises $Al_xAg_{1-x}$, wherein x is within the range of 1-35 wt % (BH and AH), preferably 1-20 wt % (BH and AH), more preferably 1-18 wt % (BH and AH), and most preferably 1-15 wt % (BH and AH). In some embodiments, such as FIGS. 8c and 8d, the fourth dielectric layer 60 comprises a first film 62, a second film 64, and a fourth seed film 68. In some embodiments, such as FIG. 8d, the fourth dielectric layer 60 only has a first film 62, a second film 64, and a fourth seed film 68. In some embodiments, such as FIG. 8c, the fourth dielectric layer 60 comprises a first film 62, a second film 64, a third film 66, and a fourth seed film 68.

Figure 4A:
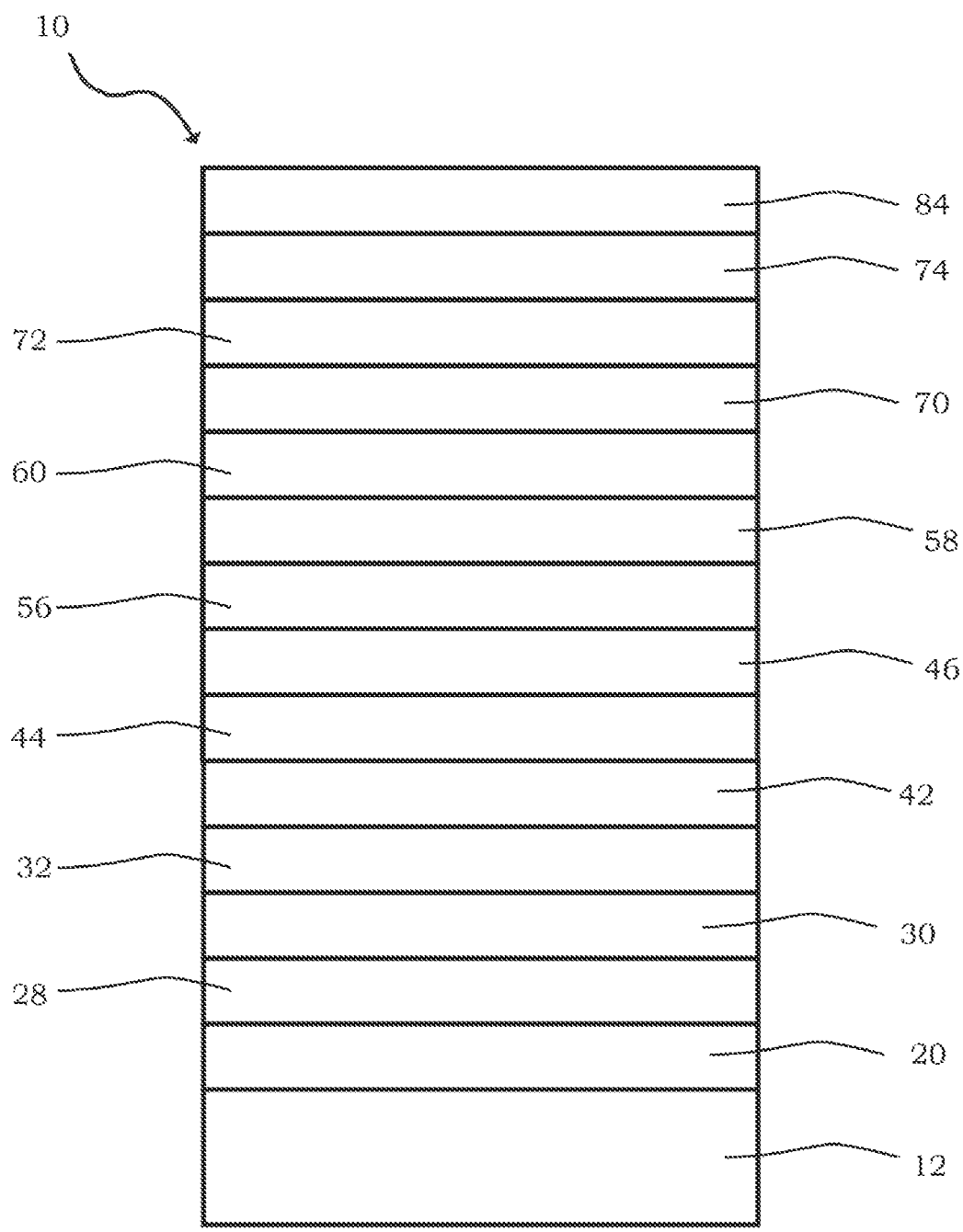
FIG. 4a is a cross-sectional view (not to scale) of a non-limiting coating according to the invention.
Figure 4B:
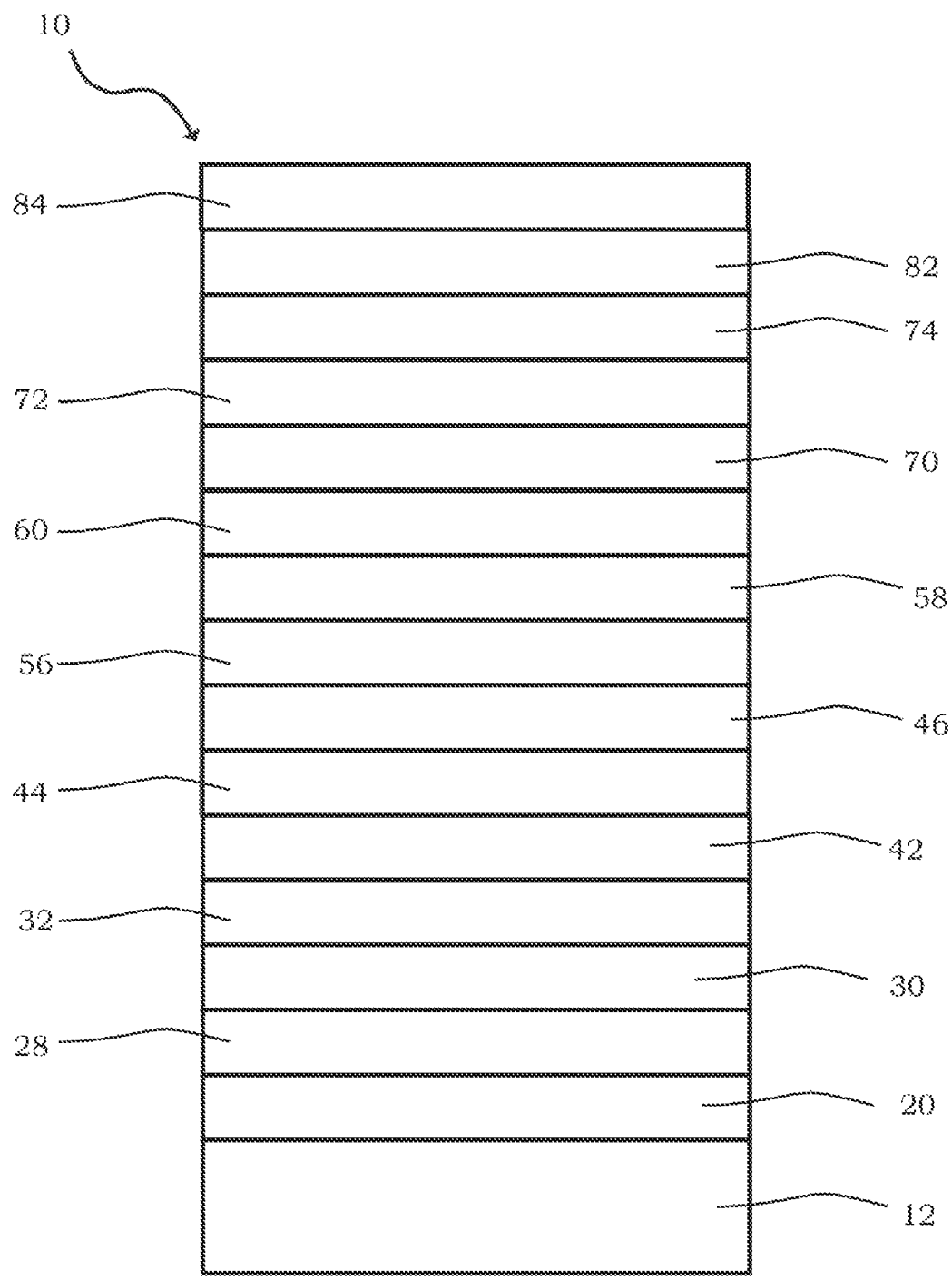
FIG. 4b is a cross-sectional view (not to scale) of a non-limiting coating according to the invention.

Another exemplary non-limiting coating 10 suitable for the invention is shown in FIGS. 4a and 4b. The coating 10 can further include a fourth metallic layer 70 deposited over or in direct contact with at least a portion of the fourth dielectric layer 60. The fourth metallic layer 70 can be of any of the materials discussed above with respect to the first, second, or third metallic layers 28, 42, 56. In one non-limiting embodiment, the fourth metallic layer 70 includes silver and/or copper. In another non-limiting embodiment, the fourth metallic layer 70 includes aluminum doped silver. The fourth metallic layer 70 can have a thickness in the range of 50 Å to 175 Å, preferably 75 Å to 150 Å, more preferably 80 Å to 120 Å, most preferably 90 Å to 110 Å. In one non-limiting aspect of the invention, the first metallic layer 28 and fourth metallic layer 70 have thicknesses that are within 20% of each other, such as within 15%, such as within 5% to 10% of each other.

In one non-limiting embodiment, the coated article comprises only the first, second, third, and fourth metallic layers 28, 42, 56, and 70. There may be no additional metallic layers in the coated article. The metallic layers may include only silver, aluminum doped silver, or silver and copper; or more than 80 wt. % silver, aluminum doped silver, or silver and copper.

Each metallic layer has a thickness. The sum of the thickness of all of the metallic layers is at least 30 nm and at most 65 nm, such as at least 35 nm and at most 52 nm. In one non-limiting embodiment, the total combined thickness of the metallic layers is no more than 55 nanometers, such as no more than 52 nm, such as no more than 48 nanometers. In another non-limiting embodiment, the total combined thickness of the metallic layers is at least 30 nm, at least 32 nm, at least 34 nm, at least 35 nm, at least 38 nm or at least 40 nm.

A fourth primer layer 72 can be deposited over or in direct contact with at least a portion of the fourth metallic layer 70. The fourth primer layer 72 can be any of the primer materials described above with respect to the first, second, or third primer layers 30, 44, 58. Examples of materials suitable for the primer layer include zinc, aluminum, vanadium, tungsten, tantalum, niobium, zirconium, manganese, chromium, tin, nickel, gallium, indium, germanium, magnesium, molybdenum, silver, silicon carbide, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, mixtures thereof, and alloys thereof, where the primer is deposited as a metal and may be subsequently oxidized. The fourth primer layer may comprise an oxide, nitride, sub-oxide, sub-nitride, oxynitride, or sub-oxynitride of any of the materials that may be used as the fourth primer layer. At least a portion of the primer layer is a nitride or an oxide. If silver zinc, zinc, silver zinc oxide, aluminum zinc oxide, indium zinc oxide, gallium zinc oxide, or vanadium zinc oxide is used as the first primer layer 30, it would preferentially oxidize before oxidation of the underlying silver layer.

In one embodiment, the fourth primer layer 72 comprises zinc. In another embodiment, the fourth primer layer 72 comprises $Ag_xZn_{1-x}$ oxide. In another embodiment, the fourth primer layer 72 comprises $Ag_xZn_{1-x}$. In another embodiment, the fourth primer layer 72 is $Al_xZn_{1-x}$ oxide. In another embodiment, the fourth primer layer 72 comprises $In_xZn_{1-x}$ oxide. In another embodiment, the fourth primer layer 72 comprises $Ga_xZn_{1-x}$ oxide. In another embodiment, the fourth primer layer 72 comprises $V_xZn_{1-x}$ oxide. In another embodiment, the fourth primer layer 72 comprises $Al_xTi_{1-x}$ oxide. In another embodiment, the fourth primer layer 72 comprises $Al_xNb_{1-x}$ oxide. In another embodiment, the fourth primer layer 72 comprises $Al_xNb_{1-x}$ nitride. In another embodiment, the fourth primer layer 72 comprises $W_xNb_{1-x}$ nitride. In another embodiment, the fourth primer layer 72 comprises $W_xTi_{1-x}$ oxide. In another embodiment, the fourth primer layer 72 comprises $Ti_xTa_{1-x}$ oxide. In another embodiment, the fourth primer layer 72 comprises $Ti_xNb_{1-x}$ oxide. In another embodiment, the fourth primer layer 72 comprises $Ti_xNb_{1-x}$ nitride. In another embodiment, the fourth primer layer 72 comprises $Nb_xZr_{1-x}$ oxide. In another embodiment, the fourth primer layer 72 comprises $Ta_xW_{1-x}$ oxide. In another embodiment, the fourth primer layer 72 comprises $W_xNb_{1-x}$ oxide. In another embodiment, the fourth primer layer 72 comprises $Zn_xTi_{1-x}$ oxide. The fourth primer layer 72 has a thickness in the range of 5 Å to 50 Å, e.g., from 10 Å to 35 Å, e.g., from 15 Å to 35 Å, e.g. from 10 Å to 20 Å, e.g. from 10 Å to 30 Å, e.g., from 20 Å to 30 Å, e.g. from 30 Å to 40 Å.

A fifth dielectric layer 74 can be deposited over or in direct contact with the fourth primer layer 72. The fifth dielectric layer 74 can be comprised of one or more metal oxide or metal alloy oxide-containing layers, such as those discussed above with respect to the first, second, third, or fourth dielectric layers 20, 32, 46, 60. In one non-limiting embodiment, the fifth dielectric layer 74 comprises a first film 76 deposited over or in direct contact with the fourth primer layer 72. The first film 76 may be comprised an oxide, a nitride, an oxynitride, or a mixture thereof of a metal or metals selected from the group comprised of titanium, hafnium, zirconium, niobium, zinc, bismuth, lead, indium, tin, silicon, aluminum, gallium, vanadium, and mixtures thereof. In one embodiment, the first film 76 comprises zinc oxide or zinc stannate. In another embodiment, the first film 76 comprises aluminum zinc oxide. In another embodiment, the first film 76 comprises indium zinc oxide. In another embodiment, the first film 76 comprises gallium zinc oxide. In another embodiment, the first film 76 comprises indium tin oxide. In another embodiment, the first film 76 comprises vanadium zinc oxide.

Figure 9A:
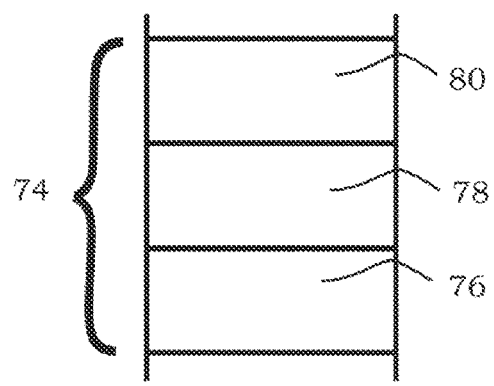
FIGS. 9a-b are cross-sectional views (not to scale) of non-limiting fifth dielectric layer embodiments according to the invention.
Figure 9B:
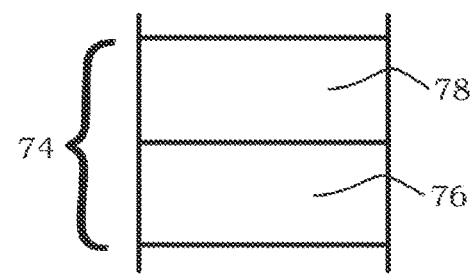

The fifth dielectric layer 74 can comprise a second film 78 deposited over or in direct contact with at least a portion of the first film 76. In one embodiment, the second film 78 comprises an oxide, a nitride, an oxynitride, or a mixture thereof of a metal or metals selected from the group consisting of titanium, hafnium, zirconium, niobium, zinc, bismuth, lead, indium, tin, silicon, aluminum, gallium, vanadium, and mixtures thereof. In one embodiment, the second film 78 comprises zinc stannate, silicon nitride or silicon oxynitride. In some embodiments, such as FIG. 9b, the first film 76 and second film 78 are the only films of the fifth dielectric layer 74.

The fifth dielectric layer 74 can comprise an optional third film 80 deposited over the second film 78. The third film 80 comprises an oxide, a nitride, an oxynitride, or a mixture thereof of a metal or metals selected from the group consisting of titanium, hafnium, zirconium, niobium, zinc, bismuth, lead, indium, tin, silicon, aluminum, gallium, vanadium, and mixtures thereof. In one embodiment, the third film 80 comprises zinc oxide, silicon oxynitrides, or silicon nitride. In another embodiment, the third film 80 comprises silicon nitride. In another embodiment, the third film 80 comprises zinc oxide. In another embodiment, the third film 80 comprises aluminum zinc oxide. In another embodiment, third film 80 comprises indium zinc oxide. In another embodiment, the third film 80 comprises gallium zinc oxide. In another embodiment, the third film 80 comprises indium tin oxide. In another embodiment, the third film 80 comprises vanadium zinc oxide. In some embodiments, such as FIG. 9a, the fifth dielectric layer 74 comprises a first film 76, a second film 78, and a third film 80.

The fifth dielectric layer 74 can have a thickness in the range of less than or equal to 1,000 Å, such as less than or equal to 800 Å, such as between 200 Å to 700 Å, 275 Å to 600 Å, such as 300 Å to 500 Å, such as 325 Å to 475 Å, or such as 350 Å to 460 Å.

In embodiments where the article comprises a fifth dielectric layer 74, the fourth dielectric layer 60 can have a thickness in the range of less than or equal to 1,400 Å, such as less than or equal to 1,200 Å, such as between 400 Å to 1,200 Å, 500 Å to 1,000 Å, such as 600 Å to 800 Å, such as 675 Å to 725 Å, or such as 690 Å to 710 Å. In embodiments where the fifth dielectric layer 74 is the top most dielectric layer, both the first dielectric layer 20 and fifth dielectric layer 74 can be thinner than the second dielectric layer 32, third dielectric layer 46, and fourth dielectric layer 60.

The coating 10 can include an outermost protective layer 84, which, for example in the non-limiting embodiment shown in FIGS. 1a-4b, is deposited over the uppermost dielectric layer, to assist in protecting the underlying layers, such as the metallic layers, from mechanical and chemical attack during processing. In one non-limiting embodiment, the protective layer 84 can be deposited over the second dielectric layer 32, third dielectric layer 46, fourth dielectric layer 60, or the fifth dielectric layer 74. In another non-limiting embodiment, the protective layer 84 can be disposed over and optionally in direct contact with the metallic layer 32, 56, or 70; or the primer layer 44, 58, or 72. The protective layer 84 can be an oxygen barrier coating layer to prevent or reduce the passage of ambient oxygen into the underlying layers of the coating 10, such as during heating or bending. The protective layer 84 can be of any desired material or mixture of materials. In one exemplary embodiment, the protective layer 84 can include a layer having one or more metal oxide or nitride materials, such as but not limited to oxides and/or nitrides of aluminum, silicon, or mixtures thereof. For example, the protective coating 84 can be a single coating layer comprising in the range of 0 wt. % to 100 wt. % alumina and/or 100 wt. % to 0 wt. % silica, such as 5 wt. % to 95 wt. % alumina 45 and 95 wt. % to 5 wt. % silica, such as 10 wt. % to 90 wt. % alumina and 90 wt. % to 10 wt. % silica, such as 15 wt. % to 90 wt. % alumina and 85 wt. % to 10 wt. % silica, such as 50 wt. % to 75 wt. % alumina and 50 wt. % to 25 wt. % silica, such as 50 wt. % to 70 wt. % alumina and 50 wt. % to 30 wt. % silica, such as 35 wt. % to 100 wt. % alumina and 65 wt. % to 0 wt. % silica, e.g., 70 wt. % to 90 wt. % alumina and 30 wt. % to 10 wt. % silica, e.g., 75 wt. % to 85 wt. % alumina and 25 wt. % to 15 wt. % of silica, e.g., 88 wt. % alumina and 12 wt. % silica, e.g., 65 wt. % to 75 wt. % alumina and 35 wt. % to 25 wt. % silica, e.g., 70 wt. % alumina and 30 wt. % silica, e.g., 60 wt. % to less than 75 wt. % alumina and greater than 25 wt. % to 40 wt. % silica. Other materials, such as aluminum, chromium, hafnium, yttrium, nickel, boron, phosphorous, titanium, zirconium, and/or oxides thereof, can also be present, such as to adjust the refractive index of the protective layer 84. In one non-limiting embodiment, the refractive index of the protective layer 84 can be in the range of 1 to 3, such as 1 to 2, such as 1.4 to 2, such as 1.4 to 1.8.

In one non-limiting embodiment, the protective layer 84 comprises a combination silica and alumina coating. The protective coating 84 can be sputtered from two cathodes (e.g., one silicon and one aluminum) or from a single cathode containing both silicon and aluminum. This silicon/aluminum oxide protective layer 84 can be written as $Si_xAl_{[2(1-x)]}O_{(3-x)}$, where x can vary from greater than 0 to less than 1.

In another non-limiting embodiment, the protective layer 84 comprises a combination of titania and alumina.

In one non-limiting embodiment, the protective layer 84 may be comprised of silicon nitride ($Si_3N_4$), silicon oxynitride (SiON), silicon aluminum nitride (SiAlN), silicon aluminum oxynitride (SiAlON), a mixture thereof, and/or an alloy thereof, and which may provide increased durability to the metallic layer 42, 56, or 70. The protective layer 84 may be formed of silicon nitride deposited with other materials having superior electrical conductivity to improve sputtering of the silicon. For example, during deposition, the silicon cathode can include a small amount (e.g., up to 20 wt. %, up to 15 wt. %, up to 10 wt. %, or up to 5 wt. %) of aluminum to improve sputtering. In which case, the resultant silicon nitride protective layer would include a small percentage of aluminum, e.g., up to 15 wt. % aluminum, e.g., up to 10 wt. % aluminum, e.g., up to 5 wt. % aluminum. A coating layer deposited from a silicon cathode having up to 10 wt. % aluminum (added to enhance the conductivity of the cathode) is referred to herein as "a silicon nitride" layer, even though a small amount of aluminum may be present. The small amount of aluminum in the cathode (e.g., less than or equal to 15 wt. %, such as less than or equal to 10 wt. %, such as less than or equal to 5 wt. %) is believed to form aluminum nitride in the predominantly silicon nitride protective layer 84. The protective layer 84 may be formed in a nitrogen atmosphere; however, it is to be understood that other gases, such as oxygen, argon, air may be present in the atmosphere during the deposition of the protective layer 84. For example, the silicon nitride may be deposited in a nitrogen atmosphere. In one non-limiting embodiment, the outermost protective layer 84 may be comprised of SiAlN, SiON, SiAlON, titania, alumina, silica, zirconia, alloys thereof, or mixtures thereof.

The protective layer can be of any desired thickness. Protective layer 84 can have a thickness in the range of 10 Å to 100,000 Å, such as 10 Å to 90,000 Å, such as 10 Å to 80,000 Å, such as 10 Å to 70,000 Å, such as 10 Å to 60,000 Å, such as 10 Å to 50,000 Å, such as 10 Å to 40,000 Å, such as 10 Å to 30,000 Å, such as 10 Å to 20,000 Å, such as 10 Å to 10,000 Å, such as 10 Å to 9,000 Å, such as 10 Å to 8,000 Å, such as 10 Å to 7,000 Å, such as 10 Å to 6,000 Å, such as 10 Å to 5,000 Å, such as 10 Å to 4,000 Å, such as 10 Å to 3,000 Å, such as 10 Å to 2,000 Å, such as 10 Å to 1,000 Å, such as 10 Å to 900 Å, such as 10 Å to 800 Å, such as 10 Å to 700 Å, such as 10 Å to 600 Å, such as 10 Å to 500 Å, such as 10 Å to 400 Å, such as 10 Å to 300 Å, such as 10 Å to 200 Å, such as 10 Å to 100 Å, such as 10 Å to 50 Å. In one non-limiting embodiment, the protective coating 84 comprises a silicon/aluminum oxide coating ($Si_xAl_{[2(1-x)]}O_{(3-x)}$) having a thickness in the range of 10 Å to 100,000 Å, such as 10 Å to 90,000 Å, such as 10 Å to 80,000 Å, such as 10 Å to 70,000 Å, such as 10 Å to 60,000 Å, such as 10 Å to 50,000 Å, such as 10 Å to 40,000 Å, such as 10 Å to 30,000 Å, such as 10 Å to 20,000 Å, such as 10 Å to 10,000 Å, such as 10 Å to 9,000 Å, such as 10 Å to 8,000 Å, such as 10 Å to 7,000 Å, such as 10 Å to 6,000 Å, such as 10 Å to 5,000 Å, such as 10 Å to 4,000 Å, such as 10 Å to 3,000 Å, such as 10 Å to 2,000 Å, such as 10 Å to 1,000 Å, such as 10 Å to 900 Å, such as 10 Å to 800 Å, such as 10 Å to 700 Å, such as 10 Å to 600 Å, such as 10 Å to 500 Å, such as 10 Å to 400 Å, such as 10 Å to 300 Å, such as 10 Å to 200 Å, such as 10 Å to 100 Å, such as 10 Å to 50 Å. The protective layer 84 is the outermost layer of the coated article. Further, the protective layer 84 can be of non-uniform thickness. By "non-uniform thickness" is meant that the thickness of the protective layer 84 can vary over a given unit area, e.g., the protective layer 84 can have high and low spots or areas.

In another non-limiting embodiment, the protective coating 84 can be a multilayer coating comprising a first film and a second film formed over the first film. The first film can comprise alumina, silica, titania, zirconia, tin oxide, or mixtures thereof. In one specific non-limiting embodiment, the first film can comprise alumina or a mixture or alloy comprising alumina and silica. For example, the first film can comprise a silica/alumina mixture having greater than 5 wt. % alumina, such as greater than 10 wt. % alumina, such as greater than 15 wt. % alumina, such as greater than 30 wt. % alumina, such as greater than 40 wt. % alumina, such as 50 wt. % to 70 wt. % alumina, such as in the range of 60 wt. % to 100 wt. % alumina and 40 wt. % to 0 wt. % silica, e.g. 60 wt. % alumina and 40 wt. % silica. In another example, the first film can comprise zinc stannate. In another example, the first film can comprise zirconia. In one non-limiting embodiment, the first film can have a thickness in the range of greater than 0 Å to 50,000 Å, such as greater than 0 Å to 45,000 Å, such as greater than 0 Å to 40,000 Å, such as greater than 0 Å to 35,000 Å, such as greater than 0 Å to 30,000 Å, such as greater than 0 Å to 25,000 Å, such as greater than 0 Å to 20,000 Å, such as greater than 0 Å to 15,000 Å, such as greater than 0 Å to 10,000 Å, such as greater than 0 Å to 5,000 Å, such as greater than 0 Å to 4,500 Å, such as greater than 0 Å to 4,000 Å, such as greater than 0 Å to 3,500 Å, such as greater than 0 Å to 3,000 Å, such as greater than 0 Å to 2,500 Å, such as greater than 0 Å to 2,000 Å, such as greater than 0 Å to 1,500 Å, such as greater than 0 Å to 1,000 Å, such as greater than 0 Å to 500 Å, such as greater than 0 Å to 450 Å, such as greater than 0 Å to 400 Å, such as greater than 0 Å to 350 Å, such as greater than 0 Å to 300 Å, such as greater than 0 Å to 250 Å, such as greater than 0 Å to 200 Å, such as greater than 0 Å to 150 Å, such as greater than 0 Å to 100 Å, such as greater than 0 Å to 50 Å, such as greater than 0 Å to 25 Å.

The second film of the protective layer 84 may comprise, for example, a metal oxide or metal nitride. The second film can be titania, alumina, silica, zirconia, tin oxide, a mixture thereof, or an alloy thereof. For example, the second film may include a mixture of titania and alumina; a mixture of titania and silica; or zirconia. An example of the second film can comprise a titania/alumina mixture having 40-60 wt. % alumina, and 60-40 wt. % titania; 45-55 wt. % alumina, and 45-55 wt. % titania; 48-52 wt. % alumina, and 52-48 wt. % titania; 49-51 wt. % alumina, and 51-49 wt. % titania; or 50 wt. % alumina, and 50 wt. % titania. An example of the second film may include titanium aluminum oxide (TiAlO). Another example of the second film comprises a silica/alumina mixture having greater than 40 wt. % silica, such as greater than 50 wt. % silica, such as greater than 60 wt. % silica, such as greater than 70 wt. % silica, such as greater than 80 wt. % silica, such as in the range of 80 wt. % to 90 wt. % silica and 10 wt. % to 20 wt. % alumina, e.g., 85 wt. % silica and 15 wt. % alumina. In one non-limiting embodiment, the second film can have a thickness in the range of greater than 0 Å to 50,000 Å, such as greater than 0 Å to 45,000 Å, such as greater than 0 Å to 40,000 Å, such as greater than 0 Å to 35,000 Å, such as greater than 0 Å to 30,000 Å, such as greater than 0 Å to 25,000 Å, such as greater than 0 Å to 20,000 Å, such as greater than 0 Å to 15,000 Å, such as greater than 0 Å to 10,000 Å, such as greater than 0 Å to 5,000 Å, such as greater than 0 Å to 4,500 Å, such as greater than 0 Å to 4,000 Å, such as greater than 0 Å to 3,500 Å, such as greater than 0 Å to 3,000 Å, such as greater than 0 Å to 2,500 Å, such as greater than 0 Å to 2,000 Å, such as greater than 0 Å to 1,500 Å, such as greater than 0 Å to 1,000 Å, such as greater than 0 Å to 500 Å, such as greater than 0 Å to 450 Å, such as greater than 0 Å to 400 Å, such as greater than 0 Å to 350 Å, such as greater than 0 Å to 300 Å, such as greater than 0 Å to 250 Å, such as greater than 0 Å to 200 Å, such as greater than 0 Å to 150 Å, such as greater than 0 Å to 100 Å, such as greater than 0 Å to 50 Å, such as greater than 0 Å to 25 Å. Non-limiting examples of suitable protective layers are described, for example, in U.S. patent application Ser. Nos. 10/007,382; 10/133,805; 10/397,001; 10/422,094; 10/422,095; and Ser. No. 10/422,096.

In non-limiting examples, the protective layer 84 may include an additional third film formed over the second film. This third film can be any of the materials used to form the first film or the second film. The third film, for example, can comprise alumina, silica, titania, zirconia, tin oxide, or mixtures thereof. For example, the third film can comprise a mixture of silica and alumina. In another example, the third film comprises zirconia.

In between the top dielectric layer and the protective layer 84, and over at least a portion of or in direct contact with the top dielectric layer, may be a stress layer 82. The stress layer 82 is added underneath the protective layer 84 to reduce the sheet resistance of the coating. The stress layer 82 may have a thickness between 0.5-30 nm, preferably 1-25 nm, more preferably 1-20 nm, or most preferably 1-18 nm. In certain embodiments, the stress layer 82 can comprise silicon, cobalt, titanium, niobium, zirconium, tantalum, oxygen, and/or titanium. In one embodiment, the stress layer 82 comprises silicon cobalt. In one embodiment, the stress layer 82 comprises $Ti_xNb_{1-x}$ suboxide or oxide, wherein x is within the range of 1-100 wt % (BH and AH). In another embodiment, the stress layer 82 comprises $Nb_xZr_{1-x}$ suboxide or oxide, wherein x is within the range of 1-12 wt % AH, preferably 1-11 wt % AH, more preferably 1-11 wt % AH, and most preferably 1-10 wt % AH. In another embodiment, the stress layer 82 comprises $Ti_xTa_{1-x}$ suboxide or oxide, wherein x is within the range of 1-100 wt % AH, preferably 1-20 wt % AH or 30-100 wt % AH, more preferably 1-10 wt % AH or 500 wt % AH, and most preferably 1-4 wt % AH or 60-100 wt % AH. In another embodiment, the stress layer 82 comprises $Si_xCo_{1-x}$ suboxide or oxide, wherein x is within the range of 10-90 wt % AH, preferably 15-90 wt % AH, more preferably 18-90 wt % AH, and most preferably 20-90 wt % AH.

Figure 10:
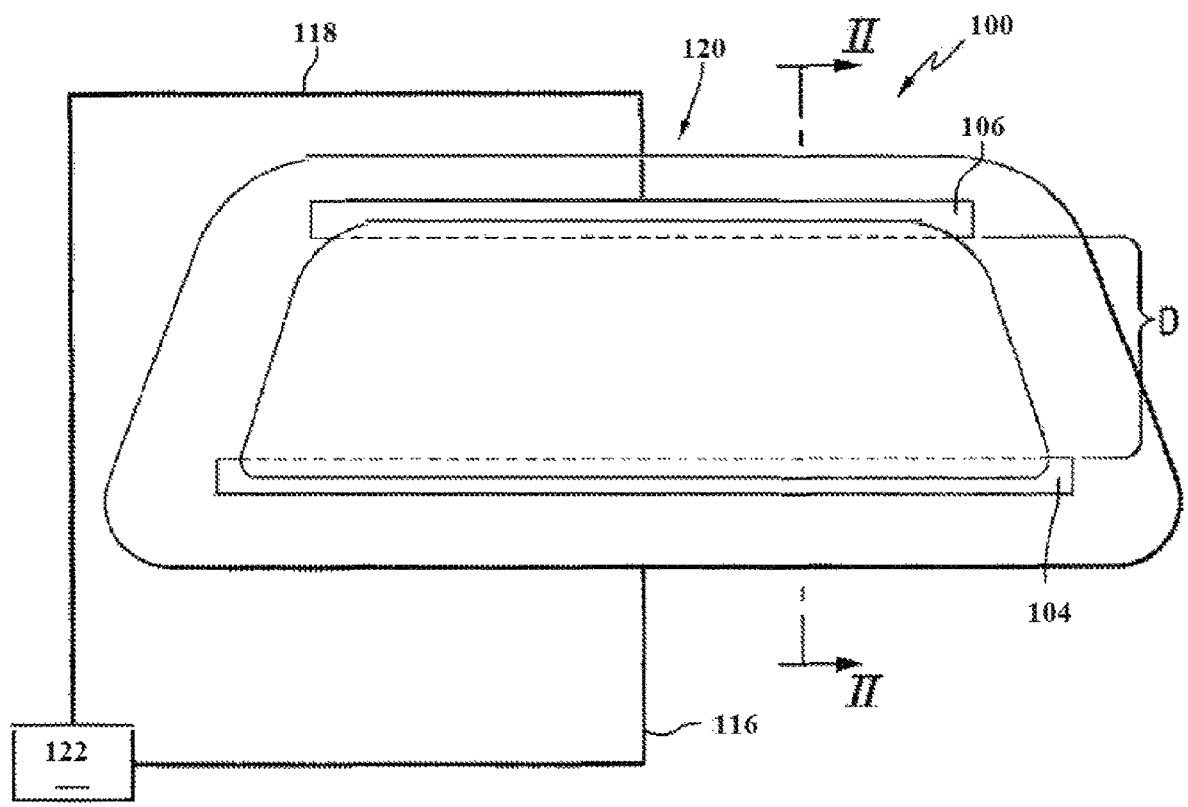
FIG. 10 is a schematic view (not to scale) of a windshield incorporating features of the invention.
Figure 11:
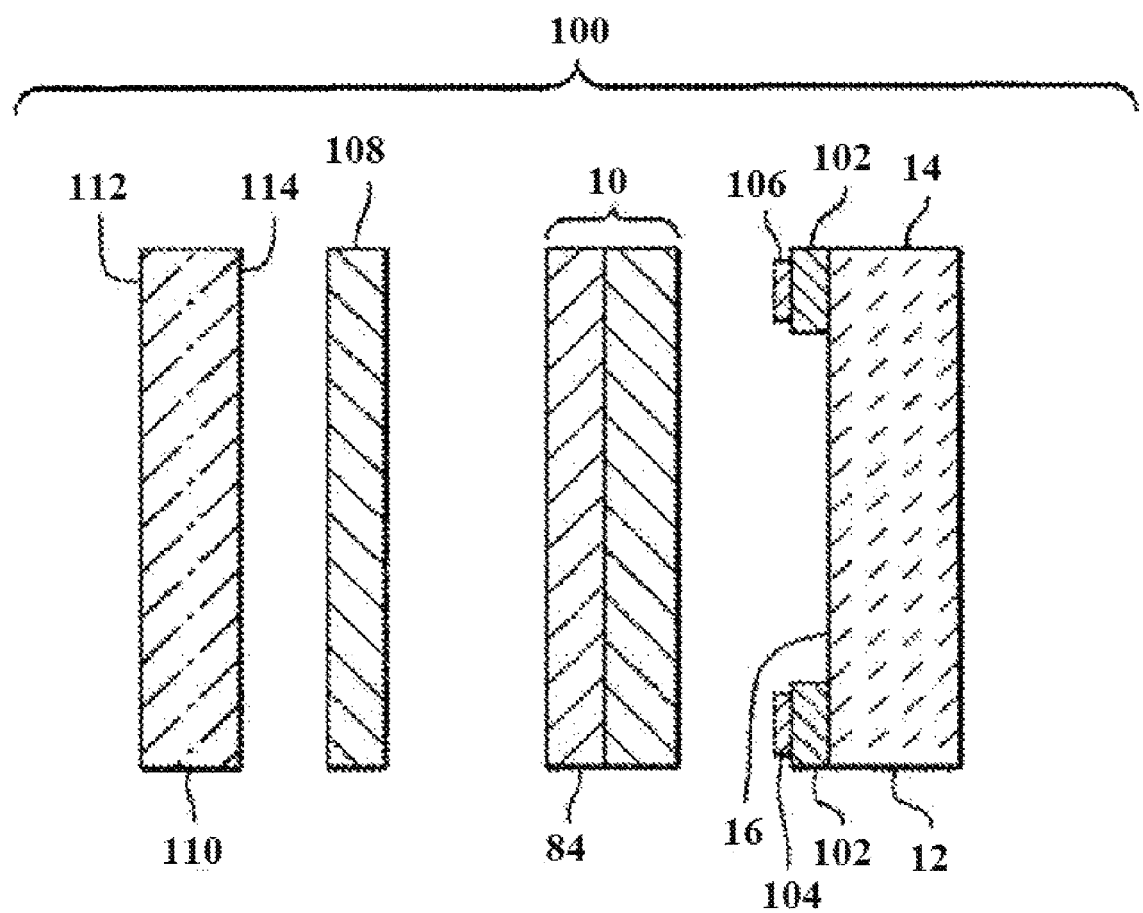
FIG. 11 is an expanded view (not to scale) of the windshield taken along the line II-II of FIG. 10.

A non-limiting heatable transparency 100 (e.g., automotive windshield) incorporating features of the invention is illustrated in FIGS. 10 and 11. The transparency 100 can have any desired visible light, infrared radiation, or ultraviolet radiation transmission and reflection. For example, the transparency 100 can have a visible light transmission of any desired amount, e.g., greater than 0% to 100%, e.g., greater than 70%. For windshield and front sidelight areas in the United States, the visible light transmission is typically greater than or equal to 70%. For privacy areas, such as rear seat sidelights and rear windows, the visible light transmission can be less than that for windshields, such as less than 70%.

As seen in FIG. 11, the transparency 100 includes a first ply or first substrate 12 with a first major surface facing the vehicle exterior, i.e., an outer major surface 14 (No. 1 surface) and an opposed second or inner major surface 16 (No. 2 surface). The transparency 100 also includes a second ply or second substrate 110 having an outer (first) major surface 112 (No. 4 surface) and an inner (second) major surface 114 (No. 3 surface). This numbering of the ply surfaces is in keeping with conventional practice in the automotive art. The first and second plies 12, 110 can be bonded together in any suitable manner, such as by a conventional interlayer 108. Although not required, a conventional edge sealant can be applied to the perimeter of the laminated transparency 100 during and/or after lamination in any desired manner. A decorative band, e.g., an opaque, translucent or colored shade band 102 (shown in FIG. 11), such as a ceramic band, can be provided on a surface of at least one of the plies 12, 110, for example around the perimeter of the inner major surface 16 of the first ply 12. A coating 10 is formed over at least a portion of one of the plies 12, 110, such as over the No. 2 surface 16 or No. 3 surface 114. A bus bar assembly 120 (FIG. 10) is in electrical contact with the coating 10. The bus bar assembly 120 is also connected to an electrical power source 122 (FIG. 10) and will be discussed in more detail below. In one non-limiting aspect of the invention, the power source 122 can be a conventional vehicle alternator, e.g., configured to supply approximately 14 volts. Thus, in the practice of one non-limiting embodiment of the invention, no DC to DC power converter is present. In one non-limiting embodiment, the power source 122 can be a 42 volt DC alternator or a DC to DC converter can be added to step-up the voltage from a 14 volt alternator to a sufficient level, e.g., 42 volts DC. In another embodiment, the power source 122 can be a 14 volt vehicle alternator.

In the broad practice of the invention, the plies 12, 110 of the transparency 100 can be of the same or different materials. The plies 12, 110 can include any desired material having any desired characteristics. For example, one or more of the plies 12, 110 can be transparent or translucent to visible light. By "transparent" is meant having visible light transmittance of greater than 0% to 100%. Alternatively, one or more of the plies 12, 110 can be translucent. By "translucent" is meant allowing electromagnetic energy (e.g., visible light) to pass through but diffusing this energy such that objects on the side opposite the viewer are not clearly visible. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); ceramic substrates; glass substrates; or mixtures or combinations of any of the above. For example, one or more of the plies 12, 110 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. The ribbon is then cut and/or shaped and/or heat treated as desired. Examples of float glass processes are disclosed in U.S. Pat. Nos. 4,466,562 and 4,671,155. The first and second plies 12, 110 can each be, for example, clear float glass or can be tinted or colored glass or one ply 12, 110 can be clear glass and the other ply 12, 110 colored glass. Although not limiting to the invention, examples of glass suitable for the first ply 12 and/or second ply 110 are described in U.S. Pat. Nos. 4,746,347; 4,792,536; 5,030,593; 5,030,594; 5,240,886; 5,385,872; and 5,393,593. The first and second plies 12, 110 can be of any desired dimensions, e.g., length, width, shape, or thickness. In one exemplary automotive transparency, the first and second plies can each be 1 mm to 10 mm thick, e.g., 1 mm to 5 mm thick, or 1.5 mm to 2.5 mm, or 1.8 mm to 2.3 mm. In one non-limiting embodiment, the first ply 12 and/or second ply 110 can have a visible light transmittance of greater than 90%, such as greater than 91%, at a reference wavelength of 550 nm. The glass composition for the first ply 12 and/or second ply 110 can have a total iron content in the range of greater than 0 wt. % to 0.2 wt. % and/or a redox ratio in the range of 0.3 to 0.6.

In one non-limiting embodiment, one or both of the plies 12, 110 may have a high visible light transmittance at a reference wavelength of 550 nanometers (nm). By "high visible light transmittance" is meant visible light transmittance at 550 nm greater than or equal to 85%, such as greater than or equal to 87%, such as greater than or equal to 90%, such as greater than or equal to 91%, such as greater than or equal to 92%, at 5.5 mm equivalent thickness for glass from 2 mm to 25 mm sheet thickness. Particularly useful glass for the practice of the invention is disclosed in U.S. Pat. Nos. 5,030,593 and 5,030,594.

The interlayer 108 can be of any desired material and can include one or more layers or plies. The interlayer 108 can be a polymeric or plastic material, such as, for example, polyvinylbutyral, plasticized polyvinyl chloride, or multi-layered thermoplastic materials including polyethyleneterephthalate, etc. Suitable interlayer materials are disclosed, for example but not to be considered as limiting, in U.S. Pat. Nos. 4,287,107 and 3,762,988. The interlayer 108 secures the first and second plies 12, 110 together, provides energy absorption, reduces noise, and increases the strength of the laminated structure. The interlayer 108 can also be a sound absorbing or attenuating material as described, for example, in U.S. Pat. No. 5,796,055. The interlayer 108 can have a solar control coating provided thereon or incorporated therein or can include a colored material to reduce solar energy transmission.

In the non-limiting embodiment illustrated in FIGS. 10 and 11, the bus bar assembly 120 includes a first or bottom bus bar 104 and a second or top bus bar 106 formed on the inner surface 16 of the outer ply 12 and separated by a bus bar to bus bar distance D. The bus bars 104, 106 are in electrical contact with the coating 10. The bus bar assembly 120 also includes a first conductive lead or strip 116 connected to the first bus bar 104 and a second conductive lead or strip 118 connected to the second bus bar 106. Each of the leads 116, 118 is connected to the power source 122. The bus bars 104, 106 and/or the conductive strips 116, 118 can be formed of conductive metal foil or strips (such as but not limited to copper foil or tinned copper foil), or can be formed by conductive coatings (such as ceramic coatings), or combinations thereof. In one non-limiting embodiment of the invention, bus bars 104 and 106 can be positioned at least partially on, or completely on, the decorative band 102 (as shown in FIG. 11).

The power source 122 can be any conventional power source. However, in one non-limiting embodiment, the power source 122 may be a conventional vehicle alternator configured to supply in the range of 13 volts to 15 volts, e.g., approximately 14 volts.

Figure 12:
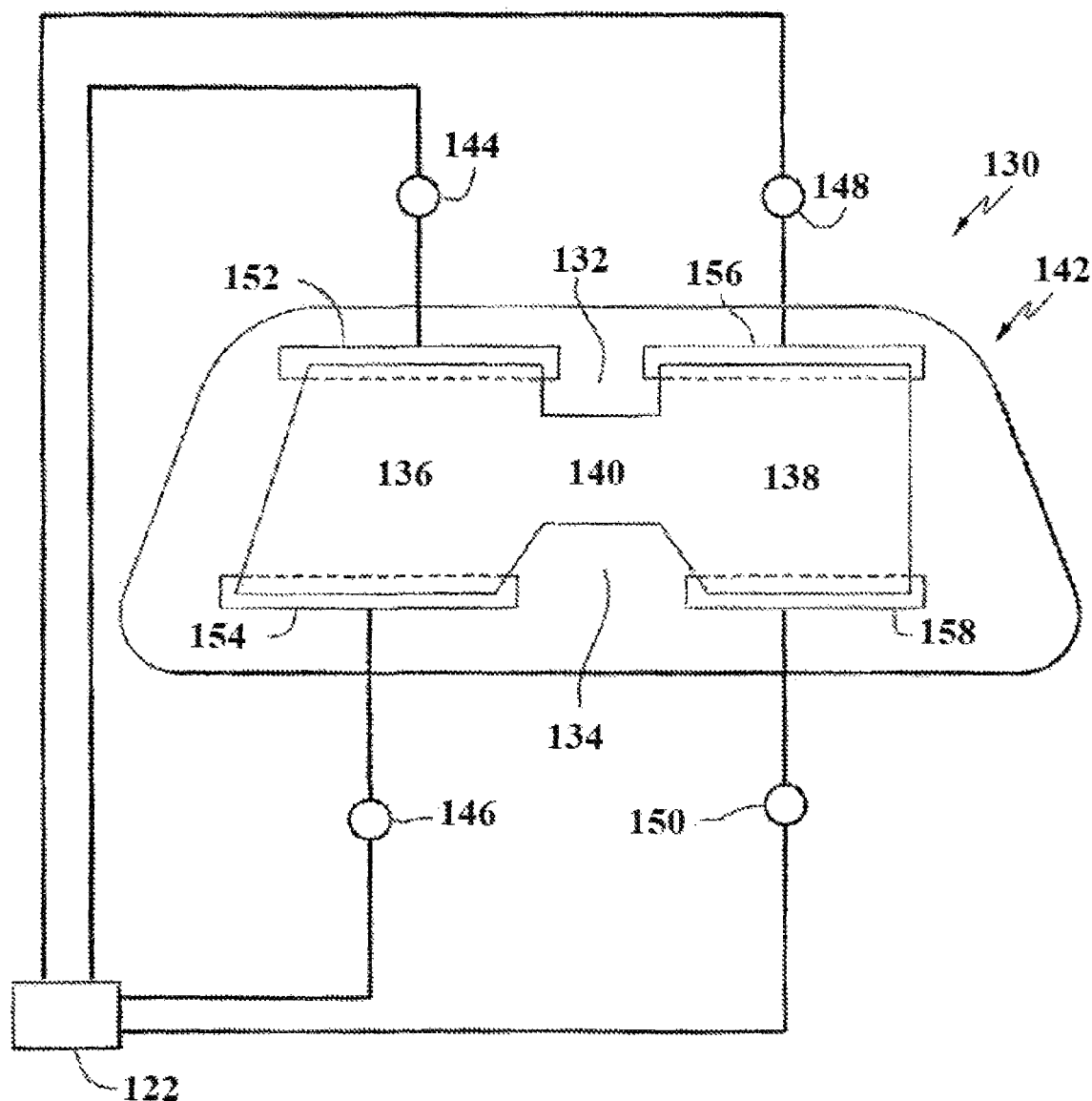
FIG. 12 is a schematic view (not to scale) of another windshield incorporating features of the invention.

A further transparency 130 incorporating features of the present invention is shown in FIG. 12. The construction of transparency 130 is similar to the transparency 100 but the coating 10 includes one or more "cut-out" areas, such as cut-outs 132 and 134. The cut outs 132 and 134 divide the coating 10 into a first major portion 136, a second major portion 138, and a central portion 140. The bus bar assembly 142 in this non-limiting embodiment is a quad-feed assembly, i.e., has four connectors 144, 146, 148, and 150 connected to four bus bars 152, 154, 156, and 158, respectively. Bus bars 152 and 154 provide power primarily to the first major portion 136 and bus bars 156 and 158 provide power primarily to the second major region 138.

In one non-limiting embodiment of the invention, the coating 10 is configured or dimensioned to provide a power density of 2 to 10 watts per decimeter (W/dm$^2$) at a bus bar to bus bar distance D (see FIG. 10) in the range of 24 inches to 30 inches (60 cm to 75 cm), such as 4 to 8 W/dm$^2$, such as 5 to 6 W/dm$^2$, when the coating is in electrical contact with a conventional vehicle alternator, such as a conventional alternator producing 80 amps and 14 volts. It is believed that such a power density is sufficient to melt ice found in contact with outer surface 14 of the substrate 12. For vision panels (such as a windshield) in the United States, the transparency should also have a visible light transmittance of greater than or equal to 70%, such as greater than or equal to 71%. As will be appreciated by one skilled in the art, several different competing factors need to be balanced to provide a coating having sufficient conductivity and also sufficient transmittance. For example, as the distance D between the bus bars increases (i.e., the transparency becomes wider from top to bottom), the bus bar to bus bar resistance increases. As the bus bar to bus bar resistance increases, the power density decreases. In order to maintain the power density as the bus bar to bus bar distance is increased, the resistivity of the coating must decrease. One way of decreasing the resistivity is by increasing the thickness of one or more of the silver layers and/or by increasing the number of silver layers. In one non-limiting practice of the invention, the thickness and/or number of silver layers is configured to give a total resistivity for the coating of 0.6 to 1.5 ohms per square ($\Omega/\square$), such as 0.6 to 1.0 ohms per square ($\Omega/\square$), such as 0.6 to 0.9 ohms per square ($\Omega/\square$). In one non-limiting practice of the invention, the thickness and/or number of silver layers is configured to give a total resistivity for the coating not more than 0.850 ohms per square ($\Omega/\square$), such as not more than 0.800 ohms per square ($\Omega/\square$), such as no more than 0.700 ohms per square ($\Omega/\square$), such as not more than 0.695 ohms per square ($\Omega/\square$). However, as will also be appreciated by one skilled in the art, as the number or thickness of the silver layers increases, the visible light transmittance decreases. For forward vision areas of a vehicle, such as a windshield, the thickness and/or number of silver layers should not be increased to the point where visible light transmittance of the vision area falls below about 70%.

In one non-limiting practice of the invention, the coating provides a visible light reflectance of not more than 25%. For example, not more than 20%, such as not more than 10%, such as not more than 8%.

In one non-limiting practice of the invention, the coating 10 provides an exterior reflected a* at an 8 degree angle (Rg8a*) in the range of 0 to −10. For example, in the range of −1 to −8, preferably −1.2 to −7.0, more preferably −1.5 to −6.8, most preferably −1.7 to −6.5.

In one non-limiting practice of the invention, the coating 10 provides an exterior reflected b* at an 8 degree angle (Rg8b*) in the range of 2 to −8. For example, in the range of 2.5 to −8.0, preferably 2.0 to −7.5, more preferably 1.8 to −7.3, most preferably 1.5 to −7.0.

An embodiment of the invention is a vehicle transparency that has only three metal layers that are sandwiched between dielectric layers. Each metal layer has a thickness. The combined thickness of all three metal layers is between 30 nm and 65 nm; preferably between 32 nm and 52 nm; more preferably between 34 nm and 50 nm; most preferably between 35 nm and 48 nm. This vehicle transparency can have the coating according as shown in Table 1.

TABLE 1

| Layer | Exemplary Material | Thickness (nm unless otherwise indicated) |
|---|---|---|
| Substrate | Glass | 1 mm-10 mm; preferably 1 mm-5 mm; more preferably 1.5 mm-2.5 mm; most preferably 1.8 mm-2.3 mm |
| 1st Dielectric Layer | 1st film: AlZnO, GaZnO, InZno, InSnO, and/or VZnO; 2nd film: $Zn_2SnO_4$ | 30-60; preferably 40-55; more preferably 45-50; most preferably 46.5-48 |
| 1st Seed Film | VZnO, AlZnO, GaZnO, InZnO, SnInO, Ag, and/or Al doped Ag | |
| 1st Metallic Layer | Ag and/or Al doped Ag | 5-20; preferably 7.5-17.5; more preferably 10-15; most preferably 11-14 |
| 1st Primer Layer | Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| 2nd Dielectric Layer | 1st film: AlZnO, GaZnO, InZnO, InSnO, and/or VZnO; 2nd film: $Zn_2SnO_4$; 3rd film: AlZnO, GaZnO, InZnO, InSnO, and/or VZnO | 40-110; preferably 50-100; more preferably 60-90; most preferably 72-80 |
| 2nd Seed Film | VZnO, AlZnO, GaZnO, InZnO, SnInO, Ag, and/or Al doped Ag | |
| 2nd Metallic Layer | Ag and/or Al doped Ag | 5-20; preferably 7.5-17.5; more preferably 10-15; most preferably 12.5-14.5 |
| 2nd Primer Layer | Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| 3rd Dielectric Layer | 1st film: AlZnO, GaZnO, InZnO, InSnO, and/or VZnO; 2nd film: $Zn_2SnO_4$; 3rd film: AlZnO, GaZnO, InZnO, InSnO, and/or VZnO | 40-110; preferably 50-100; more preferably 60-90; most preferably 70-82.5 |
| 3rd Seed Film | VZnO, AlZnO, GaZnO, InZnO, SnInO, Ag, and/or Al doped Ag | |
| 3rd Metallic Layer | Ag and/or Al doped Ag | 5-20; preferably 7.5-17.5; more preferably 10-15; most preferably 11-14.5 |
| 3rd Primer Layer | Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| 4th Dielectric Layer | 1st film: AlZnO, GaZnO, InZnO, InSnO, and/or VZnO; 2nd film: $Zn_2SnO_4$; 3rd film: AlZnO, GaZnO, InZnO, InSnO, and/or VZnO | 25-60; preferably 30-50; more preferably 32.5-45; most preferably 35-40 |
| Optional Stress Layer | TiNb sub-oxide or oxide, NbZr sub-oxide or oxide, TiTa sub-oxide or oxide, and/or SiCo sub-oxide or oxide | 0.5-30; preferably 1-25; more preferably 10-60; most preferably 1-18 |
| Optional Protective Coat | SiAlN or SiAlON | 1-80; preferably 10-80; more preferably 10-60; most preferably 35-55 |

TABLE 1-continued

| Layer | Exemplary Material | Thickness (nm unless otherwise indicated) |
|---|---|---|
| Total Metal Layer Thickness (1$^{st}$, 2$^{nd}$, and 3$^{rd}$ metallic layer) | Ag and/or Al doped Ag | 30-65; preferably 32-52; more preferably 34-50; most preferably 35-48 |

An embodiment of the invention is a vehicle transparency that has only four metal layers that are sandwiched between dielectric layers. Each metal layer has a thickness. The combined thickness of all four metal layers is between 30 nm and 65 nm; preferably between 35 nm and 55 nm; more preferably between 39 nm and 53 nm; most preferably between 40 nm and 52 nm. This vehicle transparency can have the coating according as shown in Table 2.

TABLE 2

| Layer | Exemplary Material | Thickness (nm unless otherwise indicated) |
|---|---|---|
| Substrate | Glass | 1 mm-10 mm; preferably 1 mm-5 mm; more preferably 1.5 mm-2.5 mm; most preferably 1.8 mm-2.3 mm |
| 1$^{st}$ Dielectric Layer | 1$^{st}$ film: AlZnO, GaZnO, InZnO, InSnO, and/or VZnO; 2$^{nd}$ film: Zn$_2$SnO$_4$ | 30-60; preferably 40-55; more preferably 40-50; most preferably 42-47 |
| 1$^{st}$ Seed Film | VZnO, AlZnO, GaZnO, InZnO, SnInO, Ag, and/or Al doped Ag | |
| 1$^{st}$ Metallic Layer | Ag and/or Al doped Ag | 5-20; preferably 7.5-17.5; more preferably 8-15; most preferably 9-11 |
| 1$^{st}$ Primer Layer | Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| 2$^{nd}$ Dielectric Layer | 1$^{st}$ film: AlZnO, GaZnO, InZnO, InSnO, and/or VZnO; 2$^{nd}$ film: Zn$_2$SnO$_4$; 3$^{rd}$ film: AlZnO, GaZnO, InZnO, InSnO, and/or VZnO | 40-110; preferably 50-100; more preferably 60-90; most preferably 78-85 |
| 2$^{nd}$ Seed Film | VZnO, AlZnO, GaZnO, InZnO, SnInO, Ag, and/or Al doped Ag | |
| 2$^{nd}$ Metallic Layer | Ag and/or Al doped Ag | 5-20; preferably 7.5-17.5; more preferably 10-15; most preferably 11-13.5 |
| 2$^{nd}$ Primer Layer | Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| 3$^{rd}$ Dielectric Layer | 1$^{st}$ film: AlZnO, GaZnO, InZnO, InSnO, and/or VZnO; 2$^{nd}$ film: Zn$_2$SnO$_4$; 3$^{rd}$ film: AlZnO, GaZnO, InZnO, InSnO, and/or VZnO | 40-110; preferably 50-100; more preferably 60-90; most preferably 70-82.5 |
| 3$^{rd}$ Seed Film | VZnO, AlZnO, GaZnO, InZnO, SnInO, Ag, and/or Al doped Ag | |
| 3$^{rd}$ Metallic Layer | Ag and/or Al doped Ag | 5-20; preferably 7.5-17.5; more preferably 10-15; most preferably 11-13.5 |
| 3$^{rd}$ Primer Layer | Zn, AgZn, AgZnO, AlZnO, InZnO, GaZnO, and/or VZnO | 0.5-5; preferably 1-2.5; more preferably 1.5-2.5 |
| 4$^{th}$ Dielectric Layer | 1$^{st}$ film: AlZnO, GaZnO, InZnO, InSnO, and/or VZnO; 2$^{nd}$ film: Zn$_2$SnO$_4$; 3$^{rd}$ film: AlZnO, GaZnO, InZnO, InSnO, and/or VZnO | 40-110; preferably 50-100; more preferably 60-90; most preferably 67.5-75 |
| 4$^{th}$ Seed Film | VZnO, AlZnO, GaZnO, InZnO, SnInO, Ag, and/or Al doped Ag | |

TABLE 2-continued

| Layer | Exemplary Material | Thickness (nm unless otherwise indicated) |
|---|---|---|
| 4$^{th}$ Metallic Layer | Ag and/or Al doped Ag | 5-20; preferably 7-17; more preferably 8-12; most preferably 9-11 |
| 4$^{th}$ Primer Layer | Zn, AgZn, AgZnO, AlZnO, InZnO, GaZnO, AlTiO, AlNbO, AlNbN, WTiO, TiTaO, TiNbO, TiNbN, NbZrO, TaWO, WNbO, WNbN, ZnTiO, and/or VZnO | 0.5-5; preferably 1-2.5; more preferably 1.5-2.5 |
| 5$^{th}$ Dielectric Layer | 1$^{st}$ film: AlZnO, GaZnO, InZnO, InSnO, and/or VZnO; 2$^{nd}$ film: Zn$_2$SnO$_4$ 3$^{rd}$ film: AlZnO, GaZnO, InZnO, InSnO, and/or VZnO | 20-70; preferably 30-60; more preferably 35-55; most preferably 42.5-47.5 |
| Optional Stress Layer | TiNb sub-oxide or oxide, NbZr sub-oxide or oxide, TiTa sub-oxide or oxide, and/or SiCo sub-oxide or oxide | 0.5-30; preferably 1-25; more preferably 10-60; most preferably 1-18 |
| Optional Protective Coat | SiAlN or SiAlON | 1-80; preferably 10-80; more preferably 10-60; most preferably 35-45 |
| Total Metal Layer Thickness | Ag and/or Al doped Ag | 30-65; preferably 35-55; more preferably 39-53; most preferably 40-52 |

Figure 13:
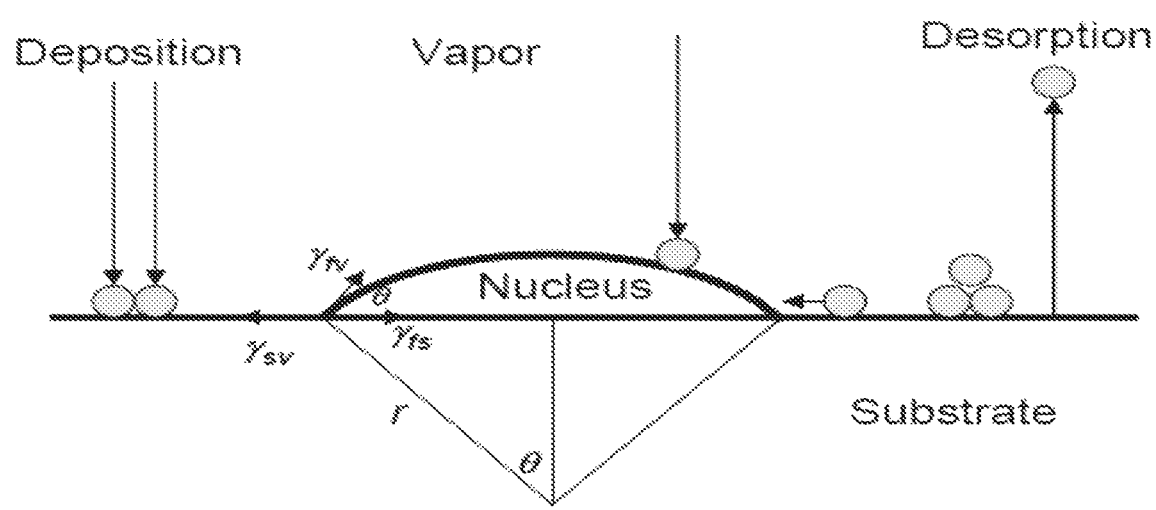
FIG. 13 is an illustration showing the initial nucleation of film growth on a surface.

FIG. 13 shows an illustration of the initial nucleation of film growth on a surface. Formation of a nucleus leads to a change in the Gibbs free-energy of the system, including volume and surface Gibbs free-energy. In order to grow a 2D layer, the growth surface needs to have high surface energy (i.e., high surface tension) for two-dimensional growth and the change in Gibbs free-energy needs to be large enough to create a denser film. Therefore, the materials on which the silver is grown (i.e., seed film) and the materials under which the silver is covered (i.e., primer layers) need to have high Gibbs free-energy in order to favor dense, two-dimensional silver growth and to avoid silver agglomeration. Some of the elements that have high cohesive energy and high Gibbs free-energy compared to silver are shown below in Table 3. These elements are some of the materials that have the potential to decrease silver agglomeration when used as either a seed film or a primer layer.

TABLE 3

| Metal | Cohesive Energy (kJ/mol) at 293K | Max. metal Solubility in Ag (at %) | Gibbs Free Energy of metal oxide at 293K |
|---|---|---|---|
| Ag | 284 | — | −5.6 (Ag$_2$O) |
| Ti | 468 | 5 | −939.7 (TiO$_2$) |
| Nb | 730 | 0 | −883.1 (Nb$_2$O$_5$) |
| W | 859 | 0 | −764 (WO$_3$) |
| Zr | 603 | — | −1039.8 (ZrO$_2$) |
| Ni | 428 | 0.3 | −211.7 (NiO) |
| Cr | 395 | — | −1053 (Cr$_2$O$_3$) |

This invention also includes the method of creating these various embodiments of coated articles. This includes providing a substrate; apply a coating over the substrate; wherein the coating comprises a first dielectric layer applied over at least a portion of the substrate, an optional first seed film applied over at least a portion of the first dielectric layer, a first metallic layer applied over at least a portion of the first dielectric layer or optional first seed film, a first primer layer applied over at least a portion of the first metallic layer, and a second dielectric layer applied over at least a portion of the first primer layer. The coating provided in the above method may also optional comprise a second seed film applied over at least a portion of the second dielectric layer, a second metallic layer applied over at least a portion of the second dielectric layer or second seed film, a second primer layer applied over at least a portion of the second metallic layer, a third dielectric layer applied over at least a portion of the second primer layer, a third seed film applied over at least a portion of the third dielectric layer, a third metallic layer applied over at least a portion of the third dielectric layer or third seed film, a third primer layer applied over at least a portion of the third metallic layer, a fourth dielectric layer applied over at least a portion of the third primer layer, a fourth seed film applied over at least a portion of the fourth dielectric layer, a fourth metallic layer applied over at least a portion of the fourth dielectric layer or fourth seed film, a fourth primer layer applied over at least a portion of the fourth metallic layer, and/or a fifth dielectric layer applied over at least a portion of the fourth primer layer. The coating of the above method may optionally also comprise a protective layer over at least a portion of the topmost dielectric layer and/or a stress layer applied over at least a portion of the topmost dielectric layer and between the topmost dielectric layer and the protective layer.

This invention also includes the method of creating these various embodiments of coated articles. This includes providing a substrate; apply a coating over the substrate; heating the substrate comprising the coating; and bending the substrate comprising the coating into a desired shape; wherein the coating comprises a first dielectric layer applied over at least a portion of the substrate, an optional first seed film applied over at least a portion of the first dielectric layer, a first metallic layer applied over at least a portion of the first dielectric layer or optional first seed film, a first primer layer applied over at least a portion of the first metallic layer, and a second dielectric layer applied over at least a portion of the first primer layer. The coating provided in the above method may also optional comprise a second seed film applied over at least a portion of the second dielectric layer, a second metallic layer applied over at least a portion of the second dielectric layer or second seed film, a second primer layer applied over at least a portion of the second metallic layer, a third dielectric layer applied over at least a portion of the second primer layer, a third seed film applied over at least a portion of the third dielectric layer, a third metallic layer applied over at least a portion of the third dielectric layer or third seed film, a third primer layer applied over at least a portion of the third metallic layer, a fourth dielectric layer applied over at least a portion of the third primer layer, a fourth seed film applied over at least a portion of the fourth dielectric layer, a fourth metallic layer applied over at least a portion of the fourth dielectric layer or fourth seed film, a fourth primer layer applied over at least a portion of the fourth metallic layer, and/or a fifth dielectric layer applied over at least a portion of the fourth primer layer. The coating of the above method may optionally also comprise a protective layer over at least a portion of the topmost dielectric layer and/or a stress layer applied over at least a portion of the topmost dielectric layer and between the topmost dielectric layer and the protective layer.

EXAMPLES

As mentioned previously, the sheet resistance of the coating can be reduced by using new materials for individual layers. It is expected that the sheet resistance will also decrease with the addition of new layers all together. In Table 4, $Ti_{78}Nb_{22}$ was integrated into the stack as a replacement for the Ti primer layer. Ag with oxygen deposition was also included as a seed film under the silver metallic layer. The substrate is a clear glass substrate. ZT stands for zinc tin, also known as zinc stannate. Zn 90 is tin-doped zinc oxide deposited from a cathode with 10 wt. % tin and 90 wt. % zinc in the presence of oxygen (i.e., ZnO 90/10). Ag means silver. PPO is the protective layer or coating discussed above. Before integrating these layers, each layer had been optimized to get lowest sheet resistance. In following tables list the best samples at different combinations.

TABLE 4

$AgO_x$ seed layer and $Ti_{78}Nb_{22}$ metal primer

| Sample | Structure | Sheet Resistance AH ($\Omega/\square$) |
|---|---|---|
| baseline, Ti primer | glass/ZT/Zn90/Ag/Ti/Zn90/ZT/ppo | 5.32 |
| $Ti_{78}Nb_{22}$ primer | glass/ZT/Zn90/Ag/$Ti_{78}Nb_{22}$/Zn90/ZT/ppo | 3.87 |
| Baseline with $AgO_x$ inserted | glass/ZT/Zn90/$AgO_x$/Ag/Ti/Zn90/ZT/ppo | 4.52 |
| both $AgO_x$ seed and primer | glass/ZT/Zn90/$AgO_x$/Ag/$Ti_{78}Nb_{22}$/Zn90/ZT/ppo | 3.25 |

Additional coating stacks were also test that inserted $Ti_{78}Nb_{22}O_x$ under the protective layer as the stress layer discussed previously. Three total layers changed from the baseline to the final coating stack. Values for its sheet resistance can be seen in Table 5.

TABLE 5

$AgO_x$ seed layer, $Ti_{78}Nb_{22}$ metal primer and $Ti_{78}Nb_{22}O_x$ under ppo

| Sample | Structure | Sheet Resistance AH ($\Omega/\square$) |
|---|---|---|
| baseline, Ti primer | glass/ZT/Zn90/Ag/Ti/Zn90/ZT/ppo | 4.65 |
| $Ti_{78}Nb_{22}$ primer, $Ti_{78}Nb_{22}O_x$ inserted | glass/ZT/Zn90/Ag/$Ti_{78}Nb_{22}$/Zn90/ZT/$Ti_{78}Nb_{22}O_x$/ppo | 4.12 |
| $AgO_x$, $Ti_{78}Nb_{22}$ primer, $Ti_{78}Nb_{22}O_x$ under ppo | glass/ZT/Zn90/$AgO_x$/Ag/$Ti_{78}Nb_{22}$/Zn90/ZT/$Ti_{78}Nb_{22}O_x$/ppo | 3.07 |

Table 6 replaces the Ti primer layer or the $Ti_{78}Nb_{22}$ primer layer with $Ti_3Nb_{97}N_x$ or titanium niobium nitride.

TABLE 6

| Sample | Structure | Rs, AH ($\Omega/\square$) | $\Delta Rs/Rs$ (%) |
|---|---|---|---|
| baseline, Ti primer | single silver (glass/ZT/Zn90/Ag/Ti/Zn90/ZT/ppo) | 4.97 | |
| $Ti_3Nb_{97}$ nitride primer | single silver (glass/ZT/Zn90/Ag/$Ti_3Nb_{97}N_x$/Zn90/ZT/ppo) | 3.71 | −25.3 |
| $Ti_3Nb_{97}$ oxide under ppo | single silver (glass/ZT/Zn90/Ag/Ti/Zn90/ZT/$Ti_3Nb_{97}O_x$/ppo) | 4.18 | −15.8 |
| $AgO_x$ + $Ti_3Nb_{97}$ nitride primer | single silver (glass/ZT/Zn90/$AgO_x$/Ag/$Ti_3Nb_{97}N_x$/Zn90/ZT/ppo) | 3.34 | −32.7 |

Table 7 shows coating stack experiments with aluminum zinc primer and aluminum zinc oxide above and below the silver layer as part of the dielectric layer. Sheet resistance is decreased from 3.75 to 3.21 $\Omega/\square$ for single silver stack.

TABLE 7

| Primer (nm) | bottom AZO (nm) | Ag (nm) | top AZO (nm) | Rs (BH) | Rs (AH) |
|---|---|---|---|---|---|
| Baseline | — | 11.20 | — | 7.24 | 3.75 |
| 4.1 | — | 11.20 | — | 7.08 | 3.32 |
| 6.1 | 5 | 11.20 | 5 | 7.87 | 3.21 |

Table 8 shows coating stack experiments with aluminum zinc primer and aluminum zinc oxide above and below the silver layer. Sheet resistance is decreased from 1 to 0.73 $\Omega/\square$ for triple silver stack with AZ primers and Ag oxygen deposition seed film between Ag and $Zn_{90}Sn_{10}O$.

TABLE 8

| Structure | Rs (BH) ($\Omega/\square$) | Rs (AH) ($\Omega/\square$) | Haze level | LTA (laminated) |
|---|---|---|---|---|
| Baseline | 1.44 | 1.00 | 10 | 68.74 |
| AZ primers | 1.58 | 0.81 | 10 | 75.60 |
| AZ primers, 0.5 nm $AgO_x$ seed under each silver layer | 1.65 | 0.78 | 8 | 70.53 |
| AZ primers, 1.0 nm $AgO_x$ seed under each silver layer | 1.48 | 0.74 | 8 | 70.31 |
| AZ primers, 1.5 nm $AgO_x$ seed under each silver layer | 1.58 | 0.73 | 7 | 70.17 |

The addition of a stress layer under the protective layer may result in further decrease in sheet resistance of the coating stack. Various additional materials were tested for use as the stress layer. Some of those materials are shown in Table 9 and show the decrease in sheet resistance of the inclusion of these materials as the stress layer.

TABLE 9

| Stress Layer | Thickness (nm) | % O$_2$ | Rs/Rs AH (Max %) |
|---|---|---|---|
| TiNbO$_x$ (suboxide) | 14 on Ti side | 20 | −27% |
| ZrNbO$_x$ (suboxide) | 5 on Nb side | 10 | −23% |
| TaTiO$_x$ (suboxide) | 5 on Nb side | 10 | −21% |

Experiments were conducted in which the films of the dielectric layers that surround the metallic layers are replaced with VZnO (vanadium zinc oxide). The top film of the dielectric layer directly below the metallic layer was replaced and the bottom film of the dielectric layer directly above the metallic layer was replaced. These were paired with both Ti primer layers and zinc metal primer layers. The results of these experiments are shown in Table 10 below.

TABLE 10

| | Primer | wt % (V) | Bottom dielectric layer | Top dielectric layer | Rs (Ω/□) | LTA (%) |
|---|---|---|---|---|---|---|
| Baseline | Ti | 0 | Zn90 | Zn90 | 5.67 | 83.4 |
| ZnO | Ti | 0 | ZnO | ZnO | 4.58 | 82.7 |
| VZnO | Ti | 0.45 | VZnO | VZnO | 4.52 | 83 |
| Zn90 | Zn | 0 | Zn90 | Zn90 | 3.62 | 86.5 |
| ZnO | Zn | 0 | ZnO | ZnO | 3.12 | 82.4 |
| VZnO | Zn | 0.45 | VZnO | VZnO | 3.14 | 89.1 |

Clause 1. A coated article comprising: a substrate; a first dielectric layer over at least a portion of the substrate; a first metallic layer over at least a portion of the first dielectric layer; a first primer layer over at least a portion of the first metallic layer; and a second dielectric layer over at least a portion of the first primer layer; wherein the primer layer is selected from the group consisting of zinc, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, combinations thereof, mixtures thereof, or alloys thereof.

Clause 2. The article according to clause 1, wherein at least a portion of the primer layer is an oxide or a nitride.

Clause 3. The article according to any of clauses 1-2, comprising a seed film adjacent to and in direct contact with the first metallic layer and in between the first dielectric layer and the first metallic layer.

Clause 4. The article according to any of clauses 1-3, wherein the primer layer is selected from the group consisting of silver zinc, zinc, silver zinc oxide, aluminum zinc oxide, indium zinc oxide, gallium zinc oxide, vanadium zinc oxide, mixtures thereof, combinations thereof, or alloys thereof.

Clause 5. The article according to any of clauses 1-4, wherein the primer layer is a metal, oxide, nitride, sub-oxide, sub-nitride, oxynitride, and/or sub-oxynitride.

Clause 6. The article according to any of clause 3-5, wherein the seed film is comprised of aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof.

Clause 7. The article according to any of clauses 3-6, wherein the seed film comprises aluminum zinc, vanadium zinc, zinc, or silver zinc.

Clause 8. The article according to any of clause 7, wherein the seed film is a metal, oxide, or sub-oxide.

Clause 9. The article according to any of clause 3-6, wherein the seed film comprises gallium zinc, indium zinc, or indium tin.

Clause 10. The article according to any of clause 9, wherein the seed film is a metal, oxide, nitride, sub-oxide, or sub-nitride.

Clause 11. The article according to any of clauses 1-10, further comprising: a second metallic layer over at least a portion of the second dielectric layer; a second primer layer over at least a portion of the second metallic layer; and a third dielectric layer over at least a portion of the second primer layer.

Clause 12. The article according to clause 11, further comprising: a third metallic layer over at least a portion of the third dielectric layer; a third primer layer over at least a portion of the third metallic layer; and a fourth dielectric layer over at least a portion of the third primer layer.

Clause 13. The article according to clause 12, further comprising: a fourth metallic layer over at least a portion of the fourth dielectric layer; a fourth primer layer over at least a portion of the fourth metallic layer; and a fifth dielectric layer over at least a portion of the fourth primer layer.

Clause 14. The article according to any of clauses 1-13, wherein the metallic layer or layers comprise silver or aluminum doped silver.

Clause 15. The article according to any of clauses 1-14, wherein the first dielectric layer comprises a zinc stannate film, and a second film comprising at least one of zinc oxide, aluminum zinc oxide, indium zinc oxide, gallium zinc oxide, indium tin oxide, or vanadium zinc oxide over at least a portion of the zinc stannate film.

Clause 16. The article according to any of clauses 1-15, wherein the first dielectric layer comprises a zinc stannate film, and a second film comprising at least one of aluminum zinc oxides, indium zinc oxide, gallium zinc oxide, indium tin oxide, or vanadium zinc oxide over at least a portion of the zinc stannate film.

Clause 17. The article according to any of clauses 11-16, wherein the second dielectric layer and the third dielectric layer comprise a first film comprising zinc oxide, aluminum zinc oxide, gallium zinc oxide, indium zinc oxide, indium tin oxide, or vanadium zinc oxide, a second film comprising zinc stannate over at least a portion of the first film, and a third film comprising at least one of zinc oxide, aluminum zinc oxide, gallium zinc oxide, indium zinc oxide, indium tin oxide, or vanadium zinc oxide over at least a portion of the second film.

Clause 18. The article according to any of clauses 11-16, wherein the second dielectric layer and the third dielectric layer comprise a first film comprising aluminum zinc oxide, gallium zinc oxide, indium zinc oxide, indium tin oxide, or vanadium zinc oxide, a second film comprising zinc stannate over at least a portion of the first film, and a third film comprising at least one of aluminum zinc oxide, gallium zinc oxide, indium zinc oxide, indium tin oxide, or vanadium zinc oxide over at least a portion of the second film.

Clause 19. The article according to any of clauses 12-18, wherein the fourth dielectric layer comprises a first film comprising at least one of zinc oxide, aluminum zinc oxide, gallium zinc oxide, indium zinc oxide, indium tin oxide, or vanadium zinc oxide, and a zinc stannate film over at least a portion of the first film.

Clause 20. The article according to any of clauses 12-19, wherein the fourth dielectric layer comprises a first film comprising at least one of aluminum zinc oxide, gallium zinc oxide, indium zinc oxide, indium tin oxide, or vanadium zinc oxide, and a zinc stannate film over at least a portion of the first film.

Clause 21. The article according to any of clauses 1-20, wherein the first dielectric layer or the second dielectric layer comprises a silicon nitride film.

Clause 22. The article according to any of clauses 1-21, further comprising an outermost protective layer comprising SiAlN, SiON, SiAlON, titania, alumina, silica, zirconia, alloys thereof, or mixtures thereof.

Clause 23. The article according to clause 22, further comprising a stress layer underneath the outermost protective layer.

Clause 24. The article according to clause 23, wherein the stress layer comprises silicon cobalt, titanium niobium, zirconium niobium, tantalum titanium, oxides thereof, or sub-oxides thereof.

Clause 25. The article according to any of clauses 1-24, wherein the primer layer comprises $Al_xZn_{1-x}$; wherein x is within the range of greater than 0-30 wt %.

Clause 26. The article according to any of clauses 1-24, wherein the primer layer comprises $Ga_xZn_{1-x}$; wherein x is within the range of greater than 0-20 wt %.

Clause 27. The article according to any of clauses 1-24, wherein the primer layer comprises $In_xZn_{1-x}$; wherein x is within the range of greater than 0-40 wt %.

Clause 28. The article according to any of clauses 1-24, wherein the primer layer comprises $V_xZn_{1-x}$; wherein x is within the range of greater than 0-20 wt %.

Clause 29. The article according to any of clauses 1-24, wherein the primer layer comprises $Ag_xZn_{1-x}$; wherein x is within the range of greater than 0-50 wt %.

Clause 30. The article according to any of clauses 1-24, wherein the primer layer comprises $Al_xTi_{1-x}$; wherein x is within the range of 2-75 wt % before heating.

Clause 31. The article according to any of clauses 1-24, wherein the primer layer comprises $Al_xTi_{1-x}$; wherein x is within the range of 1-100 wt % after heating.

Clause 32. The article according to any of clauses 1-24, wherein the primer layer comprises $Al_xNb_{1-x}$; wherein x is within the range of 2-40 wt % before heating.

Clause 33. The article according to any of clauses 1-24, wherein the primer layer comprises, $Al_xNb_{1-x}$; wherein x is within the range of 2-95 wt % after heating.

Clause 34. The article according to any of clauses 1-24, wherein the primer layer comprises $W_xTi_{1-x}$; wherein x is within the range of 55-100 wt % before heating with 7% $O_2$ during deposition.

Clause 35. The article according to any of clauses 1-24, wherein the primer layer comprises $W_xTi_{1-x}$; wherein x is within the range of 30-95 wt % after heating with 3% $O_2$ during deposition.

Clause 36. The article according to any of clauses 1-24, wherein the primer layer comprises $Ti_xTa_{1-x}$; wherein x is within the range of 2-80 wt % before heating.

Clause 37. The article according to any of clauses 1-24, wherein the primer layer comprises $Ti_xTa_{1-x}$; wherein x is within the range of 2-40 wt % after heating.

Clause 38. The article according to any of clauses 1-24, wherein the primer layer comprises $Ti_xNb_{1-x}$; wherein x is within the range of 2-95 wt % after heating.

Clause 39. The article according to any of clauses 1-24, wherein the primer layer comprises $Nb_xZr_{1-x}$; wherein x is within the range of 1-80 wt % before heating.

Clause 40. The article according to any of clauses 1-24, wherein the primer layer comprises $Nb_xZr_{1-x}$; wherein x is within the range of 60-100 wt % after heating.

Clause 41. The article according to any of clauses 1-24, wherein the primer layer comprises $Ta_xW_{1-x}$; wherein x is within the range of 2-95 wt % before heating.

Clause 42. The article according to any of clauses 1-24, wherein the primer layer comprises $W_xNb_{1-x}$; wherein x is within the range of 5-100 wt % before heating.

Clause 43. The article according to any of clauses 1-24, wherein the primer layer comprises $W_xNb_{1-x}$; wherein x is within the range of 2-50 wt % after heating.

Clause 44. The article according to any of clauses 1-24, wherein the primer layer comprises $Zn_xTi_{1-x}$; wherein x is within the range of 10-100 wt % before heating.

Clause 45. The article according to any of clauses 1-24, wherein the primer layer comprises $Zn_xTi_{1-x}$; wherein x is within the range of 20-100 wt % after heating.

Clause 46. The article according to any of clauses 1-45, wherein at least a portion of the primer layer or layers is a nitride.

Clause 47. The article according to clause 46, wherein the primer layer comprises $Al_xNb_{1-x}$ nitride; wherein x is within the range of 1-100 wt % before heating.

Clause 48. The article according to clause 46, wherein the primer layer comprises $Al_xNb_{1-x}$ nitride; wherein x is within the range of 1-100 wt % after heating.

Clause 49. The article according to clause 46, wherein the primer layer comprises $Ti_xNb_{1-x}$ nitride; wherein x is within the range of 1-65 wt %.

Clause 50. The article according to clause 46, wherein the primer layer comprises $W_xNb_{1-x}$ nitride; wherein x is within the range of 2-90 wt % before heating.

Clause 51. The article according to clause 46, wherein the primer layer comprises $W_xNb_{1-x}$ nitride; wherein x is within the range of 2-70 wt % after heating.

Clause 52. The article according to any of clauses 3-51, wherein the seed film comprises $V_xZn_{1-x}$ oxide; wherein x is within the range of 1-25 wt %.

Clause 53. The article according to any of clauses 3-51, wherein the seed film comprises $Al_xZn_{1-x}$ oxide; wherein x is within the range of 1-25 wt %.

Clause 54. The article according to any of clauses 3-51, wherein the seed film comprises $Ga_xZn_{1-x}$ oxide; wherein x is within the range of 1-20 wt %.

Clause 55. The article according to any of clauses 3-51, wherein the seed film comprises $In_xZn_{1-x}$ oxide; wherein x is within the range of 1-40 wt %.

Clause 56. The article according to any of clauses 3-51, wherein the seed film comprises $Sn_xIn_{1-x}$ oxide; wherein x is within the range of 1-20 wt %.

Clause 57. The article according to any of clauses 3-51, wherein the seed film comprises Ag; wherein the Ag is deposited in an oxygen and argon gas environment having an oxygen gas flow rate of between 1-70%.

Clause 58. The article according to any of clauses 3-51, wherein the seed film comprises $Al_xAg_{1-x}$; wherein x is within the range of 1-35 wt % before and after heating.

Clause 59. The article according to any of clauses 23-58, wherein the stress layer comprises $Ti_xNb_{1-x}$ suboxide or oxide; wherein x is within the range of 1-100 wt % before and after heating.

Clause 60. The article according to any of clauses 23-58, wherein the stress layer comprises $Nb_xZr_{1-x}$ suboxide or oxide; wherein x is within the range of 1-12 wt % after heating.

Clause 61. The article according to any of clauses 23-58, wherein the stress layer comprises $Ti_xTa_{1-x}$ suboxide or oxide; wherein x is within the range of 1-100 wt % after heating.

Clause 62. The article according to any of clauses 23-58, wherein the stress layer comprises $Si_xCo_{1-x}$ suboxide or oxide; wherein x is within the range of 10-90 wt % after heating.

Clause 63. The article according to any of clauses 1-62, wherein the article has a visible light transmittance of at least 70%.

Clause 64. The article according to any of clauses 1-63, wherein the article has a sheet resistance of no more than 0.7 Ohms/square.

Clause 65. A coated article comprising: a substrate; a first dielectric layer over at least a portion of the substrate; a first metallic layer over at least a portion of the first dielectric layer; a first primer layer over at least a portion of the first metallic layer; a second dielectric layer over at least a portion of the first primer layer; and an outermost protective layer; wherein a stress layer is added between the protective outer layer and the top dielectric layer and comprises one or a combination of silicon cobalt, titanium niobium, zirconium niobium, tantalum titanium, oxides thereof, or sub-oxides thereof.

Clause 66. The article according to clause 65, wherein at least a portion of the primer layer is an oxide or a nitride.

Clause 67. The article according to any of clauses 65-66, comprising a seed film adjacent to and in direct contact with the first metallic layer and in between the first dielectric layer and the first metallic layer.

Clause 68. The article according to any of clauses 65-67, wherein the primer layer is selected from the group consisting of silver zinc, zinc, silver zinc oxide, aluminum zinc oxide, indium zinc oxide, gallium zinc oxide, vanadium zinc oxide, mixtures thereof, combinations thereof, and alloys thereof.

Clause 69. The article according to any of clauses 65-67, wherein the primer layer is a metal, oxide, nitride, sub-oxide, sub-nitride, oxynitride, or sub-oxynitride.

Clause 70. The article according to any of clauses 67-69, wherein the seed film is comprised of aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof.

Clause 71. The article according to clause 70, wherein the seed film comprises aluminum zinc, vanadium zinc, zinc, or silver zinc.

Clause 72. The article according to clause 71, wherein the seed film is a metal, oxide, or sub-oxide.

Clause 73. The article according to clause 70, wherein the seed film comprises gallium zinc, indium zinc, or indium tin.

Clause 74. The article according to clause 73, wherein the seed film is a metal, oxide, nitride, sub-oxide, or sub-nitride.

Clause 75. The article according to any of clauses 65-74, further comprising: a second metallic layer over at least a portion of the second dielectric layer; a second primer layer over at least a portion of the second metallic layer; and a third dielectric layer over at least a portion of the second primer layer.

Clause 76. The article according to clause 75, further comprising: a third metallic layer over at least a portion of the third dielectric layer; a third primer layer over at least a portion of the third metallic layer; and a fourth dielectric layer over at least a portion of the third primer layer.

Clause 77. The article according to clause 76, further comprising: a fourth metallic layer over at least a portion of the fourth dielectric layer; a fourth primer layer over at least a portion of the fourth metallic layer; and a fifth dielectric layer over at least a portion of the fourth primer layer.

Clause 78. The article according to any of clauses 65-77, wherein the metallic layer or layers comprise silver or aluminum doped silver.

Clause 79. The article according to any of clauses 65-78, wherein the first dielectric layer comprises a zinc stannate film, and a second film comprising at least one of zinc oxide, aluminum zinc oxide, indium zinc oxide, gallium zinc oxide, indium tin oxide, or vanadium zinc oxide over at least a portion of the zinc stannate film.

Clause 80. The article according to any of clauses 65-78, wherein the first dielectric layer comprises a zinc stannate film, and a second film comprising at least one of aluminum zinc oxide, indium zinc oxide, gallium zinc oxide, indium tin oxide, or vanadium zinc oxide over at least a portion of the zinc stannate film.

Clause 81. The article according to any of clauses 75-80, wherein the second dielectric layer and the third dielectric layer comprise a first film comprising zinc oxide, aluminum zinc oxide, gallium zinc oxide, indium zinc oxide, indium tin oxide, or vanadium zinc oxide, a second film comprising zinc stannate over at least a portion of the first film, and a third film comprising at least one of zinc oxide, aluminum zinc oxide, gallium zinc oxide, indium zinc oxide, indium tin oxide, or vanadium zinc oxide over at least a portion of the second film.

Clause 82. The article according to any of clauses 75-81, wherein the second dielectric layer and the third dielectric layer comprise a first film comprising aluminum zinc oxide, gallium zinc oxide, indium zinc oxide, indium tin oxide, or vanadium zinc oxide, a second film comprising zinc stannate over at least a portion of the first film, and a third film comprising at least one of aluminum zinc oxide, gallium zinc oxide, indium zinc oxide, indium tin oxide, or vanadium zinc oxide over at least a portion of the second film.

Clause 83. The article according to any of clauses 76-82, wherein the fourth dielectric layer comprises a first film comprising at least one of zinc oxide, aluminum zinc oxide, gallium zinc oxide, indium zinc oxide, indium tin oxide, or vanadium zinc oxide, and a zinc stannate film over at least a portion of the first film.

Clause 84. The article according to any of clauses 76-83, wherein the fourth dielectric layer comprises a first film comprising at least one of aluminum zinc oxide, gallium zinc oxide, indium zinc oxide, indium tin oxide, or vanadium zinc oxide, and a zinc stannate film over at least a portion of the first film.

Clause 85. The article according to any of clauses 65-84, wherein the first dielectric layer or the second dielectric layer comprises a silicon nitride film.

Clause 86. The article according to any of clauses 65-85, wherein the outermost protective layer comprises SiAlN, SiON, SiAlON, titania, alumina, silica, zirconia, alloys thereof, or mixtures thereof.

Clause 87. The article according to any of clauses 65-86, wherein the stress layer comprises silicon cobalt, titanium niobium, zirconium niobium, tantalum titanium, oxides thereof, or sub-oxides thereof.

Clause 88. The article according to any of clauses 65-87, wherein the primer layer comprises $Al_xZn_{1-x}$; wherein x is within the range of greater than 0-30 wt %.

Clause 89. The article according to any of clauses 65-87, wherein the primer layer comprises $Ga_xZn_{1-x}$; wherein x is within the range of greater than 0-20 wt %.

Clause 90. The article according to any of clauses 65-87, wherein the primer layer comprises $In_xZn_{1-x}$; wherein x is within the range of greater than 0-40 wt %.

Clause 91. The article according to any of clauses 65-87, wherein the primer layer comprises $V_xZn_{1-x}$; wherein x is within the range of greater than 0-20 wt %.

Clause 92. The article according to any of clauses 65-87, wherein the primer layer comprises $Ag_xZn_{1-x}$; wherein x is within the range of greater than 0-50 wt %.

Clause 93. The article according to any of clauses 65-87, wherein the primer layer comprises $Al_xTi_{1-x}$; wherein x is within the range of 2-75 wt % before heating.

Clause 94. The article according to any of clauses 65-87, wherein the primer layer comprises $Al_xTi_{1-x}$; wherein x is within the range of 1-100 wt % after heating.

Clause 95. The article according to any of clauses 65-87, wherein the primer layer comprises $Al_xNb_{1-x}$; wherein x is within the range of 2-40 wt % before heating.

Clause 96. The article according to any of clauses 65-87, wherein the primer layer comprises, $Al_xNb_{1-x}$; wherein x is within the range of 2-95 wt % after heating.

Clause 97. The article according to any of clauses 65-87, wherein the primer layer comprises $W_xTi_{1-x}$; wherein x is within the range of 55-100 wt % before heating with 7% $O_2$ during deposition.

Clause 98. The article according to any of clauses 65-87, wherein the primer layer comprises $W_xTi_{1-x}$; wherein x is within the range of 30-95 wt % after heating with 3% $O_2$ during deposition.

Clause 99. The article according to any of clauses 65-87, wherein the primer layer comprises $Ti_xTa_{1-x}$; wherein x is within the range of 2-80 wt % before heating.

Clause 100. The article according to any of clauses 65-87, wherein the primer layer comprises $Ti_xTa_{1-x}$; wherein x is within the range of 2-40 wt % after heating.

Clause 101. The article according to any of clauses 65-87, wherein the primer layer comprises $Ti_xNb_{1-x}$; wherein x is within the range of 2-95 wt % after heating.

Clause 102. The article according to any of clauses 65-87, wherein the primer layer comprises $Nb_xZr_{1-x}$; wherein x is within the range of 1-80 wt % before heating.

Clause 103. The article according to any of clauses 65-87, wherein the primer layer comprises $Nb_xZr_{1-x}$; wherein x is within the range of 60-100 wt % after heating.

Clause 104. The article according to any of clauses 65-87, wherein the primer layer comprises $Ta_xW_{1-x}$; wherein x is within the range of 2-95 wt % before heating.

Clause 105. The article according to any of clauses 65-87, wherein the primer layer comprises $W_xNb_{1-x}$; wherein x is within the range of 5-100 wt % before heating.

Clause 106. The article according to any of clauses 65-87, wherein the primer layer comprises $W_xNb_{1-x}$; wherein x is within the range of 2-50 wt % after heating.

Clause 107. The article according to any of clauses 65-87, wherein the primer layer comprises $Zn_xTi_{1-x}$; wherein x is within the range of 10-100 wt % before heating.

Clause 108. The article according to any of clauses 65-87, wherein the primer layer comprises $Zn_xTi_{1-x}$; wherein x is within the range of 20-100 wt % after heating.

Clause 109. The article according to any of clauses 65-108, wherein at least a portion of the primer layer or layers is a nitride.

Clause 110. The article according to clause 109, wherein the primer layer comprises $Al_xNb_{1-x}$ nitride; wherein x is within the range of 1-100 wt % before heating.

Clause 111. The article according to clause 109, wherein the primer layer comprises $Al_xNb_{1-x}$ nitride; wherein x is within the range of 1-100 wt % after heating.

Clause 112. The article according to clause 109, wherein the primer layer comprises $Ti_xNb_{1-x}$ nitride; wherein x is within the range of 1-65 wt %.

Clause 113. The article according to clause 109, wherein the primer layer comprises $W_xNb_{1-x}$ nitride; wherein x is within the range of 2-90 wt % before heating.

Clause 114. The article according to clause 109, wherein the primer layer comprises $W_xNb_{1-x}$ nitride; wherein x is within the range of 2-70 wt % after heating.

Clause 115. The article according to any of clauses 67-114, wherein the seed film comprises $V_xZn_{1-x}$ oxide; wherein x is within the range of 1-25 wt %.

Clause 116. The article according to any of clauses 67-114, wherein the seed film comprises $Al_xZn_{1-x}$ oxide; wherein x is within the range of 1-25 wt %.

Clause 117. The article according to any of clauses 67-114, wherein the seed film comprises $Ga_xZn_{1-x}$ oxide; wherein x is within the range of 1-20 wt %.

Clause 118. The article according to any of clauses 67-114, wherein the seed film comprises $In_xZn_{1-x}$ oxide; wherein x is within the range of 1-40 wt %.

Clause 119. The article according to any of clauses 67-114, wherein the seed film comprises $Sn_xIn_{1-x}$ oxide; wherein x is within the range of 1-20 wt %.

Clause 120. The article according to any of clauses 67-114, wherein the seed film comprises Ag; wherein the Ag is deposited in an oxygen and argon gas environment having a gas flow rate of between 0-70%.

Clause 121. The article according to any of clauses 67-114, wherein the seed film comprises $Al_xAg_{1-x}$; wherein x is within the range of 1-35 wt % before and after heating.

Clause 122. The article according to any of clauses 65-121, wherein the stress layer comprises $Ti_xNb_{1-x}$ suboxide or oxide; wherein x is within the range of 1-100 wt % before and after heating.

Clause 123. The article according to any of clauses 65-121, wherein the stress layer comprises $Nb_xZr_{1-x}$ suboxide or oxide; wherein x is within the range of 1-12 wt % after heating.

Clause 124. The article according to any of clauses 65-121, wherein the stress layer comprises $Ti_xTa_{1-x}$ suboxide or oxide; wherein x is within the range of 1-100 wt % after heating.

Clause 125. The article according to any of clauses 65-121, wherein the stress layer comprises $Si_xCo_{1-x}$ suboxide or oxide; wherein x is within the range of 10-90 wt % after heating.

Clause 126. The article according to any of clauses 65-125, wherein the article has a visible light transmittance of at least 70%.

Clause 127. The article according to any of clauses 65-126, wherein the article has a sheet resistance of no more than 0.7 Ohms/square.

Clause 128. A method of making a coated article by: providing a substrate; applying a coating over the substrate wherein the coating comprises: a first dielectric layer over at least a portion of the substrate; a first metallic layer over at least a portion of the first dielectric layer; a first primer layer over at least a portion of the first metallic layer; and a second dielectric layer over at least a portion of the first primer layer; wherein the primer layer is selected from the group consisting of zinc, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, mixtures thereof, or alloys thereof.

Clause 129. A method of making a coated article by: providing a substrate; applying a coating over the substrate wherein the coating comprises: a first dielectric layer over at least a portion of the substrate; a first metallic layer over at least a portion of the first dielectric layer; a first primer layer over at least a portion of the first metallic layer; and a second dielectric layer over at least a portion of the first primer layer; wherein the primer layer is selected from the group consisting of zinc, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, zinc tin, indium zinc, silver zinc, gallium zinc, indium tin, mixtures thereof, or alloys thereof; heating the substrate comprising the coating; and bending the substrate comprising the coating into a desired shape.

Clause 130. The method according to any of clauses 128-129, wherein at least a portion of the primer layer is an oxide or a nitride.

Clause 131. The method according to any of clauses 128-130, wherein the article further comprises a seed film adjacent to and in direct contact with the first metallic layer and in between the first dielectric layer and the first metallic layer.

Clause 132. The method according to any of clauses 128-131, wherein the primer layer is selected from the group consisting of silver zinc, zinc, silver zinc oxide, aluminum zinc oxide, indium zinc oxide, gallium zinc oxide, vanadium zinc oxide, mixtures thereof, combinations thereof, or alloys thereof.

Clause 133. The method according to any of clauses 128-132, wherein the primer layer is a metal, oxide, nitride, sub-oxide, sub-nitride, oxynitride, or sub-oxynitride.

Clause 134. The method according to any of clause 131-133, wherein the seed film is comprised of aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof.

Clause 135. The method according to any of clauses 131-134, wherein the seed film comprises aluminum zinc, vanadium zinc, zinc, or silver zinc.

Clause 136. The method according to clause 135, wherein the seed film is a metal, oxide, or sub-oxide.

Clause 137. The method according to any of clause 131-134, wherein the seed film comprises gallium zinc, indium zinc, or indium tin.

Clause 138. The method according to clause 137, wherein the seed film is a metal, oxide, nitride, sub-oxide, or sub-nitride.

Clause 139. The method according to any of clauses 128-138, wherein the article further comprises: a second metallic layer over at least a portion of the second dielectric layer; a second primer layer over at least a portion of the second metallic layer; and a third dielectric layer over at least a portion of the second primer layer.

Clause 140. The method according to clause 139, wherein the article further comprising: a third metallic layer over at least a portion of the third dielectric layer; a third primer layer over at least a portion of the third metallic layer; and a fourth dielectric layer over at least a portion of the third primer layer.

Clause 141. The method according to clause 140, wherein the article further comprises: a fourth metallic layer over at least a portion of the fourth dielectric layer; a fourth primer layer over at least a portion of the fourth metallic layer; and a fifth dielectric layer over at least a portion of the fourth primer layer.

Clause 142. The method according to any of clauses 128-141, wherein the metallic layer or layers comprise silver or aluminum doped silver.

Clause 143. The method according to any of clauses 128-142, wherein the first dielectric layer comprises a zinc stannate film, and a second film comprising at least one of zinc oxide, aluminum zinc oxide, indium zinc oxide, gallium zinc oxide, indium tin oxide, or vanadium zinc oxide over at least a portion of the zinc stannate film.

Clause 144. The method according to any of clauses 128-143, wherein the first dielectric layer comprises a zinc stannate film, and a second film comprising at least one of aluminum zinc oxides, indium zinc oxide, gallium zinc oxide, indium tin oxide, or vanadium zinc oxide over at least a portion of the zinc stannate film.

Clause 145. The method according to any of clauses 139-144, wherein the second dielectric layer and the third dielectric layer comprise a first film comprising zinc oxide, aluminum zinc oxide, gallium zinc oxide, indium zinc oxide, indium tin oxide, or vanadium zinc oxide, a second film comprising zinc stannate over at least a portion of the first film, and a third film comprising at least one of zinc oxide, aluminum zinc oxide, gallium zinc oxide, indium zinc oxide, indium tin oxide, or vanadium zinc oxide over at least a portion of the second film.

Clause 146. The method according to any of clauses 139-145, wherein the second dielectric layer and the third dielectric layer comprise a first film comprising aluminum zinc oxide, gallium zinc oxide, indium zinc oxide, indium tin oxide, or vanadium zinc oxide, a second film comprising zinc stannate over at least a portion of the first film, and a third film comprising at least one of aluminum zinc oxide, gallium zinc oxide, indium zinc oxide, indium tin oxide, or vanadium zinc oxide over at least a portion of the second film.

Clause 147. The method according to any of clauses 140-146, wherein the fourth dielectric layer comprises a first film comprising at least one of zinc oxide, aluminum zinc oxide, gallium zinc oxide, indium zinc oxide, indium tin oxide, or vanadium zinc oxide, and a zinc stannate film over at least a portion of the first film.

Clause 148. The method according to any of clauses 140-147, wherein the fourth dielectric layer comprises a first film comprising at least one of aluminum zinc oxide, gallium zinc oxide, indium zinc oxide, indium tin oxide, or vanadium zinc oxide, and a zinc stannate film over at least a portion of the first film.

Clause 149. The method according to any of clauses 128-148, wherein the first dielectric layer or the second dielectric layer comprises a silicon nitride film.

Clause 150. The method according to any of clauses 128-149, wherein the article further comprises an outermost protective layer comprising SiAlN, SiON, SiAlON, titania, alumina, silica, zirconia, alloys thereof, or mixtures thereof.

Clause 151. The method according to clause 150, wherein the article further comprises a stress layer underneath the outermost protective layer.

Clause 152. The method according to clause 151, wherein the stress layer comprises silicon cobalt, titanium niobium, zirconium niobium, tantalum titanium, oxides thereof, or sub-oxides thereof.

Clause 153. The method according to any of clauses 128-152, wherein the primer layer comprises $Al_xZn_{1-x}$; wherein x is within the range of greater than 0-30 wt %.

Clause 154. The method according to any of clauses 128-152, wherein the primer layer comprises $Ga_xZn_{1-x}$; wherein x is within the range of greater than 0-20 wt %.

Clause 155. The method according to any of clauses 128-152, wherein the primer layer comprises $In_xZn_{1-x}$; wherein x is within the range of greater than 0-40 wt %.

Clause 156. The method according to any of clauses 128-152, wherein the primer layer comprises $V_xZn_{1-x}$; wherein x is within the range of greater than 0-20 wt %.

Clause 157. The method according to any of clauses 128-152, wherein the primer layer comprises $Ag_xZn_{1-x}$; wherein x is within the range of greater than 0-50 wt %.

Clause 158. The method according to any of clauses 128-152, wherein the primer layer comprises $Al_xTi_{1-x}$; wherein x is within the range of 2-75 wt % before heating.

Clause 159. The method according to any of clauses 128-152, wherein the primer layer comprises $Al_xTi_{1-x}$; wherein x is within the range of 1-100 wt % after heating.

Clause 160. The method according to any of clauses 128-152, wherein the primer layer comprises $Al_xNb_{1-x}$; wherein x is within the range of 2-40 wt % before heating.

Clause 161. The method according to any of clauses 128-152, wherein the primer layer comprises, $Al_xNb_{1-x}$; wherein x is within the range of 2-95 wt % after heating.

Clause 162. The method according to any of clauses 128-152, wherein the primer layer comprises $W_xTi_{1-x}$; wherein x is within the range of 55-100 wt % before heating with 7% $O_2$ during deposition.

Clause 163. The method according to any of clauses 128-152, wherein the primer layer comprises $W_xTi_{1-x}$; wherein x is within the range of 30-95 wt % after heating with 3% $O_2$ during deposition.

Clause 164. The method according to any of clauses 128-152, wherein the primer layer comprises $Ti_xTa_{1-x}$; wherein x is within the range of 2-80 wt % before heating.

Clause 165. The method according to any of clauses 128-152, wherein the primer layer comprises $Ti_xTa_{1-x}$; wherein x is within the range of 2-40 wt % after heating.

Clause 166. The method according to any of clauses 128-152, wherein the primer layer comprises $Ti_xNb_{1-x}$; wherein x is within the range of 2-95 wt % after heating.

Clause 167. The method according to any of clauses 128-152, wherein the primer layer comprises $Nb_xZr_{1-x}$; wherein x is within the range of 1-80 wt % before heating.

Clause 168. The method according to any of clauses 128-152, wherein the primer layer comprises $Nb_xZr_{1-x}$; wherein x is within the range of 60-100 wt % after heating.

Clause 169. The method according to any of clauses 128-152, wherein the primer layer comprises $Ta_xW_{1-x}$; wherein x is within the range of 2-95 wt % before heating.

Clause 170. The method according to any of clauses 128-152, wherein the primer layer comprises $W_xNb_{1-x}$; wherein x is within the range of 5-100 wt % before heating.

Clause 171. The method according to any of clauses 128-152, wherein the primer layer comprises $W_xNb_{1-x}$; wherein x is within the range of 2-50 wt % after heating.

Clause 172. The method according to any of clauses 128-152, wherein the primer layer comprises $Zn_xTi_{1-x}$; wherein x is within the range of 10-100 wt % before heating.

Clause 173. The method according to any of clauses 128-152, wherein the primer layer comprises $Zn_xTi_{1-x}$; wherein x is within the range of 20-100 wt % after heating.

Clause 174. The method according to any of clauses 128-173, wherein at least a portion of the primer layer or layers is a nitride.

Clause 175. The method according to clause 174, wherein the primer layer comprises $Al_xNb_{1-x}$ nitride; wherein x is within the range of 1-100 wt % before heating.

Clause 176. The method according to clause 174, wherein the primer layer comprises $Al_xNb_{1-x}$ nitride; wherein x is within the range of 1-100 wt % after heating.

Clause 177. The method according to clause 174, wherein the primer layer comprises $Ti_xNb_{1-x}$ nitride; wherein x is within the range of 1-65 wt %.

Clause 178. The method according to clause 174, wherein the primer layer comprises $W_xNb_{1-x}$ nitride; wherein x is within the range of 2-90 wt % before heating.

Clause 179. The method according to clause 174, wherein the primer layer comprises $W_xNb_{1-x}$ nitride; wherein x is within the range of 2-70 wt % after heating.

Clause 180. The method according to any of clauses 131-179, wherein the seed film comprises $V_xZn_{1-x}$ oxide; wherein x is within the range of 1-25 wt %.

Clause 181. The method according to any of clauses 131-179, wherein the seed film comprises $Al_xZn_{1-x}$ oxide; wherein x is within the range of 1-25 wt %.

Clause 182. The method according to any of clauses 131-179, wherein the seed film comprises $Ga_xZn_{1-x}$ oxide; wherein x is within the range of 1-20 wt %.

Clause 183. The method according to any of clauses 131-179, wherein the seed film comprises $In_xZn_{1-x}$ oxide; wherein x is within the range of 1-40 wt %.

Clause 184. The method according to any of clauses 131-179, wherein the seed film comprises $Sn_xIn_{1-x}$ oxide; wherein x is within the range of 1-20 wt %.

Clause 185. The method according to any of clauses 131-179, wherein the seed film comprises Ag; wherein the Ag is deposited in an oxygen and argon gas environment having an oxygen gas flow rate of between 1-70%.

Clause 186. The method according to any of clauses 131-179, wherein the seed film comprises $Al_xAg_{1-x}$; wherein x is within the range of 1-35 wt % before and after heating.

Clause 187. The method according to any of clauses 151-186, wherein the stress layer comprises $Ti_xNb_{1-x}$ sub-oxide or oxide; wherein x is within the range of 1-100 wt % before and after heating.

Clause 188. The method according to any of clauses 151-186, wherein the stress layer comprises $Nb_xZr_{1-x}$ sub-oxide or oxide; wherein x is within the range of 1-12 wt % after heating.

Clause 189. The method according to any of clauses 151-186, wherein the stress layer comprises $Ti_xTa_{1-x}$ suboxide or oxide; wherein x is within the range of 1-100 wt % after heating.

Clause 190. The method according to any of clauses 151-186, wherein the stress layer comprises $Si_xCo_{1-x}$ sub-oxide or oxide; wherein x is within the range of 10-90 wt % after heating.

Clause 191. The method according to any of clauses 128-190, wherein the article has a visible light transmittance of at least 70%.

Clause 192. The method according to any of clauses 128-191, wherein the article has a sheet resistance of no more than 0.7 Ohms/square.

Clause 193. A method of making a coated article by: providing a substrate; applying a coating over the substrate wherein the coating comprises: a first dielectric layer over at least a portion of the substrate; a first metallic layer over at least a portion of the first dielectric layer; a first primer layer over at least a portion of the first metallic layer; and a second dielectric layer over at least a portion of the first primer layer; wherein an stress layer is added between the protective outer layer and the top dielectric layer and wherein the stress layer comprises silicon cobalt, titanium niobium, zirconium niobium, tantalum titanium, oxides thereof, or sub-oxides thereof.

Clause 194. A method of making a coated article by: providing a substrate; applying a coating over the substrate wherein the coating comprises: a first dielectric layer over at least a portion of the substrate; a first metallic layer over at least a portion of the first dielectric layer; a first primer layer over at least a portion of the first metallic layer; and a second dielectric layer over at least a portion of the first primer layer; wherein an stress layer is added between the protective outer layer and the top dielectric layer and wherein the stress layer comprises silicon cobalt, titanium niobium, zirconium niobium, tantalum titanium, oxides thereof, or sub-oxides thereof; heating the substrate comprising the coating; and bending the substrate comprising the coating to the desired shape.

Clause 195. The method according to any of clauses 193-194, wherein at least a portion of the primer layer is an oxide or a nitride.

Clause 196. The method according to any of clauses 193-195, wherein the article further comprises a seed film adjacent to and in direct contact with the first metallic layer and in between the first dielectric layer and the first metallic layer.

Clause 197. The method according to any of clauses 193-196, wherein the primer layer is selected from the group consisting of silver zinc, zinc, silver zinc oxide, aluminum zinc oxide, indium zinc oxide, gallium zinc oxide, vanadium zinc oxide, mixtures thereof, combinations thereof, and alloys thereof.

Clause 198. The method according to any of clauses 193-197, wherein the primer layer is a metal, oxide, nitride, sub-oxide, sub-nitride, oxynitride, or sub-oxynitride.

Clause 199. The method according to any of clauses 196-198, wherein the seed film is comprised of aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof.

Clause 200. The method according to clause 196-199, wherein the seed film comprises aluminum zinc, vanadium zinc, zinc, or silver zinc.

Clause 201. The method according to clause 200, wherein the seed film is a metal, oxide, or sub-oxide.

Clause 202. The method according to clause 196-199, wherein the seed film comprises gallium zinc, indium zinc, or indium tin.

Clause 203. The method according to clause 202, wherein the seed film is a metal, oxide, nitride, sub-oxide, or sub-nitride.

Clause 204. The method according to any of clauses 193-203, wherein the article further comprises: a second metallic layer over at least a portion of the second dielectric layer; a second primer layer over at least a portion of the second metallic layer; and a third dielectric layer over at least a portion of the second primer layer.

Clause 205. The method according to clause 204, wherein the article further comprises: a third metallic layer over at least a portion of the third dielectric layer; a third primer layer over at least a portion of the third metallic layer; and a fourth dielectric layer over at least a portion of the third primer layer.

Clause 206. The method according to clause 205, wherein the article further comprises: a fourth metallic layer over at least a portion of the fourth dielectric layer; a fourth primer layer over at least a portion of the fourth metallic layer; and a fifth dielectric layer over at least a portion of the fourth primer layer.

Clause 207. The method according to any of clauses 193-206, wherein the metallic layer or layers comprise silver or aluminum doped silver.

Clause 208. The method according to any of clauses 193-207, wherein the first dielectric layer comprises a zinc stannate film, and a second film comprising at least one of zinc oxide, aluminum zinc oxide, indium zinc oxide, gallium zinc oxide, indium tin oxide, or vanadium zinc oxide over at least a portion of the zinc stannate film.

Clause 209. The method according to any of clauses 193-208, wherein the first dielectric layer comprises a zinc stannate film, and a second film comprising at least one of aluminum zinc oxide, indium zinc oxide, gallium zinc oxide, indium tin oxide, or vanadium zinc oxide over at least a portion of the zinc stannate film.

Clause 210. The method according to any of clauses 204-209, wherein the second dielectric layer and the third dielectric layer comprise a first film comprising zinc oxide, aluminum zinc oxide, gallium zinc oxide, indium zinc oxide, indium tin oxide, or vanadium zinc oxide, a second film comprising zinc stannate over at least a portion of the first film, and a third film comprising at least one of zinc oxide, aluminum zinc oxide, gallium zinc oxide, indium zinc oxide, indium tin oxide, or vanadium zinc oxide over at least a portion of the second film.

Clause 211. The method according to any of clauses 204-210, wherein the second dielectric layer and the third dielectric layer comprise a first film comprising aluminum zinc oxide, gallium zinc oxide, indium zinc oxide, indium tin oxide, or vanadium zinc oxide, a second film comprising zinc stannate over at least a portion of the first film, and a third film comprising at least one of aluminum zinc oxide, gallium zinc oxide, indium zinc oxide, indium tin oxide, or vanadium zinc oxide over at least a portion of the second film.

Clause 212. The method according to any of clauses 205-211, wherein the fourth dielectric layer comprises a first film comprising at least one of zinc oxide, aluminum zinc oxide, gallium zinc oxide, indium zinc oxide, indium tin oxide, or vanadium zinc oxide, and a zinc stannate film over at least a portion of the first film.

Clause 213. The method according to any of clauses 205-212, wherein the fourth dielectric layer comprises a first film comprising at least one of aluminum zinc oxide, gallium zinc oxide, indium zinc oxide, indium tin oxide, or vanadium zinc oxide, and a zinc stannate film over at least a portion of the first film.

Clause 214. The method according to any of clauses 193-213, wherein the first dielectric layer or the second dielectric layer comprises a silicon nitride film.

Clause 215. The method according to any of clauses 193-214, wherein the outermost protective layer comprises SiAlN, SiON, SiAlON, titania, alumina, silica, zirconia, alloys thereof, or mixtures thereof.

Clause 216. The method according to any of clauses 193-215, wherein the stress layer comprises silicon cobalt, titanium niobium, zirconium niobium, tantalum titanium, oxides thereof, or sub-oxides thereof.

Clause 217. The method according to any of clauses 193-216, wherein the primer layer comprises $Al_xZn_{1-x}$; wherein x is within the range of greater than 0-30 wt %.

Clause 218. The method according to any of clauses 193-216, wherein the primer layer comprises $Ga_xZn_{1-x}$; wherein x is within the range of greater than 0-20 wt %.

Clause 219. The method according to any of clauses 193-216, wherein the primer layer comprises $In_xZn_{1-x}$; wherein x is within the range of greater than 0-40 wt %.

Clause 220. The method according to any of clauses 193-216, wherein the primer layer comprises $V_xZn_{1-x}$; wherein x is within the range of greater than 0-20 wt %.

Clause 221. The method according to any of clauses 193-216, wherein the primer layer comprises $Ag_xZn_{1-x}$; wherein x is within the range of greater than 0-50 wt %.

Clause 222. The method according to any of clauses 193-216, wherein the primer layer comprises $Al_xTi_{1-x}$; wherein x is within the range of 2-75 wt % before heating.

Clause 223. The method according to any of clauses 193-216, wherein the primer layer comprises $Al_xTi_{1-x}$; wherein x is within the range of 1-100 wt % after heating.

Clause 224. The method according to any of clauses 193-216, wherein the primer layer comprises $Al_xNb_{1-x}$; wherein x is within the range of 2-40 wt % before heating.

Clause 225. The method according to any of clauses 193-216, wherein the primer layer comprises, $Al_xNb_{1-x}$; wherein x is within the range of 2-95 wt % after heating.

Clause 226. The method according to any of clauses 193-216, wherein the primer layer comprises $W_xTi_{1-x}$; wherein x is within the range of 55-100 wt % before heating with 7% $O_2$ during deposition.

Clause 227. The method according to any of clauses 193-216, wherein the primer layer comprises $W_xTi_{1-x}$; wherein x is within the range of 30-95 wt % after heating with 3% $O_2$ during deposition.

Clause 228. The method according to any of clauses 193-216, wherein the primer layer comprises $Ti_xTa_{1-x}$; wherein x is within the range of 2-80 wt % before heating.

Clause 229. The method according to any of clauses 193-216, wherein the primer layer comprises $Ti_xTa_{1-x}$; wherein x is within the range of 2-40 wt % after heating.

Clause 230. The method according to any of clauses 193-216, wherein the primer layer comprises $Ti_xNb_{1-x}$; wherein x is within the range of 2-95 wt % after heating.

Clause 231. The method according to any of clauses 193-216, wherein the primer layer comprises $Nb_xZr_{1-x}$; wherein x is within the range of 1-80 wt % before heating.

Clause 232. The method according to any of clauses 193-216, wherein the primer layer comprises $Nb_xZr_{1-x}$; wherein x is within the range of 60-100 wt % after heating.

Clause 233. The method according to any of clauses 193-216, wherein the primer layer comprises $Ta_xW_{1-x}$; wherein x is within the range of 2-95 wt % before heating.

Clause 234. The method according to any of clauses 193-216, wherein the primer layer comprises $W_xNb_{1-x}$; wherein x is within the range of 5-100 wt % before heating.

Clause 235. The method according to any of clauses 193-216, wherein the primer layer comprises $W_xNb_{1-x}$; wherein x is within the range of 2-50 wt % after heating.

Clause 236. The method according to any of clauses 193-216, wherein the primer layer comprises $Zn_xTi_{1-x}$; wherein x is within the range of 10-100 wt % before heating.

Clause 237. The method according to any of clauses 193-216, wherein the primer layer comprises $Zn_xTi_{1-x}$; wherein x is within the range of 20-100 wt % after heating.

Clause 238. The method according to any of clauses 193-237, wherein at least a portion of the primer layer or layers is a nitride.

Clause 239. The method according to clause 238, wherein the primer layer comprises $Al_xNb_{1-x}$ nitride; wherein x is within the range of 1-100 wt % before heating.

Clause 240. The method according to clause 238, wherein the primer layer comprises $Al_xNb_{1-x}$ nitride; wherein x is within the range of 1-100 wt % after heating.

Clause 241. The method according to clause 238, wherein the primer layer comprises $Ti_xNb_{1-x}$ nitride; wherein x is within the range of 1-65 wt %.

Clause 242. The method according to clause 238, wherein the primer layer comprises $W_xNb_{1-x}$ nitride; wherein x is within the range of 2-90 wt % before heating.

Clause 243. The method according to clause 238, wherein the primer layer comprises $W_xNb_{1-x}$ nitride; wherein x is within the range of 2-70 wt % after heating.

Clause 244. The method according to any of clauses 196-243, wherein the seed film comprises $V_xZn_{1-x}$ oxide; wherein x is within the range of 1-25 wt %.

Clause 245. The method according to any of clauses 196-243, wherein the seed film comprises $Al_xZn_{1-x}$ oxide; wherein x is within the range of 1-25 wt %.

Clause 246. The method according to any of clauses 196-243, wherein the seed film comprises $Ga_xZn_{1-x}$ oxide; wherein x is within the range of 1-20 wt %.

Clause 247. The method according to any of clauses 196-243, wherein the seed film comprises $In_xZn_{1-x}$ oxide; wherein x is within the range of 1-40 wt %.

Clause 248. The method according to any of clauses 196-243, wherein the seed film comprises $Sn_xIn_{1-x}$ oxide; wherein x is within the range of 1-20 wt %.

Clause 249. The method according to any of clauses 196-243, wherein the seed film comprises Ag; wherein the Ag is deposited in an oxygen and argon gas environment having a gas flow rate of between 0-70%.

Clause 250. The method according to any of clauses 196-243, wherein the seed film comprises $Al_xAg_{1-x}$; wherein x is within the range of 1-35 wt % before and after heating.

Clause 251. The method according to any of clauses 193-250, wherein the stress layer comprises $Ti_xNb_{1-x}$ suboxide or oxide; wherein x is within the range of 1-100 wt % before and after heating.

Clause 252. The method according to any of clauses 193-250, wherein the stress layer comprises $Nb_xZr_{1-x}$ suboxide or oxide; wherein x is within the range of 1-12 wt % after heating.

Clause 253. The method according to any of clauses 193-250, wherein the stress layer comprises $Ti_xTa_{1-x}$ suboxide or oxide; wherein x is within the range of 1-100 wt % after heating.

Clause 254. The method according to any of clauses 193-250, wherein the stress layer comprises $Si_xCo_{1-x}$ sub-oxide or oxide; wherein x is within the range of 10-90 wt % after heating.

Clause 255. The method according to any of clauses 193-254, wherein the article has a visible light transmittance of at least 70%.

Clause 256. The method according to any of clauses 193-255, wherein the article has a sheet resistance of no more than 0.7 Ohms/square.

Clause 257. A coated article comprising: a substrate; a first dielectric layer over at least a portion of the substrate; a first metallic layer over at least a portion of the first dielectric layer; a first primer layer over at least a portion of the first metallic layer; and a second dielectric layer over at least a portion of the first primer layer; wherein the first metallic layer is comprised of aluminum-doped silver.

Clause 258. The article according to clause 257, wherein at least a portion of the primer layer is an oxide or a nitride.

Clause 259. The article according to any of clauses 257-258, comprising a seed film adjacent to and in direct contact with the first metallic layer and in between the first dielectric layer and the first metallic layer.

Clause 260. The article according to any of clauses 257-259, wherein the primer layer is selected from the group consisting of silver zinc, zinc, silver zinc oxide, aluminum zinc oxide, indium zinc oxide, gallium zinc oxide, vanadium zinc oxide, mixtures thereof, combinations thereof, or alloys thereof.

Clause 261. The article according to any of clauses 257-260, wherein the primer layer is a metal, oxide, nitride, sub-oxide, sub-nitride, oxynitride, or sub-oxynitride.

Clause 262. The article according to any of clauses 259-261, wherein the seed film is comprised of aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof.

Clause 263. The article according to any of clauses 259-262, wherein the seed film comprises aluminum zinc, vanadium zinc, zinc, or silver zinc.

Clause 264. The article according to clause 263, wherein the seed film is a metal, oxide, or sub-oxide.

Clause 265. The article according to any of clauses 259-262, wherein the seed film comprises gallium zinc, indium zinc, or indium tin.

Clause 266. The article according to clause 265, wherein the seed film is a metal, oxide, nitride, sub-oxide, or sub-nitride.

Clause 267. The article according to any of clauses 257-266, further comprising: a second metallic layer over at least a portion of the second dielectric layer; a second primer layer over at least a portion of the second metallic layer; and a third dielectric layer over at least a portion of the second primer layer.

Clause 268. The article according to clause 267, further comprising: a third metallic layer over at least a portion of the third dielectric layer; a third primer layer over at least a portion of the third metallic layer; and a fourth dielectric layer over at least a portion of the third primer layer.

Clause 269. The article according to clause 268, further comprising: a fourth metallic layer over at least a portion of the fourth dielectric layer; a fourth primer layer over at least a portion of the fourth metallic layer; and a fifth dielectric layer over at least a portion of the fourth primer layer.

Clause 270. The article according to any of clauses 257-269, wherein the metallic layer comprises silver or aluminum doped silver.

Clause 271. The article according to any of clauses 257-270, wherein the first dielectric layer comprises a zinc stannate film, and a second film comprising at least one of zinc oxide, aluminum zinc oxide, indium zinc oxide, gallium zinc oxide, indium tin oxide, or vanadium zinc oxide over at least a portion of the zinc stannate film.

Clause 272. The article according to any of clauses 257-271, wherein the first dielectric layer comprises a zinc stannate film, and a second film comprising at least one of aluminum zinc oxide, indium zinc oxide, gallium zinc oxide, indium tin oxide, or vanadium zinc oxide over at least a portion of the zinc stannate film.

Clause 273. The article according to any of clauses 267-272, wherein the second dielectric layer and the third dielectric layer comprise a first film comprising zinc oxide, aluminum zinc oxide, gallium zinc oxide, indium zinc oxide, indium tin oxide, or vanadium zinc oxide, a second film comprising zinc stannate over at least a portion of the first film, and a third film comprising at least one of zinc oxide, aluminum zinc oxide, gallium zinc oxide, indium zinc oxide, indium tin oxide, or vanadium zinc oxide over at least a portion of the second film.

Clause 274. The article according to any of clauses 267-273, wherein the second dielectric layer and the third dielectric layer comprise a first film comprising aluminum zinc oxide, gallium zinc oxide, indium zinc oxide, indium tin oxide, or vanadium zinc oxide, a second film comprising zinc stannate over at least a portion of the first film, and a third film comprising at least one of aluminum zinc oxide, gallium zinc oxide, indium zinc oxide, indium tin oxide, or vanadium zinc oxide over at least a portion of the second film.

Clause 275. The article according to any of clauses 268-274, wherein the fourth dielectric layer comprises a first film comprising at least one of zinc oxide, aluminum zinc oxide, gallium zinc oxide, indium zinc oxide, indium tin oxide, or vanadium zinc oxide, and a zinc stannate film over at least a portion of the first film.

Clause 276. The article according to any of clauses 268-275, wherein the fourth dielectric layer comprises a first film comprising at least one of aluminum zinc oxide, gallium zinc oxide, indium zinc oxide, indium tin oxide, or vanadium zinc oxide, and a zinc stannate film over at least a portion of the first film.

Clause 277. The article according to any of clauses 257-276, wherein the first dielectric layer or the second dielectric layer comprises a silicon nitride film.

Clause 278. The article according to any of clauses 257-277, further comprising an outermost protective layer comprising SiAlN, SiON, SiAlON, titania, alumina, silica, zirconia, alloys thereof, or mixtures thereof.

Clause 279. The article according to clause 278, further comprising a stress layer underneath the outermost protective layer.

Clause 280. The article according to clause 279, wherein the stress layer comprises silicon cobalt, titanium niobium, zirconium niobium, tantalum titanium, oxides thereof, or sub-oxides thereof.

Clause 281. The article according to any of clauses 257-280, wherein the primer layer comprises $Al_xZn_{1-x}$; wherein x is within the range of greater than 0-30 wt %.

Clause 282. The article according to any of clauses 257-280, wherein the primer layer comprises $Ga_xZn_{1-x}$; wherein x is within the range of greater than 0-20 wt %.

Clause 283. The article according to any of clauses 257-280, wherein the primer layer comprises $In_xZn_{1-x}$; wherein x is within the range of greater than 0-40 wt %.

Clause 284. The article according to any of clauses 257-280, wherein the primer layer comprises $V_xZn_{1-x}$; wherein x is within the range of greater than 0-20 wt %.

Clause 285. The article according to any of clauses 257-280, wherein the primer layer comprises $Ag_xZn_{1-x}$; wherein x is within the range of greater than 0-50 wt %.

Clause 286. The article according to any of clauses 257-280, wherein the primer layer comprises $Al_xTi_{1-x}$; wherein x is within the range of 2-75 wt % before heating.

Clause 287. The article according to any of clauses 257-280, wherein the primer layer comprises $Al_xTi_{1-x}$; wherein x is within the range of 1-100 wt % after heating.

Clause 288. The article according to any of clauses 257-280, wherein the primer layer comprises $Al_xNb_{1-x}$; wherein x is within the range of 2-40 wt % before heating.

Clause 289. The article according to any of clauses 257-280, wherein the primer layer comprises, $Al_xNb_{1-x}$; wherein x is within the range of 2-95 wt % after heating.

Clause 290. The article according to any of clauses 257-280, wherein the primer layer comprises $W_xTi_{1-x}$; wherein x is within the range of 55-100 wt % before heating with 7% $O_2$ during deposition.

Clause 291. The article according to any of clauses 257-280, wherein the primer layer comprises $W_xTi_{1-x}$; wherein x is within the range of 30-95 wt % after heating with 3% $O_2$ during deposition.

Clause 292. The article according to any of clauses 257-280, wherein the primer layer comprises $Ti_xTa_{1-x}$; wherein x is within the range of 2-80 wt % before heating.

Clause 293. The article according to any of clauses 257-280, wherein the primer layer comprises $Ti_xTa_{1-x}$; wherein x is within the range of 2-40 wt % after heating.

Clause 294. The article according to any of clauses 257-280, wherein the primer layer comprises $Ti_xNb_{1-x}$; wherein x is within the range of 2-95 wt % after heating.

Clause 295. The article according to any of clauses 257-280, wherein the primer layer comprises $Nb_xZr_{1-x}$; wherein x is within the range of 1-80 wt % before heating.

Clause 296. The article according to any of clauses 257-280, wherein the primer layer comprises $Nb_xZr_{1-x}$; wherein x is within the range of 60-100 wt % after heating.

Clause 297. The article according to any of clauses 257-280, wherein the primer layer comprises $Ta_xW_{1-x}$; wherein x is within the range of 2-95 wt % before heating.

Clause 298. The article according to any of clauses 257-280, wherein the primer layer comprises $W_xNb_{1-x}$; wherein x is within the range of 5-100 wt % before heating.

Clause 299. The article according to any of clauses 257-280, wherein the primer layer comprises $W_xNb_{1-x}$; wherein x is within the range of 2-50 wt % after heating.

Clause 300. The article according to any of clauses 257-280, wherein the primer layer comprises $Zn_xTi_{1-x}$; wherein x is within the range of 10-100 wt % before heating.

Clause 301. The article according to any of clauses 257-280, wherein the primer layer comprises $Zn_xTi_{1-x}$; wherein x is within the range of 20-100 wt % after heating.

Clause 302. The article according to any of clauses 257-301, wherein at least a portion of the primer layer or layers is a nitride.

Clause 303. The article according to clause 302, wherein the primer layer comprises $Al_xNb_{1-x}$ nitride; wherein x is within the range of 1-100 wt % before heating.

Clause 304. The article according to clause 302, wherein the primer layer comprises $Al_xNb_{1-x}$ nitride; wherein x is within the range of 1-100 wt % after heating.

Clause 305. The article according to clause 302, wherein the primer layer comprises $Ti_xNb_{1-x}$ nitride; wherein x is within the range of 1-65 wt %.

Clause 306. The article according to clause 302, wherein the primer layer comprises $W_xNb_{1-x}$ nitride; wherein x is within the range of 2-90 wt % before heating.

Clause 307. The article according to clause 302, wherein the primer layer comprises $W_xNb_{1-x}$ nitride; wherein x is within the range of 2-70 wt % after heating.

Clause 308. The article according to any of clauses 259-307, wherein the seed film comprises $V_xZn_{1-x}$ oxide; wherein x is within the range of 1-25 wt %.

Clause 309. The article according to any of clauses 259-307, wherein the seed film comprises $Al_xZn_{1-x}$ oxide; wherein x is within the range of 1-25 wt %.

Clause 310. The article according to any of clauses 259-307, wherein the seed film comprises $Ga_xZn_{1-x}$ oxide; wherein x is within the range of 1-20 wt %.

Clause 311. The article according to any of clauses 259-307, wherein the seed film comprises $In_xZn_{1-x}$ oxide; wherein x is within the range of 1-40 wt %.

Clause 312. The article according to any of clauses 259-307, wherein the seed film comprises $Sn_xIn_{1-x}$ oxide; wherein x is within the range of 1-20 wt %.

Clause 313. The article according to any of clauses 259-307, wherein the seed film comprises Ag; wherein the Ag is deposited in an oxygen and argon gas environment having an oxygen gas flow rate of between 1-70%.

Clause 314. The article according to any of clauses 259-307, wherein the seed film comprises $Al_xAg_{1-x}$; wherein x is within the range of 1-35 wt % before and after heating.

Clause 315. The article according to any of clauses 279-314, wherein the stress layer comprises $Ti_xNb_{1-x}$ suboxide or oxide; wherein x is within the range of 1-100 wt % before and after heating.

Clause 316. The article according to any of clauses 279-314, wherein the stress layer comprises $Nb_xZr_{1-x}$ suboxide or oxide; wherein x is within the range of 1-12 wt % after heating.

Clause 317. The article according to any of clauses 279-314, wherein the stress layer comprises $Ti_xTa_{1-x}$ suboxide or oxide; wherein x is within the range of 1-100 wt % after heating.

Clause 318. The article according to any of clauses 279-314, wherein the stress layer comprises $Si_xCo_{1-x}$ suboxide or oxide; wherein x is within the range of 10-90 wt % after heating.

Clause 319. The article according to any of clauses 257-318, wherein the article has a visible light transmittance of at least 70%.

Clause 320. The article according to any of clauses 257-319, wherein the article has a sheet resistance of no more than 0.7 Ohms/square.

What is claimed is:
1. A coated article comprising:
   a substrate;
   a first dielectric layer in direct contact with at least a portion of the substrate, wherein the first dielectric layer comprises a first film in direct contact with the substrate and a second film in direct contact with the first film;

a first metallic layer in direct contact with at least a portion of the first dielectric layer;
a first primer layer in direct contact with at least a portion of the first metallic layer,
wherein the first primer layer comprises $Al_xZn_{1-x}$,
wherein x is within the range of greater than 0 wt % and up to 30 wt %;
a second dielectric layer in direct contact with at least a portion of the first primer layer, wherein the second dielectric layer comprises a first film in direct contact with the first primer layer, a second film in direct contact with the first film, and a third film in direct contact with the second film,
a second metallic layer in direct contact with at least a portion of the second dielectric layer;
a second primer layer in direct contact with at least a portion of the second metallic layer,
wherein the second primer layer comprises $Al_xZn_{1-x}$,
wherein x is within the range of greater than 0 wt % and up to 30 wt %;
a third dielectric layer in direct contact with at least a portion of the second primer layer,
a third metallic layer in direct contact with at least a portion of the third dielectric layer;
a third primer layer in direct contact with at least a portion of the third metallic layer,
wherein the third primer layer comprises $Al_xZn_{1-x}$,
wherein x is within the range of greater than 0 wt % and up to 30 wt %;
a fourth dielectric layer in direct contact with at least a portion of the third primer layer;
a fourth metallic layer in direct contact with at least a portion of the fourth dielectric layer;
a fourth primer layer in direct contact with at least a portion of the fourth metallic layer,
wherein the fourth primer layer comprises $Al_xZn_{1-x}$,
wherein x is within the range of greater than 0 wt % and up to 30 wt %; and
a fifth dielectric layer in direct contact with at least a portion of the fourth primer layer,
wherein the coated article comprises a sheet resistance of not more than 0.85 ohms per square and a visible light transmittance of at least 70%.

2. The article according to claim 1, wherein the first primer layer has a thickness in the range of 5 Å to 50 Å.

3. The article according to claim 1, further comprising a first seed film adjacent to and in direct contact with the first metallic layer and in between the first dielectric layer and the first metallic layer.

4. The article according to claim 3, wherein the first seed film is comprised of aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, alloys thereof, combinations thereof, oxides thereof, nitrides thereof, oxynitrides thereof, oxycarbides thereof, carbonitrides thereof, or oxycarbonitrides thereof.

5. The article according to claim 1, wherein the first metallic layer comprises silver or aluminum doped silver.

6. The article according to claim 1, wherein the first film of the first dielectric layer comprises zinc stannate, and the second film of the first dielectric layer comprises at least one of aluminum zinc oxide, indium zinc oxide, gallium zinc oxide, indium tin oxide, or vanadium zinc oxide.

7. The article of according to claim 1, wherein the second primer layer has a thickness in the range of 5 Å to 50 Å.

8. The article of according to claim 1, wherein the third primer layer has a thickness in the range of 5 Å to 50 Å.

9. The article of according to claim 1, wherein the fourth primer layer has a thickness in the range of 5 Å to 50 Å.

10. The article according to claim 1, further comprising a stress layer in direct contact with a topmost dielectric layer, and wherein the stress layer comprises silicon cobalt, titanium niobium, zirconium niobium, tantalum titanium, oxides thereof, or sub-oxides thereof.

11. A method of making a coated article by:
providing a substrate;
applying a coating over the substrate wherein the coating comprises:
a first dielectric layer in direct contact with at least a portion of the substrate, wherein the first dielectric layer comprises a first film in direct contact with the substrate and a second film in direct contact with the first film;
a first metallic layer in direct contact with at least a portion of the first dielectric layer;
a first primer layer in direct contact with at least a portion of the first metallic layer,
wherein the first primer layer comprises $Al_xZn_{1-x}$,
wherein x is within the range of greater than 0 wt % and up to 30 wt %;
a second dielectric layer in direct contact with at least a portion of the first primer layer, wherein the second dielectric layer comprises a first film in direct contact with the first primer layer, a second film in direct contact with the first film, and a third film in direct contact with the second film; a second metallic layer in direct contact with at least a portion of the second dielectric layer;
a second primer layer in direct contact with at least a portion of the second metallic layer,
wherein the second primer layer comprises $Al_xZn_{1-x}$,
wherein x is within the range of greater than 0 wt % and up to 30 wt %;
a third dielectric layer in direct contact with at least a portion of the second primer layer,
a third metallic layer in direct contact with at least a portion of the third dielectric layer;
a third primer layer in direct contact with at least a portion of the third metallic layer,
wherein the third primer layer comprises $Al_xZn_{1-x}$,
wherein x is within the range of greater than 0 wt % and up to 30 wt %;
a fourth dielectric layer in direct contact with at least a portion of the third primer layer;
a fourth dielectric layer in direct contact with at least a portion of the third primer layer;
a fourth metallic layer in direct contact with at least a portion of the fourth dielectric layer;
a fourth primer layer in direct contact with at least a portion of the fourth metallic layer,
wherein the fourth primer layer comprises $Al_xZn_{1-x}$,
wherein x is within the range of greater than 0 wt % and up to 30 wt %; and
a fifth dielectric layer in direct contact with at least a portion of the fourth primer layer,
wherein at least a portion of the first primer layer, the second primer layer, the third primer layer, and the fourth primer layer is oxidized after the application of the first primer layer, the second primer layer, the third primer layer, and the fourth primer layer, wherein the coated article comprises a sheet resistance of not more than 0.85 ohms per square and a visible light transmittance of at least 70%.

12. A coated article comprising:
a substrate;
a first dielectric layer in direct contact with at least a portion of the substrate, wherein the first dielectric layer comprises a first film in direct contact with the substrate and a second film in direct contact with the first film;
a first metallic layer in direct contact with at least a portion of the first dielectric layer;
a first primer layer in direct contact with at least a portion of the first metallic layer,
wherein the first primer layer comprises $Al_xZn_{1-x}$,
wherein x is within the range of greater than 0 wt % and up to 30 wt %;
a second dielectric layer in direct contact with at least a portion of the first primer layer, wherein the second dielectric layer comprises a first film in direct contact with the first primer layer, a second film in direct contact with the first film, and a third film in direct contact with the second film;
a second metallic layer in direct contact with at least a portion of the second dielectric layer;
a second primer layer in direct contact with at least a portion of the second metallic layer,
wherein the second primer layer comprises $Al_xZn_{1-x}$,
wherein x is within the range of greater than 0 wt % and up to 30 wt %;
a third dielectric layer in direct contact with at least a portion of the second primer layer,
a third metallic layer in direct contact with at least a portion of the third dielectric layer;
a third primer layer in direct contact with at least a portion of the third metallic layer,
wherein the third primer layer comprises $Al_xZn_{1-x}$,
wherein x is within the range of greater than 0 wt % and up to 30 wt %;
a fourth dielectric layer in direct contact with at least a portion of the third primer layer;
a fourth metallic layer in direct contact with at least a portion of the fourth dielectric layer;
a fourth primer layer in direct contact with at least a portion of the fourth metallic layer,
wherein the fourth primer layer comprises $Al_xZn_{1-x}$,
wherein x is within the range of greater than 0 wt % and up to 30 wt %; and
a fifth dielectric layer in direct contact with at least a portion of the fourth primer layer,
wherein a seed film is adjacent to and in direct contact with the first metallic layer and in between the first dielectric layer and the first metallic layer and wherein the seed film comprises aluminum, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, mixtures thereof, metals thereof, alloys thereof, combinations thereof, oxides thereof, sub-oxides thereof, nitrides thereof, sub-nitrides thereof, oxynitrides thereof, sub-oxynitrides thereof, oxycarbides thereof, carbonitrides thereof, or oxycarbonitrides thereof, and
wherein the coated article comprises a sheet resistance of not more than 0.85 ohms per square and a visible light transmittance of at least 70%.

13. The article of claim 1, wherein the coated article comprises a sheet resistance of not more than 0.7 ohms per square.

14. The method of claim 11, wherein the coated article comprises a sheet resistance of not more than 0.7 ohms per square.

15. The coated article of claim 12, wherein the coated article comprises a sheet resistance of not more than 0.7 ohms per square.

* * * * *

UNITED STATES PATENT AND TRADEMARK OFFICE
CERTIFICATE OF CORRECTION

PATENT NO. : 12,284,770 B2
APPLICATION NO. : 17/173924
DATED : April 22, 2025
INVENTOR(S) : Zhixun Ma et al.

It is certified that error appears in the above-identified patent and that said Letters Patent is hereby corrected as shown below:

In the Claims

Column 58, Line 1, Claim 7, after "article" delete "of"

Column 58, Line 3, Claim 8, after "article" delete "of"

Column 58, Line 5, Claim 9, after "article" delete "of"

Column 58, Lines 50-53, Claim 11, below "30 wt %;" delete "a fourth dielectric layer in direct contact with at least a portion of the third primer layer;
a fourth dielectric layer in direct contact with at least a portion of the third primer layer;" and insert -- a fourth dielectric layer in direct contact with at least a portion of the third primer layer; --

Signed and Sealed this
Thirtieth Day of September, 2025

John A. Squires
*Director of the United States Patent and Trademark Office*